(12) United States Patent
Zeidler et al.

(10) Patent No.: US 12,494,343 B2
(45) Date of Patent: Dec. 9, 2025

(54) MULTIPLE PARTICLE BEAM MICROSCOPE AND ASSOCIATED METHOD WITH FAST AUTOFOCUS AROUND AN ADJUSTABLE WORKING DISTANCE

(71) Applicant: Carl Zeiss MultiSEM GmbH, Oberkochen (DE)

(72) Inventors: Dirk Zeidler, Oberkochen (DE); Thomas Schmid, Aalen (DE); Ingo Mueller, Aalen (DE); Walter Pauls, Huettlingen (DE); Stefan Schubert, Oberkochen (DE)

(73) Assignee: Carl Zeiss MultiSEM GmbH, Oberkochen (DE)

( * ) Notice: Subject to any disclaimer, the term of this patent is extended or adjusted under 35 U.S.C. 154(b) by 342 days.

(21) Appl. No.: 18/185,324

(22) Filed: Mar. 16, 2023

(65) Prior Publication Data

US 2023/0245852 A1 Aug. 3, 2023

Related U.S. Application Data

(63) Continuation of application No. PCT/EP2021/025359, filed on Sep. 22, 2021.

(30) Foreign Application Priority Data

Sep. 30, 2020 (DE) .......................... 102020125534.9
Mar. 4, 2021 (DE) .......................... 102021105201.7

(51) Int. Cl.
*H01J 37/28* (2006.01)
*H01J 37/145* (2006.01)
(Continued)

(52) U.S. Cl.
CPC ............ *H01J 37/28* (2013.01); *H01J 37/145* (2013.01); *H01J 37/1474* (2013.01);
(Continued)

(58) Field of Classification Search
CPC .. H01J 37/00; H01J 37/02; H01J 37/26; H01J 37/28; H01J 37/145; H01J 37/1474;
(Continued)

(56) References Cited

U.S. PATENT DOCUMENTS 4,034,256 A    7/1977   Sommerkamp et al.
4,130,761 A    12/1978  Matsuda
(Continued)

FOREIGN PATENT DOCUMENTS

DE    10 2004 055 149 A1    6/2006
DE    2007-019033 A         1/2007
(Continued)

OTHER PUBLICATIONS

Examination Report and Written Opinion, with translation thereof, for corresponding Netherlands Appl No. NL2031161, dated Jun. 26, 2023.
(Continued)

*Primary Examiner* — Jason L McCormack
(74) *Attorney, Agent, or Firm* — Fish & Richardson P.C.

(57) ABSTRACT

A multiple particle beam microscope and an associated method can provide a fast autofocus around an adjustable working distance. A system can have one or more fast autofocus correction lenses for adapting, in high-frequency fashion, the focusing, the position, the landing angle and the rotation of individual particle beams upon incidence on a wafer surface during the wafer inspection. Fast autofocusing in the secondary path of the particle beam system can be implemented in analogous fashion. An additional increase in precision can be attained via fast aberration correction mechanism in the form of deflectors and/or stigmators.

21 Claims, 27 Drawing Sheets

(51) Int. Cl.
*H01J 37/147* (2006.01)
*H01J 37/153* (2006.01)
*H01J 37/21* (2006.01)
*H01J 37/26* (2006.01)

(52) U.S. Cl.
CPC ............ *H01J 37/153* (2013.01); *H01J 37/21* (2013.01); *H01J 37/265* (2013.01); *H01J 2237/1534* (2013.01); *H01J 2237/216* (2013.01)

(58) Field of Classification Search
CPC ........ H01J 37/153; H01J 37/21; H01J 37/265; H01J 2237/1534; H01J 2237/216; H01J 2237/0492; H01J 2237/2817
USPC .................................. 250/306, 307, 310, 311
See application file for complete search history.

(56) References Cited

U.S. PATENT DOCUMENTS

| | | | |
|---|---|---|---|
| 4,153,843 A | 5/1979 | Pease | |
| 4,200,794 A | 4/1980 | Newberry | |
| 4,338,548 A | 7/1982 | Bono | |
| 4,742,234 A | 5/1988 | Feldman | |
| 5,215,623 A | 6/1993 | Takahashi | |
| 5,864,142 A | 1/1999 | Muraki | |
| 5,892,224 A | 4/1999 | Nakasuji | |
| 5,905,267 A | 5/1999 | Muraki | |
| 5,981,954 A | 11/1999 | Muraki | |
| 6,107,636 A | 8/2000 | Muraki | |
| 6,124,599 A | 9/2000 | Muraki | |
| 6,137,113 A | 10/2000 | Muraki | |
| 6,323,499 B1 | 11/2001 | Muraki | |
| 6,333,508 B1 | 12/2001 | Katsap | |
| 6,617,595 B1 | 9/2003 | Okunuki | |
| 6,633,366 B2 | 10/2003 | De Jager | |
| 6,696,371 B2 | 2/2004 | Butschke | |
| 6,787,780 B2 | 9/2004 | Hamaguchi | |
| 6,804,288 B2 | 10/2004 | Haraguchi | |
| 6,818,911 B2 | 11/2004 | Tamamori | |
| 6,835,508 B2 | 12/2004 | Butschke | |
| 6,872,950 B2 | 3/2005 | Shimada | |
| 6,903,345 B2 | 6/2005 | Ono | |
| 6,903,353 B2 | 6/2005 | Muraki | |
| 6,917,045 B2 | 7/2005 | Hashimoto | |
| 6,919,574 B2 | 7/2005 | Hashimoto | |
| 6,943,349 B2 | 9/2005 | Adamec | |
| 6,953,938 B2 | 10/2005 | Iwasaki | |
| 6,992,290 B2 | 1/2006 | Watanabe | |
| 7,005,658 B2 | 2/2006 | Muraki | |
| 7,015,467 B2 | 3/2006 | Maldonado | |
| 7,060,984 B2 | 6/2006 | Nagae | |
| 7,084,411 B2 | 8/2006 | Lammer-Pachlinger | |
| 7,091,504 B2 | 8/2006 | Wieland | |
| 7,109,494 B2 | 9/2006 | Ono | |
| 7,126,141 B2 | 10/2006 | Ono | |
| 7,129,502 B2 | 10/2006 | Kruit | |
| 7,244,949 B2 | 7/2007 | Knippelmeyer | |
| 7,285,779 B2 | 10/2007 | Litman | |
| 7,332,730 B2 | 2/2008 | Heinitz et al. | |
| 7,375,326 B2 | 5/2008 | Sender | |
| 7,420,164 B2 | 9/2008 | Nakasuji | |
| 7,468,507 B2 | 12/2008 | Rogers | |
| 7,504,622 B2 | 3/2009 | Elyasaf | |
| 7,535,001 B2 | 5/2009 | Sender | |
| 7,601,972 B2 | 10/2009 | Nakasuji | |
| 7,619,203 B2 | 11/2009 | Elyasaf | |
| 7,696,497 B2 | 4/2010 | Rogers | |
| 8,035,082 B2 | 10/2011 | Yamazaki | |
| 8,134,135 B2 | 3/2012 | Kruit | |
| 8,350,214 B2 | 1/2013 | Otaki | |
| 8,362,425 B2 | 1/2013 | Han | |
| 8,384,051 B2 | 2/2013 | Ozawa | |
| 8,598,525 B2 | 12/2013 | Zeidler | |
| 8,618,496 B2 | 12/2013 | Wieland | |
| 8,704,192 B2 | 4/2014 | Sano | |
| 8,748,842 B2 | 6/2014 | Ohashi | |
| 8,779,399 B2 | 7/2014 | Yamanaka | |
| 8,829,465 B2 | 9/2014 | Tsunoda | |
| 8,963,099 B2 | 2/2015 | Yamada | |
| 9,153,413 B2 | 10/2015 | Almogy | |
| 9,263,233 B2 | 2/2016 | Zeidler | |
| 9,336,981 B2 | 5/2016 | Knippelmeyer | |
| 9,336,982 B2 | 5/2016 | Zeidler | |
| 9,349,571 B2 | 5/2016 | Kemen | |
| 9,368,314 B2 | 6/2016 | Nakasuji | |
| 9,530,613 B2 | 12/2016 | Rogers | |
| 9,536,702 B2 | 1/2017 | Lang | |
| 9,607,805 B2 | 3/2017 | Liu | |
| 9,653,254 B2 | 5/2017 | Zeidler | |
| 9,702,983 B2 | 7/2017 | Eder | |
| 9,922,796 B1 | 3/2018 | Frosien et al. | |
| 9,922,799 B2 | 3/2018 | Li | |
| 9,991,089 B2 | 6/2018 | Mueller | |
| 10,062,541 B2 | 8/2018 | Ren | |
| 10,141,160 B2 | 11/2018 | Ren | |
| 10,354,831 B2 | 7/2019 | Kemen | |
| 10,388,487 B2 | 8/2019 | Zeidler | |
| 10,535,494 B2 | 1/2020 | Zeidler | |
| 10,541,112 B2 | 1/2020 | Schubert | |
| 10,586,677 B1 | 3/2020 | Okada | |
| 10,600,613 B2 | 3/2020 | Zeidler | |
| 10,622,184 B2 | 4/2020 | Knippelmeyer | |
| 10,643,820 B2 | 5/2020 | Ren | |
| 10,741,355 B1 | 8/2020 | Zeidler | |
| 10,811,215 B2 | 10/2020 | Zeidler | |
| 10,854,423 B2 | 12/2020 | Sarov | |
| 10,879,031 B2 | 12/2020 | Ren | |
| 10,896,800 B2 | 1/2021 | Riedesel | |
| 2002/0145113 A1* | 10/2002 | Sullivan | B82Y 10/00 250/311 |
| 2004/0084621 A1 | 5/2004 | Kienzle et al. | |
| 2005/0012049 A1 | 1/2005 | Bierhoff et al. | |
| 2008/0210887 A1 | 9/2008 | Buschbeck et al. | |
| 2009/0014649 A1 | 1/2009 | Nakasuji | |
| 2011/0272576 A1 | 11/2011 | Otaki et al. | |
| 2012/0295203 A1 | 11/2012 | Sano | |
| 2014/0151570 A1 | 6/2014 | Kato et al. | |
| 2014/0197325 A1 | 7/2014 | Kato | |
| 2015/0213998 A1 | 7/2015 | Winkler et al. | |
| 2017/0117114 A1 | 4/2017 | Zeidler | |
| 2017/0133198 A1 | 5/2017 | Kruit | |
| 2017/0316912 A1 | 11/2017 | Zeidler et al. | |
| 2019/0122852 A1 | 4/2019 | Zeidler et al. | |
| 2019/0259575 A1 | 8/2019 | Sarov et al. | |
| 2019/0333732 A1 | 10/2019 | Ren | |
| 2019/0355544 A1 | 11/2019 | Zeidler et al. | |
| 2019/0355545 A1 | 11/2019 | Zeidler et al. | |
| 2020/0013585 A1* | 1/2020 | Inoue | H01J 37/28 |
| 2020/0168430 A1 | 5/2020 | Inoue et al. | |
| 2020/0211810 A1 | 7/2020 | Zeidler | |
| 2020/0243300 A1* | 7/2020 | Zeidler | H01J 37/265 |
| 2020/0373116 A1 | 11/2020 | Zeidler | |
| 2021/0005423 A1 | 1/2021 | Zeidler | |
| 2021/0035773 A1 | 2/2021 | Zeidler | |
| 2022/0415604 A1 | 12/2022 | Preikszas et al. | |
| 2023/0043036 A1 | 2/2023 | Zeidler et al. | |
| 2023/0207251 A1 | 6/2023 | Schubert | |

FOREIGN PATENT DOCUMENTS

| | | | |
|---|---|---|---|
| DE | 2007-087639 A | 4/2007 | |
| DE | 10 2013 014 976 A1 | 3/2015 | |
| DE | 10 2013 016 113 A1 | 3/2015 | |
| DE | 10 2014 008 383 A1 | 12/2015 | |
| DE | 10 2015 202 172 B4 | 1/2017 | |
| DE | 10 2018 202 421 B3 | 7/2019 | |
| DE | 10 2019 218 315 B3 | 10/2020 | |
| DE | 10 2019 008 249 B3 | 11/2020 | |
| DE | 10 2020 107 738 B3 | 1/2021 | |
| DE | 102020123567 A1 | 3/2022 | |
| GB | 2519511 A | 4/2015 | |
| GB | 2521819 A | 7/2015 | |

(56) References Cited

FOREIGN PATENT DOCUMENTS

| | | |
|---|---|---|
| JP | 59184524 A | 10/1984 |
| JP | 60042825 A | 3/1985 |
| JP | 60105229 A | 6/1985 |
| JP | 61263217 A | 11/1986 |
| JP | 2006-080155 A | 3/2006 |
| JP | 2012-243803 A | 12/2012 |
| JP | 2014-127568 A | 7/2014 |
| JP | 2014229481 A | 12/2014 |
| JP | 2020-009755 A | 1/2020 |
| TW | 201820374 A | 6/2018 |
| WO | WO 2005/024881 A2 | 3/2005 |
| WO | WO 2007/028595 A2 | 3/2007 |
| WO | WO 2007/028596 A1 | 3/2007 |
| WO | WO 2007/060017 A2 | 5/2007 |
| WO | WO 2011/124352 A1 | 10/2011 |
| WO | WO2013032949 A1 | 3/2013 |
| WO | WO 2019/243349 A1 | 12/2019 |
| WO | WO2020057678 A1 | 3/2020 |
| WO | WO2020064035 A1 | 4/2020 |
| WO | WO2020065094 A1 | 4/2020 |
| WO | WO2020070074 A1 | 4/2020 |
| WO | WO2020151904 A2 | 7/2020 |
| WO | WO2020249147 A1 | 12/2020 |

OTHER PUBLICATIONS

Examination Report and Written Opinion, with translation thereof, for corresponding Netherlands Appl No. NL2029294, dated Jun. 26, 2023.
The International Search Report and a Written Opinion from the corresponding PCT Appl No. PCT/EP2021/025359, dated Mar. 4, 2022.
Office Action in Japanese Appln. No. 2023-520093, mailed on Jun. 16, 2025, 9 pages (with English translation).
Search Report in Taiwanese Appln. No. 110134842, mailed on Jun. 26, 2025, 2 pages (with English translation).
Office Action in Taiwanese Appln. No. 110134842, mailed on Jun. 27, 2025, 9 pages (with English Summary).

* cited by examiner

MULTIPLE PARTICLE BEAM MICROSCOPE AND ASSOCIATED METHOD WITH FAST AUTOFOCUS AROUND AN ADJUSTABLE WORKING DISTANCE

CROSS-REFERENCE TO RELATED APPLICATIONS

The present application is a continuation of, and claims benefit under 35 USC 120 to, international application PCT/EP2021/025359, filed Sep. 22, 2021, which claims benefit under 35 USC 119 of German Application No. 10 2020 125 534.9, filed Sep. 30, 2020, and of German patent application 10 2021 105 201.7, filed on Mar. 4, 2021. The entire disclosure of these applications are incorporated by reference herein.

FIELD

The disclosure relates to multiple particle beam microscopes for inspecting semiconductor wafers with HV structures.

BACKGROUND

With the continuous development of ever smaller and ever more complex microstructures such as semiconductor components, it is generally desirable to develop and optimize planar production techniques and inspection systems for producing and inspecting small dimensions of the microstructures. By way of example, the development and production of the semiconductor components often involves monitoring of the design of the test wafers, and the planar production techniques often involve a process optimization for a reliable production with a high throughput. Moreover, there have been recent demands for an analysis of semiconductor wafers for reverse engineering and for a customer-specific, individual configuration of semiconductor components. Therefore, it is generally desirable for an inspection mechanism which can be used with a high throughput for examining the microstructures on wafers with high accuracy.

Typical silicon wafers used in the production of semiconductor components have diameters of up to 300 mm. Each wafer is subdivided into 30 to 60 repetitive regions ("dies") with a size of up to 800 mm². A semiconductor apparatus generally comprises a plurality of semiconductor structures, which are produced in layers on a surface of the wafer by planar integration techniques. Semiconductor wafers typically have a plane surface on account of the production processes. The structure size of the integrated semiconductor structures in this case extends from a few μm to the critical dimensions (CD) of 5 nm, wherein the structure dimensions will become even smaller in the near future; in future, structure sizes or critical dimensions (CD) are expected to be less than 3 nm, for example 2 nm, or even under 1 nm. In the case of the aforementioned small structure sizes, defects of the size of the critical dimensions are desirably identified quickly in a very large area. For several applications, the desired specification for the accuracy of a measurement provided by an inspection device is even higher, for example by a factor of two or one order of magnitude. By way of example, a width of a semiconductor feature is desirably measured with an accuracy of below 1 nm, for example 0.3 nm or even less, and a relative position of semiconductor structures is desirably determined with a superposition accuracy of below 1 nm, for example 0.3 nm or even less.

The MSEM, a multi-beam scanning electron microscope, is a relatively new development in the field of charged particle systems (charged particle microscopes, CPMs). By way of example, a multi-beam scanning electron microscope is disclosed in U.S. Pat. No. 7,244,949 B2 and in US 2019/0355544 A1. In a multi-beam electron microscope or MSEM, a sample is irradiated simultaneously with a multiplicity of individual electron beams, which are arranged in a field or grid. By way of example, 4 to 10,000 individual electron beams can be provided as primary radiation, with each individual electron beam being separated from an adjacent individual electron beam by a distance of 1 to 200 micrometers. By way of example, an MSEM has approximately 100 separated individual electron beams ("beamlets"), which for example are arranged in a hexagonal grid, with the individual electron beams being separated by a distance of approximately 10 μm. The multiplicity of charged individual particle beams (primary beams) are focused on a surface of a sample to be examined by way of a common objective lens. By way of example, the sample can be a semiconductor wafer which is fastened to a wafer holder that is assembled on a movable stage. During the illumination of the wafer surface with the charged primary individual particle beams, interaction products, for example secondary electrons or backscattered electrons, emanate from the surface of the wafer. Their start points correspond to those locations on the sample on which the multiplicity of primary individual particle beams are focused in each case. The amount and the energy of the interaction products can depend on the material composition and the topography of the wafer surface. The interaction products typically form a plurality of secondary individual particle beams (secondary beams), which are collected by the common objective lens and which are incident on a detector arranged in a detection plane as a result of a projection imaging system of the multi-beam inspection system. The detector typically comprises a plurality of detection regions, each of which comprises a plurality of detection pixels, and the detector captures an intensity distribution for each of the secondary individual particle beams. An image field of for example 100 μm×100 μm can be obtained in the process.

Known multi-beam electron microscopes can comprise a sequence of electrostatic and magnetic elements. At least some of the electrostatic and magnetic elements are usually adjustable in order to adapt the focus position and the stigmation of the multiplicity of charged individual particle beams. Such a multi-beam system with charged particles moreover can comprise at least one crossover plane of the primary or the secondary charged individual particle beams. Moreover, such a system can comprise detection systems to make the adjustment easier. Such a multi-beam particle microscope can comprise at least one beam deflector ("deflection scanner") for collective scanning of a region of the sample surface via the multiplicity of primary individual particle beams in order to obtain an image field of the sample surface. Further details regarding a multi-beam electron microscope and a method for operating the same are described in the German patent application with the application No. 102020206739.2, filed on May 28, 2020, the disclosure of which is incorporated in full in this patent application by reference.

In the case of scanning electron microscopes for wafer inspection, it is desirable to keep the imaging conditions stable such that the imaging can be carried out with great reliability and high repeatability. The throughput can depend on a plurality of parameters, for example the speed of the stage and of the realignment at new measurement sites, and the area measured per unit of capture time. The latter is generally determined, inter alia, by the dwell time on a pixel, the pixel size and the number of individual particle beams. Additionally, time-consuming image postprocessing may be involved for a multi-beam electron microscope; by way of example, the signal generated from charged particles by the detection system of the multi-beam system is desirably digitally corrected before the image field from a plurality of image subfields or partial images is put together ("stitching").

Here, the grid positions of the individual particle beams on the sample surface can deviate from the ideal grid position in a plane arrangement. The resolution of the multi-beam electron microscope can be different for each of the individual particle beams and can depend on the individual position of the individual particle beam in the field of individual particle beams, and consequently can depend on the specific grid position of the individual particle beams.

Conventional systems of charged particle beam systems are often stretched to their limits with increasing demands on resolution and throughput.

One approach for improving precision and resolution lies in the use of a so-called autofocus. Here, while scanning the sample surface, the current relative focal position of the individual electron beams can be ascertained continuously ("on-the-fly") in view of the sample surface/object plane and an appropriate correction of the relative focal position is undertaken. By way of example, the focusing of the individual particle beams is adapted for each image field. By way of example, this procedure is based on a model of the sample or the assumption that the sample properties do not change much from image field to image field such that prediction values for improved focusing can be ascertained by extrapolation or interpolation.

Nevertheless, the known autofocusing method is, in general, comparatively slow: This is thought to be because the relative focal position is optimized either by changing the working distance (WD) or by way of a different control of the objective lens. Here, a change in the working distance by displacing the height of the sample stage (so-called "z-stage") is usually only possible with a certain restricted precision and speed. Moreover, not every sample stage is displaceable in terms of its height. If there is changed control of the objective lens or of other magnetic lenses for the purposes of varying the relative focal position, this adjustment can be comparatively slow: known systems generally use magnetic objective lenses and, in particular, immersion lenses, the inductance of which is too high to allow for an even faster adaptation. In this case, too, the time for changing the excitation typically ranges between several ten and several hundred milliseconds. Moreover, the optics of multiple electron microscopes is generally far more complex than that of individual beam systems since meaningful recordings can involve the magnification in the object plane (coupled to the beam pitch of the individual particle beams in the object plane) and also the orientation, i.e., the rotation, of the array of individual electron beams (grid arrangement) to remain unchanged when updating the relative focal position. The same can apply to the landing angle of the individual particle beams on the sample. In general, the aforementioned particle optical parameters (and optionally further parameters) cannot be set independently of one another via only a single lens. A change in the control of the magnetic objective lens is therefore usually accompanied by a changed control of other particle optical components in the primary path. Thus, changes in the excitation of other magnetic and electrostatic elements typically also become helpful, with the adjustment times for the magnetic lenses being limiting in terms of time and likewise ranging from several ten to several hundred milliseconds. Similar considerations often apply to particle optical components in the secondary path and to the adjustment of the focal position for a precise detection.

SUMMARY

Against the above-described background and the increasing demands on throughput/speed and on precise measurement of ever smaller structures, it can be desirable for the existing systems to be improved. There can be enormous demands, especially on the inspection of semiconductor wafers as well. Then, a surface of a semiconductor wafer that is very flat per se can commonly might no longer be assumed to be precisely flat within the scope of the precision inspection. Very small variations in the wafer thickness and/or the longitudinal position of the wafer surface relative to the objective lens have an influence on the optimal focus and hence on the accuracy of the measurements. This applies in particular to the inspection of polished wafer surfaces with HV structures. Thus—even under the not entirely realistic assumption of a lack of system drift and the like—it is no longer sufficient to adjust the multiple electron microscope once at a predefined working point with an associated working distance. Instead, very small changes in the working distance are desirably corrected by an altered relative focal position. A further precondition applying here is that the magnification is desirably remain unchanged. The orientation of the grid arrangement on the sample surface is desirably exactly observed since, in the case of semiconductor wafers with HV structures, imaging is always carried out exactly parallel or orthogonal to these structures. Moreover, it can be desirable to keep the landing angle precisely constant. And lastly, the optical unit in the secondary path is desirably updated quickly and highly precisely in order to obtain excellent imaging.

The present disclosure seeks to provide an improved multiple particle beam system for inspecting semiconductor wafers with HV structures and an associated method for operating the same. This should operate quickly and highly precisely.

The present disclosure seeks to provide a multiple particle beam system that operates with charged particles and an associated method for operating same with a high throughput, which facilitates a highly precise measurement of semiconductor features with an accuracy of below 1 nm, below 0.3 nm or even 0.1 nm.

The disclosure to seeks to provide a multiple particle beam system which facilitates highly precise and high-resolution image recording with a high throughput.

The disclosure seeks to provide a multiple particle beam system for inspecting semiconductor wafers with HV structures and an associated method for operating the same, which allows for additional fast autofocusing of the system at a working point with a specified working distance. In this case, other particle optical parameters such as the magnification, the telecentricity and the rotation should be kept constant with great precision.

According to a first aspect of the disclosure, the latter relates to a multiple particle beam system for semiconductor inspection, comprising the following:

a multi-beam particle generator, which is configured to generate a first field of a multiplicity of charged first individual particle beams;

a first particle optical unit with a first particle optical beam path, which is configured to image the generated first individual particle beams onto a wafer surface in the object plane such that the first individual particle beams strike the wafer surface at incidence locations, which form a second field;

a detection system with a multiplicity of detection regions that form a third field;

a second particle optical unit with a second particle optical beam path, which is configured to image second individual particle beams, which emanate from the incidence locations in the second field, onto the third field of the detection regions of the detection system;

a magnetic and/or electrostatic objective lens, in particular a magnetic and/or electrostatic immersion lens, through which both the first and the second individual particle beams pass;

a beam switch, which is arranged in the first particle optical beam path between the multi-beam particle generator and the objective lens and which is arranged in the second particle optical beam path between the objective lens and the detection system;

a sample stage for holding and/or positioning a wafer during the wafer inspection;

an autofocus determining element, which is configured to generate data for determining actual autofocus data during the wafer inspection;

a fast autofocus correction lens; and a controller;

wherein the controller is configured for static or low-frequency adaptation of a focusing in order to control at least the objective lens and/or an actuator of the sample stage at a first working point with a first working distance in such a way that the first individual particle beams are focused on the wafer surface situated at the first working distance, and wherein the controller is configured for high-frequency adaptation of the focusing in order to generate an autofocus correction lens control signal on the basis of the actual autofocus data at the first working point during the wafer inspection in order to control the fast autofocus correction lens during the wafer inspection at the first working point.

The charged particles can be, e.g., electrons, positrons, muons or ions or other charged particles. Optionally, the charged particles are electrons generated, e.g., using a thermal field emission source (TFE). However, other particle sources can also be used.

The number of first individual particle beams is able to be chosen variably in this case. However, it can be desirable for the number of particle beams is 3n (n−1)+1, where n is any natural number. This allows a hexagonal grid arrangement of the detection regions. Other grid arrangements of the detection regions, e.g., in a square or rectangular grid, are likewise possible. By way of example, the number of first individual particle beams is more than 5, more than 60 or more than 100 individual particle beams.

The multi-beam particle generator can comprise a plurality of real particle sources, which each emit an individual particle beam or else each emit a plurality of individual particle beams. However, the multi-beam particle generator might also comprise a single particle source and, in the downstream particle optical beam path, a multi-aperture plate in combination with a multi-lens array and/or a multi-deflector array. Then, as a result of the multi-beam particle generator, the multiplicity of individual particle beams are generated and imaged onto an intermediate image plane. This intermediate image plane can be a real intermediate image plane or a virtual intermediate image plane. In both cases, the locations of the individual particle beams in the intermediate image can be considered to be virtual particle sources and can consequently be considered to be origins for the further particle optical imaging using the first particle optical beam path. The virtual particle sources in this intermediate image plane are consequently imaged onto the wafer surface or into the object plane and the wafer to be inspected can be scanned using the multiplicity of individual particle beams.

If the objective lens system comprises a magnetic objective lens, the latter can provide a weak or a strong magnetic field. According to an embodiment of the disclosure, the objective lens is a magnetic immersion lens. Here, this can be a weak immersion lens or strong immersion lens. Magnetic immersion lenses can be realized, for example, by virtue of the bore hole in the lower (sample-facing) pole shoe of the lens having a larger diameter than the bore hole in the upper (sample-distant) pole shoe of the lens. In contrast to objective lenses which provide only a low magnetic field at the object, immersion lenses can be able to achieve lower spherical and chromatic aberrations, and also greater off-axis aberrations. In the magnetic field of the lens, the individual particle beams passing therethrough experience a Larmor rotation (both in the primary path and in the secondary path).

According to the disclosure, a sample stage for holding and/or positioning a wafer during the wafer inspection can be provided. Here, it is possible for the sample stage to have a mechanism for adjusting the height (e.g., z-stage) in order to set a working distance. However, there might not be an option for adjusting the height. Then, the sample stage only serves to hold the wafer but not to position the latter in the z-direction. In both cases, it is possible but not mandatory for the sample stage to be movable along one axis (e.g., x-axis, y-axis) or in a plane (e.g., xy-plane).

Further, an autofocus determining element can be provided, which is configured to generate data for ascertaining actual autofocus data during the wafer inspection. In this case, the actual autofocus data can describe the current focal position with respect to the wafer surface directly or indirectly. By way of example, the autofocus determining element can comprise or consist of an autofocus measuring element. The data can then be measurement data. However, it is additionally or alternatively also possible for the data for ascertaining the actual autofocus data to be generated on the basis of a model. By way of example, this is possible if there is a sufficiently exact model of the wafer to be scanned.

In general, autofocus measuring elements are known and are described in U.S. Pat. No. 9,530,613 B2 and in US 2017/0117114 A1, for example, the disclosures of which are included in this application in full by reference. By way of example, use can be made of a height sensor (z-sensor). In general, to ascertain the focal position, the current focal position of the individual particle beams with respect to the wafer surface is deduced via a measurement (deduction of actual autofocus data). Optionally, all foci are located exactly on the wafer surface. The focal position of an individual particle beam is defined in this case by the position of the beam waist of a beam.

U.S. Pat. No. 9,530,613 B2 discloses the use of astigmatic auxiliary beams for setting or adjusting the focus. Depending on the focusing present, the known astigmatic (e.g., elliptic) beam profile changes during the imaging. This change can allow conclusions to be drawn about the focus and hence about the desired focus corrections for the stigmatic beams.

US 2017/0117114 A1 discloses an "on-the-fly"-type autofocus. In the process, the current focal position of the individual particle beams is deduced during scanning of a sample surface from the data of an image field (measured intensities) and a continuous/"on-the-fly" adjustment of the focus is implemented for the subsequent image field. In particular, it is not necessary here to scan the same sample region multiple times. An object property is determined in each case, optionally indirectly, by the measurement. By way of example, this object property can be a height profile of the sample surface. Then, for the subsequent image recording, a predicted value for the height is ascertained from the ascertained height profile and another, better adapted focus position with respect to the sample surface is set.

The multiple particle beam system according to the disclosure can comprise a controller. The controller is, in general, configured to control particle optical components in the first and/or in the second particle optical beam path. Optionally, but not necessarily, the controller is a central controller for the entire multiple particle beam system. The controller can have a one-part or multi-part embodiment and can be functionally subdivided.

The controller can be configured for static or low-frequency adaptation of the focusing in order to control at least the objective lens and/or an actuator of the sample stage at a first working point with a first working distance, in such a way that the first individual particle beams are focused on the wafer surface situated at the first working distance, and it is configured for high-frequency adaptation in order to generate an autofocus correction lens control signal on the basis of the actual autofocus data at the first working point during the wafer inspection in order to control the at least one fast autofocus correction lens during the wafer inspection at the first working point. In this case, for the high-frequency adaptation, control of the objective lens is optionally not altered; a change in the excitation of the objective lens is regularly only implemented in the case of a static or low-frequency adaptation of the focal position. In this case, the objective lens comprises at least one magnetic and/or at least one electrostatic objective lens, i.e., the objective lens can be embodied in the form of a corresponding objective lens system.

Thus, the controller can control two different focal settings at one working point which—optionally in addition to other parameters—is defined by an associated working distance between the objective lens and the wafer surface. Firstly, it can control with a significant stroke the focusing by way of a control of the objective lens and optionally further lenses and/or by way of a control of an actuator for displacing the sample stage. These final controlling elements can react comparatively slowly to the control signal; in this case, an adaptation typically involves several ten to several hundred milliseconds and is used, in particular, when a working point with the chosen working distance is honed in on for the first time, for example when a wafer is changed. By way of example, the stroke for changing the working distance can be +/−100, +/−200 μm or +/−300 μm.

According to the disclosure, the controller secondly can also control the focal setting by way of controlling the fast autofocus correction lens according to the disclosure. This lens can have different embodiments, for example it can be embodied as a fast electrostatic lens. Various embodiment variants and possible positions of the autofocus correction lens in the beam path will still be described in more detail below. It is also possible to provide for a plurality of autofocus correction lenses and for these to be controlled individually. An autofocus correction lens can be used for a quick adjustment and it acts on the relative focal position of the individual particle beams, wherein this effect may be quite pronounced or less pronounced. It is also possible for the autofocus correction lens to also exert an effect on other particle optical parameters in addition to the effect on the focus. In this case, quick means that the excitation of the autofocus correction lens allows a high-frequency adaptation of the relative focal position; an adaptation time TA is in the range of μs, for example TA≤500 μs, optionally TA≤100 μs and/or TA≤50 μs. The stroke for changing the working distance is typically several for example +/−20 μm, +/−15 μm and/or +/−10 μm.

According to an embodiment of the disclosure, an adaptation time TA for the high-frequency adaptation is shorter than the adaptation time TA for the low-frequency or static adaptation at least by a factor of 10, optionally at least by a factor of 100 or 1000. Moreover, a stroke for setting the working distance for the low-frequency or static adaptation can be greater than the stroke for the high-frequency adaptation at least by a factor of 5, optionally at least by a factor of 8 and/or 10.

In the two adjustment variants for the focus, it may be desirable to also update other particle optical components of the system. For these corrections, too, the controller can provide appropriate control signals. In the case of the low-frequency or static adaptation, the final controlling elements can likewise be slowly adjustable final controlling elements or they can be quickly adjustable final controlling elements. In this case, the limiting elements in terms of time are usually the magnetic lenses, which include for example magnetic field lenses and also the magnetic objective lens, and/or the time for displacing the sample stage in the z-direction. In the case of the high-frequency adaptation, it is desirable for the other final control elements to also be substantially quickly adjustable. Here, their respective adaptation times are optionally ably of the same order of the adaptation time of the fast autofocus correction lens. By way of example, they can be slower at most by a factor of 2. However, they can also be faster than the adaptation time of the fast autofocus correction lens. By way of example, the fast additional final controlling elements can be electrostatic lenses, electrostatic deflectors and/or electrostatic stigmators. Air coils with only a few turns can also be used as fast correctors.

According to an embodiment of the disclosure, a second working point is defined at least by a second working distance between the objective lens and the wafer surface, wherein the second working distance differs from the first working distance of the first working point. Then, the controller is configured to carry out a low-frequency adaptation in the case of a change between the first working point and the second working point and control at least the magnetic objective lens and/or an actuator of the sample stage at the second working point such that the first individual particle beams are focused on the wafer surface situated at the second working distance. By way of example, a change in the working point is implemented when a wafer is changed; the thickness of the wafers can be different in this case. A wafer change is a comparatively slow procedure, and so a slow adaptation is sufficient in this case. However, it is also possible, for example, to alter the working point or the working distance because the inspection task has changed.

Optionally, the controller is configured to generate an autofocus correction lens control signal for high-frequency adaptations on the basis of the actual autofocus data at the second working point with the second working distance during the wafer inspection in order to control the fast autofocus correction lens during the wafer inspection at the second working point. Furthermore, all the statements already made above in conjunction with the first working point at the first working distance apply to setting the fast autofocus at the second working point with the second working distance.

According to an embodiment of the disclosure, the first and/or the second working point are furthermore defined by a landing angle of the first individual particle beams in the object plane and by a grid arrangement of the first individual particle beams in the object plane. The controller can then be configured to keep the landing angle and the grid arrangement substantially constant during the high-frequency adaptation at the first and/or second working point. In this case, the term grid arrangement can comprise the pitch between the individual particle beams in the object plane and the rotation of the individual particle beam arrangement; by way of example, the grid arrangement can be present in the form of the aforementioned hexagon image field. Thus, when the grid arrangement is kept constant, both the magnification, which is coupled to the pitch of the individual particle beams, and the orientation of the second field of points of incidence of the individual particle beams in the object plane can be kept constant. Here, the magnification is optionally kept constant to approximately 50 ppm, 20 ppm, 10 ppm, 1 ppm or better (e.g., 50 nm, 20 nm, 10 nm, 1 nm or better in the case of a 100 µm image field size). The maximum angle deviation from the desired landing angle on the wafer surface is generally no more than +/−0.1°, +/−0.01° or +/−0.005°.

According to an embodiment of the disclosure, the controller is configured to keep the landing angle and the grid arrangement substantially constant even during a change between the first working point and the second working point. Thus, this relates to keeping the aforementioned parameters constant even in the case of a low-frequency adaptation of the focus. Here, the magnification is optionally kept constant to approximately 50 ppm, 20 ppm, 10 ppm, 1 ppm or better (e.g., 50 nm, 20 nm, 10 nm, 1 nm or better in the case of 100 µm). The maximum angle deviation from the desired landing angle on the wafer surface is generally no more than +/−0.1°, +/−0.01° or +/−0.005°.

The final controlling elements for adapting particle optical parameters such as, e.g., landing angle and grid arrangement (position or magnification and rotation) and, in particular, keeping these constant can, in full or in part, be the same for the low-frequency adaptation as for the high-frequency adaptation. However, if these are the same final controlling elements in full or in part, these final controlling elements are desirably suitable for high-frequency adaptation.

According to an embodiment of the disclosure, the autofocus correction lens comprises an electrostatic lens or consists of an electrostatic lens. Generally, settings of electrostatic lenses can be altered substantially faster than settings of magnetic lenses, in which hysteresis effects, eddy currents and self- and mutual inductances may prevent a fast adaptation. According to the disclosure, an electrostatic lens can be provided as a complete lens, for example as a tube lens. However, it is also possible that only an additional component in the form of an additional electrode is provided as autofocus correction lens, the latter developing its electrostatic lens effect in conjunction with other components or surrounding voltages.

The fast autofocus correction lens can be arranged at various positions in the first particle optical beam path, which can offer different features. What can be taken into account is, firstly, the available installation space in the overall system but also, secondly, the effect of the autofocus correction lens on other particle optical parameters than the focus. As already mentioned at the outset, a lens in multiple particle beam systems normally does not act only on a single particle optical parameter; in general, the effects of particle optical components are not orthogonal to one another. The inventors have examined these relationships in more detail and have discovered that there are a few positions in the particle optical beam path of multiple particle beam systems which have special properties: Normally, a crossover point or a crossover plane is provided in the primary beam path of a multiple particle beam system according to the disclosure, where the individual particle beams are superposed or cross one another. This crossover plane is normally situated just upstream of the objective lens. Comprehensive calculations have shown that an additional lens on the crossover substantially acts on the focus of the first individual particle beams and (if at all) only acts weakly on other particle optical parameters such as position, telecentricity or rotation. Consequently, it is generally desirable to arrange the autofocus correction lens at the crossover or in the crossover plane of the first individual particle beams. However, in practice, the crossover is not a singular point but has a spatial extent, and so it is often only possible to attain an arrangement of the autofocus correction lens close to the crossover/close to the crossover plane. According to the disclosure, there are a number of options to this end:

According to an embodiment of the disclosure, the autofocus correction lens is arranged in a beam tube extension, which projects into the objective lens from the direction of the upper pole shoe. In general, the individual particle beams are guided within a beam tube. The latter is usually evacuated. Here, the beam extension tube is precisely the region of the beam tube which protrudes a little into the magnetic objective lens from the upper pole shoe. The beam tube is typically at ground potential, and so the autofocus correction lens or an associated electrode can be arranged well within the beam tube extension.

According to an embodiment of the disclosure, a beam deflection system is furthermore provided between the beam switch and the objective lens and it is configured to raster-scan the wafer surface with a scanning movement of the individual particle beams, wherein the autofocus correction lens is realized as an offset on the beam deflection system. Typically, a beam deflection system ("deflection scanner" or "scan deflector") is realized by two or more deflectors arranged in succession in the beam path. Now, the offset voltage is provided at all electrodes involved in the deflection. Here, the lens effect arises as a result of the superposition of the deflection field with an Einzel lens field. The embodiment described can mean that no further changes are used in terms of the hardware of the system.

According to an embodiment of the disclosure, the multiple particle beam system furthermore comprises a beam deflection system between the beam switch and the objective lens, configured to raster-scan the wafer surface with a scanning movement of the individual particle beams, wherein the beam deflection system comprises an upper deflector and a lower deflector arranged in succession in the direction of the beam path and wherein the autofocus correction lens is arranged between the upper deflector and the lower deflector. This embodiment can be simple to realize since only small changes have to be undertaken in the hardware of existing systems.

According to an embodiment of the disclosure, the multiple particle beam system furthermore comprises a beam deflection system between the beam switch and the objective lens, configured to raster-scan the wafer surface with a scanning movement of the individual particle beams, wherein the beam deflection system comprises an upper deflector and a lower deflector arranged in succession in the direction of the beam path and wherein the autofocus correction lens is arranged between the lower deflector and the upper pole shoe of the magnetic objective lens. The autofocus correction lens can be close to the crossover plane in this embodiment variant.

According to an embodiment of the disclosure, the autofocus correction lens is arranged between the wafer surface and a lower pole shoe of the magnetic objective lens. Although this position is no longer in the vicinity of the crossover and the effect of the lens no longer extends only very predominantly on the focus, this embodiment can mean that the autofocus correction lens only has small subsequent aberrations as it normally is the last lens directly in front of the wafer surface.

According to an embodiment of the disclosure, the autofocus correction lens is arranged between the upper and the lower pole shoe of the magnetic objective lens. This embodiment can be is realized far toward the bottom of the beam path (autofocus correction lens as penultimate lens), and so only small subsequent aberrations arise in this case too.

According to an embodiment of the disclosure, the multiple particle beam system furthermore comprises a beam tube that is able to be evacuated and that substantially surrounds the first particle optical beam path from the multi-beam particle generator to the objective lens, wherein the beam tube has an interruption and wherein the autofocus correction lens is arranged within this interruption. Here, the beam tube is substantially tight in the aforementioned region, i.e., embodied such that a vacuum or high vacuum can be generated therein. It can have different cross sections and/or else chambers along the beam path. Here, the interruption in which the autofocus correction lens is arranged is optionally the only interruption in the beam tube. Apart from the locations of the interruption where the autofocus correction lens is situated, the inner wall of the beam tube is at ground potential. Possible connecting points/contact points between vacuum chambers and the actual beam tube should not be considered to be interruptions in this context.

According to an embodiment of the disclosure, the multiple particle beam system furthermore comprises a field lens system arranged in the first particle optical beam path between the multi-beam particle generator and the beam switch, wherein the interruption of the beam tube in which the autofocus correction lens is arranged is arranged between the field lens system and the beam switch. This embodiment can offer comparatively large amounts of space for the arrangement of the autofocus correction lens.

According to an embodiment of the disclosure, the beam switch comprises two magnet sectors and the interruption of the beam tube in which the autofocus correction lens is arranged is provided in the region of the beam switch between the two magnet sectors. This embodiment can offer comparatively large amounts of space for the arrangement of the autofocus correction lens.

According to an embodiment of the disclosure, the multiple particle beam system furthermore comprises a beam deflection system between the beam switch and the objective lens, configured to raster-scan the wafer surface with a scanning movement of the individual particle beams, wherein the interruption of the beam tube in which the autofocus correction lens is arranged is provided between the beam switch and the beam deflection system. This embodiment can offer comparatively large amounts of space for the arrangement of the autofocus correction lens.

According to an embodiment of the disclosure, the multiple particle beam system furthermore comprises a field lens system which is arranged in the first particle optical beam path between the multi-beam particle generator and the beam switch. This field lens system can comprise one or more lenses. It comprises at least one magnetic field lens. In this embodiment of the disclosure, the interruption of the beam tube in which the autofocus correction lens is arranged is arranged within the one magnetic field lens of the field lens system. Comparatively large amounts of installation space are also available in this position. However, the autofocus correction lens in this position acts on the focus, the position and the tilt of the individual particle beams. Equally, a position and/or beam tilts can (also) be compensated in this embodiment.

According to an embodiment of the disclosure, the multiple particle beam system furthermore comprises a beam tube that is able to be evacuated and that substantially surrounds the first particle optical beam path from the multi-beam particle generator to the objective lens. In this case, the autofocus correction lens is embodied as a tube lens and arranged within the beam tube. Thus, the beam tube has no interruption or perforation, simplifying the sealing/tightness of the beam tube. Once again, there are a plurality of ways of implementing this embodiment variant, four of which are specified below.

According to an embodiment of the disclosure, the multiple particle beam system furthermore comprises a field lens system which is arranged in the first particle optical beam path between the multi-beam particle generator and the beam switch, wherein the autofocus correction lens is arranged within the beam tube between the field lens system and the beam switch. This embodiment can offer comparatively large amounts of space for the arrangement of the autofocus correction lens.

According to an embodiment of the disclosure, the beam switch has two magnet sectors and the autofocus correction lens is provided within the beam tube between the two magnet sectors. This embodiment can offer comparatively large amounts of space for the arrangement of the autofocus correction lens.

According to an embodiment of the disclosure, the multiple particle beam system furthermore comprises a beam deflection system between the beam switch and the objective lens, configured to raster-scan the wafer surface with a scanning movement of the individual particle beams, wherein the autofocus correction lens is provided within the beam tube between the beam switch and the beam deflection system. This embodiment can offer comparatively large amounts of space for the arrangement of the autofocus correction lens.

According to an embodiment of the disclosure, the multiple particle beam system furthermore comprises a field lens system which is arranged in the first particle optical beam path between the multi-beam particle generator and the beam switch, wherein the autofocus correction lens is arranged within the beam tube within a magnetic field lens.

This embodiment can offer comparatively large amounts of space for the arrangement of the autofocus correction lens. In this position, the autofocus correction lens can act on the position and the tilt of the individual particle beams in addition to the focus. This can facilitate (possibly additional) corrections of position and landing angle of the first individual particle beams.

According to a further embodiment of the disclosure, the fast autofocus correction lens comprises a fast magnetic lens, in particular an air coil, or consists of a fast magnetic lens, in particular an air coil. Such an air coil only can have comparatively little inductance and can therefore, to a certain extent, also be used as a fast autofocus correction lens. By way of example, such an air coil has several ten to several hundred turns, for example 10≤k≤500 and/or 10≤k≤200 and/or 10≤k≤50 applies to the number k of turns and the following may apply to the adaptation times TA of the air coil: TA≤500 µs, optionally TA≤100 µs and/or TA≤50 µs. This can apply if the air coil is arranged so that no magnetic material, or at best little magnetic material, is situated in the vicinity thereof.

According to an embodiment of the disclosure, the multiple particle beam system furthermore comprises a beam tube that is able to be evacuated and that substantially surrounds the first particle optical beam path from the multi-beam particle generator to the objective lens, wherein the fast magnetic lens is arranged outside around the beam tube. Thus, the beam tube need not be perforated or interrupted in this case. Producing this embodiment variant can be comparatively simple.

According to an embodiment of the disclosure, the multiple particle beam system can furthermore comprise a field lens system which is arranged in the first particle optical beam path between the multi-beam particle generator and the beam switch, wherein the fast magnetic lens is arranged around the beam tube between the field lens system and the beam switch. Thus, the beam tube need not be perforated or interrupted in this case. Producing this embodiment variant can be comparatively simple.

According to an embodiment of the disclosure, the beam switch can have two magnet sectors and the fast magnetic lens is arranged around the beam tube between the two magnet sectors. Thus, the beam tube need not be perforated or interrupted in this case. Producing this embodiment variant can be comparatively simple.

According to an embodiment of the disclosure, the multiple particle beam system can furthermore comprise a beam deflection system between the beam switch and the objective lens, configured to raster-scan the wafer surface with a scanning movement of the individual particle beams, wherein the fast magnetic lens is arranged around the beam tube between the beam switch and the beam deflection system. Thus, the beam tube need not be perforated or interrupted in this case. Producing this embodiment variant can be comparatively simple.

According to an embodiment of the disclosure, the multiple particle beam system furthermore comprises a beam deflection system between the beam switch and the objective lens, configured to raster-scan the wafer surface with a scanning movement of the individual particle beams, wherein the beam deflection system comprises an upper deflector and a lower deflector arranged in succession in the direction of the beam path; and wherein the fast magnetic lens is arranged around the beam tube between the upper deflector and the lower deflector. Thus, the beam tube need not be perforated or interrupted in this case. Producing this embodiment variant can be comparatively simple.

According to an embodiment of the disclosure, the multiple particle beam system moreover comprises a fast telecentricity correction mechanism, which is configured to substantially contribute to correcting a tangential or radial telecentricity error of the first individual particle beams in the second field, and the controller of the multiple particle beam system is set up to generate a telecentricity correction mechanism control signal for high-frequency adaptations at the respective working point during the wafer inspection on the basis of the actual autofocus data in order to control the fast telecentricity correction mechanism during the wafer inspection. As already explained above, a fast adaptation of other particle optical components is often also used within the scope of fast autofocusing in order to be able to keep other particle optical parameters constant. One of these parameters is the telecentricity or the landing angle of first individual particle beams on the wafer surface (the terms telecentricity and landing angle are used synonymously in this patent application). Here, when applying an element provided for the telecentricity correction, it is also the case that this element does not necessarily only act on the telecentricity but once again interacts with other particle optical parameters on account of the non-orthogonality of the effects of the particle optical components. Therefore, within the scope of this patent application, the fast telecentricity correction mechanism is defined as intended to act substantially—and hence not necessarily exclusively—on the telecentricity. Then, an effect relates to the telecentricity. It is also possible for a fast autofocus correction lens to (also) be a fast telecentricity correction mechanism, and vice versa.

How the tangential telecentricity error and a rotation error, which are generated by an immersion lens as magnetic objective lens, arise is explained below: In a reference arrangement of the magnetic immersion lens with a first imaging scale and a first focal plane in the magnetic field of the magnetic immersion lens, a first grid arrangement with a first beam pitch or pitch of the first individual particle beams and with a first orientation is formed in the object plane. In the process, charged particles in the magnetic field of the magnetic immersion lens are steered onto helical trajectories. Reference is made to a magnetic immersion lens if the magnetic field of an objective lens extends up to the sample or the object, for example a semiconductor wafer. The grid arrangement of the beam foci in the object plane, in which a wafer is arranged for example, is also rotated as a result of the helical particle trajectories. To generate a first grid arrangement in the object plane with a desired, pre-defined orientation, the twist or rotation of the grid arrangement is usually held in reserve, for example by arranging a generating device of the grid arrangement (e.g., in the form of a multi-aperture plate as a constituent part of a multi-beam particle generator) in a predetermined, pre-rotated position, which counters the rotation due to the magnetic immersion lens. First individual particle beams also receive a tangential velocity component which, in the case of an immersion lens, leads to the individual particle beams no longer being incident on a sample in perpendicular fashion but in a manner tilted or inclined to a perpendicular of the sample surface in the tangential direction. Particularly in the case of a multi-beam system, first individual particle beams have different tangential inclination angles, which increase with the distance from the optical axis of the magnetic immersion lens in the radial direction. This error is referred to as tangential telecentricity error. Usually, the tangential telecentricity error can be compensated by virtue of an appropriate tangential velocity component of the first individual particle beams being generated upstream of the magnetic immersion lens in targeted fashion, the tangential velocity component counteracting the tangential telecentricity error and compensating the latter at the wafer surface.

A change in the excitation of the magnetic immersion lens, a change in the relative focal position or a change in the imaging scale of the first grid arrangement of the multiplicity of first individual particle beams leads to unwanted, parasitic effects. By way of example, a tangential and/or radial telecentricity error is generated by each of the aforementioned changes.

Each of the aforementioned changes can alter the fraction of a revolution of the helical electron trajectories or the rotation angle of the rotation of the grid arrangement. Consequently, a second grid arrangement of the multiplicity of primary electron beams is formed, which is rotated counter to the first grid arrangement. This rotation is unwanted and, according to the disclosure, compensated by changing the rotation of the grid arrangement.

According to an embodiment of the disclosure, the telecentricity correction mechanism comprises a first deflector array which is arranged in an intermediate image plane of the first particle optical beam path. By way of example, such a deflector array is known from DE 10 2018 202 421 B3 and WO 2019/243349 A1; the disclosure of both documents is incorporated into this patent application in full by reference. Here, a deflector array comprises a multiplicity of deflectors arranged in an array, wherein a group of individual particle beams passes through each of the deflectors during operation. Here, a group may also consist of only one individual particle beam.

According to an embodiment of the disclosure, the multiple particle beam system moreover comprises a fast rotation correction mechanism, which is configured to substantially contribute to correcting a rotation of the first individual particle beams in the second field, wherein the controller is set up, during the wafer inspection at the respective working point, to generate a rotation correction mechanism control signal for high-frequency adaptations on the basis of the actual autofocus data in order to control the fast rotation correction mechanism during the wafer inspection. The rotation correction mechanism does not necessarily act only on the rotation but instead, once again, interacts with other particle optical parameters on account of the non-orthogonality of the effects of the particle optical components. Therefore, within the scope of this patent application, the fast rotation correction mechanism is defined as intended to act substantially—and hence not necessarily exclusively—on the rotation. Then, an effect relates to the rotation. It is also possible for a fast autofocus correction lens to (also) be a fast rotation correction mechanism, and vice versa.

According to an embodiment of the disclosure, the rotation correction mechanism comprises an air coil. By way of example, such an air coil has several ten to several hundred turns, for example $10 \leq k \leq 500$ and/or $10 \leq k \leq 200$ and/or $10 \leq k \leq 50$ applies to the number k of turns and the following may apply to adaptation times TA of the air core coil: $TA \leq 500$ µs, optionally $TA \leq 100$ µs and/or $TA \leq 50$ µs. This can apply if the air coil is arranged so that no magnetic material, or at best little magnetic material, is situated in the vicinity thereof.

According to an embodiment of the disclosure, the rotation correction mechanism comprises a second deflector array which, at a distance, is arranged directly upstream or downstream of the first deflector array which acts as fast telecentricity correction mechanism. Thus, in this embodiment, a further deflector array is arranged, at a distance, upstream or downstream of the deflector array for telecentricity correction, the further deflector array causing a change in the focal position on the wafer surface as a result of deflecting individual beams and hence, in total, causing a rotation of the grid arrangement by way of an appropriate control. The openings of the respective downstream deflector array are formed correspondingly larger in this case and designed for a beam deflection of the preceding deflector array. Consequently, a compensation of rotation and telecentricity error is facilitated by way of two deflector arrays arranged in succession.

According to an embodiment of the disclosure, the rotation correction mechanism comprises a multi-lens array which is arranged, at a distance, directly upstream or downstream of the first deflector array which acts as a telecentricity correction mechanism, in such a way that the first individual particle beams pass through the multi-lens array in off-axis fashion. Hence, a deflecting effect also arises in addition to a focusing effect. As a result of an offset of an individual particle beam in the tangential direction in relation to an axis of a microlens, the individual particle beam is deflected in the tangential direction. By way of example, the tangential beam offset can be set by an upstream deflector array or by a rotation of the multi-lens array with respect to the grid arrangement. A change in the tangential beam deflection can be generated by an active deflector array upstream of the multi-lens array or by a multi-lens array with a variable refractive power. Then, the deflection angle also changes with the change in the refractive power. The change in the refractive power can be compensated by a further electrostatic lens, which for example acts on all individual particle beams. A further option lies in an active rotation of the multi-lens array through a few mrad. Since the deflection is amplified by the lens effect, a rotation angle for rotating the multi-lens array can be smaller than the rotation angle of the rotation of the grid arrangement.

According to an embodiment of the disclosure, the multi-beam particle generator comprises the fast rotation correction mechanism and the rotation correction mechanism is actively rotated by the rotation correction mechanism control signal. By way of example, the multi-beam particle generator contains at least one deflector array or at least one multi-lens array. A twist of the grid arrangement can be brought about by appropriate active rotation of the entire multi-beam particle generator or the entire generating device of the grid arrangement or by active rotation of individual array components.

According to an embodiment of the disclosure, the fast rotation correction mechanism comprises a first magnetic field generating device for a first weak magnetic field and a second magnetic field generating device for a second weak magnetic field, wherein the first magnetic field generating device is only controlled for a rotation in a positive rotation direction and the second magnetic field generating device is only controlled for a rotation in a negative rotation direction by the controller via the rotation correction mechanism control signal. Since a compensation of the twist or rotation of the grid arrangement is desirably very fast in conjunction with a fast autofocus, individual magnetic elements are unsuitable to this end. However, the inventors have discovered that a fast rotation of a grid arrangement together with a change in the focal position can be achieved using at least two magnetic elements by virtue of using each of the magnetic elements for rotating in one direction only. Hysteresis is avoided by two magnetic components which are each operated in one direction only and consequently a fast rotation of the grid arrangement in two rotation directions is possible. Both components can be reset in brief breaks between inspection tasks, for example while positioning the wafer from a first inspection site to a second inspection site. Thus, for example, an axial magnetic field for rotation in the positive direction can be combined with a magnetic immersion lens at the exit of the pencil of the primary beams from the generating device for rotation in the negative direction.

According to an embodiment of the disclosure, the first and the second magnetic field have an axial configuration and are arranged in a converging or diverging pencil of the first individual particle beams in the first particle optical beam path. Such arrangements and the underlying physical effects are described, for example, in the German patent application with the application number 10 2020 123 567.4, which was not yet laid open at the time of this application and which was filed on Sep. 9, 2020, the disclosure of which is incorporated in this application in full by reference.

According to an embodiment of the disclosure, a maximum deviation of each individual particle beam from a desired landing position on the wafer surface is no more than 10 nm, 5 nm, 2 nm, 1 nm or 0.5 nm. This is an absolute maximum deviation—it applies to any direction on the wafer surface (which is planar or approximated as planar) and can be ensured, in particular, via one or more of the above-described mechanism for telecentricity correction and/or rotation correction and/or position correction.

According to an embodiment of the disclosure, the controller is configured to carry out the determination of the autofocus correction lens control signal and/or the rotation correction mechanism control signal and/or the telecentricity correction mechanism control signal on the basis of the actual autofocus data using an inverted sensitivity matrix which describes the influence of excitation changes of particle optical components on particle optical parameters that characterize the particle optical imaging at the respective working point. Such an inverted sensitivity matrix is described in the German patent application DE 10 2014 008 383 A1, the disclosure of which is incorporated in this patent application in full by reference. The change of the effect of only one particle optical component in a multi-beam particle optical unit leads to a change in a plurality of parameters which characterize the particle optical imaging. However, in practice, it is desirable for settings of the particle optical unit to be changed such that only one parameter which characterizes the particle optical imaging changes as a result of the change in the setting while the remaining parameters remain unchanged. To this end, it is desirable to change the settings of effects of the plurality of particle optical components together. To determine which settings have to be changed to change only one parameter, and to determine how these changes have to be implemented, it is possible, for example, to determine the entries of a matrix A, which describes these setting changes, from m×n measurements. Here, n corresponds to the number of particle optical components and m corresponds to the number of parameters which characterize the particle optical imaging. After determining the entries, this matrix can then be inverted and it is possible to determine which excitation changes have to be undertaken on what particle optical components in order to change precisely one parameter which describes the particle optical imaging.

According to an embodiment of the disclosure, the fast autofocus correction lens comprises a fast electrostatic lens, wherein the fast autofocus correction lens, as first fast autofocus correction lens, is arranged between the upper and the lower pole shoe of the magnetic objective lens. Here, the phrase "first fast autofocus correction lens" indicates that particularly good autofocus corrections can be obtained via a plurality of fast autofocus correction lenses but that these need not be used. Here, the first fast autofocus correction lens is arranged and controlled by the controller in such a way that it contributes to the fast autofocus correction. This contribution can comprise consist of a high-frequency focus stroke being achieved via the first fast autofocus correction lens. However, it can also comprise or consist of, additionally or alternatively, other beam parameters such as the landing angle, a position and/or a rotation being re-corrected during a fast autofocus step.

According to an embodiment of the disclosure, the first fast autofocus correction lens is integrated into a beam tube extension, which projects into the objective lens from the direction of the upper pole shoe. The beam tube extension is the continuation of the beam tube that is able to be evacuated, which has already been mentioned above. The first fast autofocus correction lens can be a one-part first fast autofocus correction lens or else a multi-part first autofocus correction lens. In the latter case, this optionally is a two-part first fast autofocus correction lens.

According to an embodiment of the disclosure, the first autofocus correction lens has an at least two-part first autofocus correction lens. Optionally, the first autofocus correction lens comprises exactly two parts. In this case, the two parts of the first autofocus correction lens are in a relative neighborhood or in a relative proximity to one another. In this case, both parts of the first autofocus correction lens act in the style of a fast autofocus correction lens on the individual particle beam passing therethrough. However, the specific action can be different.

According to an embodiment of the disclosure, the beam tube extension has two interruptions, wherein one part of the two-part first autofocus correction lens is arranged in each of the two interruptions. According to an embodiment, the two parts of the two-part or at least two-part first autofocus correction lens are each embodied as a tube lens and arranged within the beam tube extension.

The two-part embodiment or, generally, multi-part embodiment of the first fast autofocus correction lens when arranging the same between the upper and lower pole shoe of the objective lens in this case has the following features or the following background: A fast electrostatic lens arranged between the upper pole shoe and the lower pole shoe of the objective lens, and hence arranged within a magnetic field, has a comparatively strong effect on the focus of the first individual particle beams in the second field or in the objective plane. However, it is the case that the individual particle beams experience a temporary change in velocity when passing through the electrostatic lens. If, in turn, the velocity profile of the individual particle beams now changes in an (inhomogeneous) magnetic field, this velocity profile change leads to a change in the azimuthal beam parameters in the objective plane. If now an at least two-part fast autofocus correction lens is arranged within the objective lens instead of a single fast autofocus correction lens, skillful control of the second part of the first fast autofocus correction lens allows substantial compensation of the effect on the azimuthal beam parameters. However, since there are only focusing space charge-free round-optical lenses, it may be desirable+ to control the two parts of the first autofocus correction lens with voltages of different signs. This allows the integral $\int B(z)/v(z)\,dz$ for the individual particle beams in the magnetic field of the objective lens to be kept constant, even during an autofocus step. In this case, the absolute values of the two voltages are not identical but generally different. Moreover, it is possible to choose a three-part or generally multi-part variant instead of the two-part variant. Even in such a configuration, it is possible to keep the path integral constant overall.

According to an embodiment of the disclosure, there is a high-frequency correction of the image field rotation and hence of the azimuthal position of the individual particle beams in the objective plane, substantially in addition to the high-frequency adaptation of the focusing, via the control of the at least two parts of the first autofocus correction lens. Thus, in addition to its task for correcting the focus, the two-part first autofocus correction lens also assumes the function of a rotation correction mechanism. However, it should once again be emphasized here that a strict assignment of lenses to, in each case, a precisely defined task or to, in each case, precisely one defined effect normally cannot be realized perfectly since the effects of lenses are generally not orthogonal to one another.

According to an embodiment of the disclosure, the multiple particle beam system comprises a second fast autofocus correction lens which comprises a fast electrostatic lens,
- wherein the second autofocus correction lens is arranged within a magnetic field of the field lens system;
- wherein the controller is configured to generate a second autofocus correction lens control signal on the basis of the actual autofocus data during the wafer inspection in order to control the second fast autofocus correction lens in high-frequency fashion during the wafer inspection at the respective working point.

The term "second" fast autofocus correction lens in this case indicates that the system also comprises a further fast autofocus correction lens (e.g., first fast autofocus correction lens). However, here and below, the ordinal numbers serve to distinguish between the various embodiment variants of autofocus correction lenses and do not serve to specify the number of implemented fast autofocus correction lenses. This embodiment variant can be combined, in particular, with the embodiment according to which a one-part fast autofocus correction lens, as first fast autofocus correction lens, is arranged between the upper and the lower pole shoe of the magnetic objective lens. The concept of this embodiment or combination of the first fast autofocus correction lens with the second fast autofocus correction lens is substantially analogous to the concept that has been realized via the two-part first fast autofocus correction lens. The intent here is also that of correcting the azimuthal beam parameters. However, this is not implemented by a second lens part of the first fast autofocus correction lens but by the provision of a separate further fast autofocus correction lens, which is arranged within a magnetic field. This second fast autofocus correction lens is arranged within a magnetic field of the field lens system. By way of example, in the process it may be situated within a first lens of the field lens system, within a second lens of the field lens system or within a third magnetic lens of the field lens system. What is important is that the second autofocus correction lens is arranged within a magnetic field in order to obtain an effect on the image field rotation by the change in velocity of the particles of the individual particle beams when passing through the second fast autofocus correction lens. It is possible here for the first fast autofocus correction lens and the second fast autofocus correction lens to be controlled by the controller with voltages of different signs; however, this is not necessarily the case. Moreover, it should be noted that the arrangement of the second fast autofocus correction lens does not primarily serve to change the focus itself but instead serves to correct the changes of other beam parameters, in particular the image field rotation in this case, which generally accompany this. More detailed information in respect of the field lens system can be gathered from for example US 2019/0355545 A1, the disclosure of which is incorporated in this patent application in full by reference.

According to an embodiment of the disclosure, the control of the second fast autofocus correction lens substantially implements a high-frequency correction of the image field rotation or of the azimuthal position of the individual particle beams.

Once again, arranging the second fast autofocus correction lens within the magnetic field of the field lens system can be realized in this case by the provision of an interruption in the beam tube and the arrangement of the fast electrostatic lens within this interruption. Alternatively, it is also possible to embody the second fast autofocus correction lens as a tube lens and arrange the latter within the beam tube and within the magnetic field of the field lens system. However, in conjunction with these implementations it was found that the voltages range can be, for instance, between two and twenty kV, for example at around 5 kV.

According to an embodiment of the disclosure, the multiple particle beam system comprises a third fast autofocus correction lens,
- wherein the third fast autofocus correction lens comprises a fast magnetic lens, in particular an air coil, which is arranged outside around the beam tube in the first particle optical beam path and arranged in a position that is substantially magnetic field-free; wherein the controller is configured to generate a third autofocus correction lens control signal on the basis of the actual autofocus data during the wafer inspection in order to control the third fast autofocus correction lens in high-frequency fashion during the wafer inspection at the respective working point.

The term "third" fast autofocus correction lens in this case indicates that the system comprises at least one further fast autofocus correction lens. However, it need not necessarily comprise three or more fast autofocus correction lenses. The ordinal number(s) used serve here and below to distinguish better between various embodiments of the disclosure and not to specify the number of utilized fast autofocus correction lenses. For the magnetic lens and, in particular, the air coil, what was already explained above applies: By way of example, such an air coil has several 10 to 100 turns, for example $10 \leq k \leq 500$ and/or $10 \leq k \leq 200$ and/or $10 \leq k \leq 50$ applies to the number k of turns and the following may apply to the adaptation times tA of the air coil: $tA \leq 500$ μs, optionally $tA \leq 100$ μs and/or $tA \leq 50$ μs. In any case, this applies if the air coil is arranged so that no magnetic material, or at best little magnetic material, is situated in the vicinity thereof. The adaptation time tA describes how quickly or with what interval beam parameters can be set via the air coil. In this embodiment, the adaptation times of the air coil are short enough to (also) undertake a high-frequency adaptation of beam parameters via the air coil.

According to an embodiment of the disclosure, the first particle optical beam path has an intermediate image plane and the third fast autofocus correction lens is disposed just downstream of this intermediate image plane in the direction of the particle optical beam path. In one example, there is no magnetic material or at best hardly any magnetic material at this position.

According to an embodiment of the disclosure, the control of the third fast autofocus correction lens substantially implements a high-frequency correction of the azimuthal position of the individual particle beams in the object plane. Thus, the third fast autofocus correction lens acts substantially on the image field rotation and not on the focus. Consequently, the third fast autofocus correction lens functionally also corresponds to a rotation correction mechanism.

According to an embodiment of the disclosure, the multiple particle beam system furthermore comprises the following:

A fourth fast autofocus correction lens, which comprises a fast electrostatic lens, wherein the beam tube has an interruption within a magnetic field lens of the field lens system and wherein the fourth fast autofocus correction lens is arranged within this interruption and
    wherein the controller is configured to generate a fourth autofocus correction lens control signal on the basis of the actual autofocus data during the wafer inspection in order to control the fourth fast autofocus correction lens in high-frequency fashion during the wafer inspection at the respective working point.

Here, the fourth fast autofocus correction lens can have a one-part embodiment, or else a multi-part embodiment. The fourth fast autofocus correction lens can have a physically identical embodiment as the second fast autofocus correction lens. However, the fourth fast autofocus correction lens differs from the second fast autofocus correction lens in terms of its primary functionality: According to an embodiment of the disclosure, the control of the fourth fast autofocus correction lens substantially implements a high-frequency correction of the radial landing angle of the individual particle beams in the object plane. By contrast, the second fast autofocus correction lens is substantially used for the high-frequency correction of the image field rotation, to be precise by use in combination with a one-part first fast autofocus correction lens. Additionally, the fourth fast autofocus correction lens can be successfully used both in combination with a one-part and in combination with a two-part first fast autofocus correction lens and optionally with further fast autofocus correction lenses.

According to an embodiment of the disclosure, the multiple particle beam system furthermore comprises the following:

A fifth fast autofocus correction lens, which comprises a fast electrostatic lens, wherein the fifth fast autofocus correction lens is arranged at the multi-beam particle generator, and
    wherein the controller is configured to generate a fifth autofocus correction lens control signal on the basis of the actual autofocus data during the wafer inspection in order to control the fifth fast autofocus correction lens in high-frequency fashion during the wafer inspection at the respective working point.

Here, the fifth fast autofocus correction lens can have a one-part or multi-part embodiment. The fifth fast autofocus correction lens is arranged at the multi-beam particle generator, i.e., it can be part of the multi-beam particle generator but it can also be arranged in the direct vicinity of constituent parts of the multi-beam particle generator.

According to an embodiment of the disclosure, the multi-beam particle generator comprises a multi-lens array with a multi-aperture plate and a counter electrode, wherein the fifth fast autofocus correction lens is realized as an offset voltage that is able to be applied to the counter electrode. The voltage applied to the multi-beam particle generator or the voltage applied to the micro-optical unit is normally a high voltage in the region of many kilovolts, for example 20 kV, 60 kV or 90 kV. Now, if a slight offset is applied to the counter electrode, this offset voltage has a significant influence on the enlargement of the individual particle beams in the object plane but has no noticeable influence on the relative position of the focal position. Consequently, via the fifth fast autofocus correction lens it is possible to correct a radial image position of the individual particle beams in the object plane. However, fast voltage changes as offset in the region of several kilovolts tend to be more difficult to implement or are linked to a certain design of the multi-beam particle generator.

According to an embodiment of the disclosure, the fifth fast autofocus correction lens is therefore realized in alternative fashion: According to this embodiment variant, the multiple particle generator comprises a multi-lens array with a multi-aperture plate and a counter electrode, wherein the fifth fast autofocus correction lens is realized as an additional electrode which is arranged between the multi-aperture plate and the counter electrode or just downstream of the counter electrode in relation to the particle optical beam path. Thus, the offset is dispensed with in this embodiment with two variants; instead work is carried out with a separate additional electrode which is controllable at low-volt potential.

According to an embodiment of the disclosure, the control of the fifth fast autofocus correction lens substantially implements a high-frequency correction of the radial position of the individual particle beams in the object plane. However, in addition or as an alternative thereto, it is also possible to correct other beam parameters via the fifth fast autofocus correction lens.

According to an embodiment of the disclosure, the multiple particle beam system furthermore comprises the following:
    a sixth fast autofocus correction lens, which comprises a fast electrostatic lens,
    wherein the sixth fast autofocus correction lens is embodied in the vicinity of an intermediate image plane as a two-part lens, the first part of which is arranged upstream of the intermediate image plane and the second part of which is arranged downstream of the intermediate image plane, as viewed in the direction of the particle optical beam path, and
    wherein the controller is configured to generate a sixth autofocus correction lens control signal on the basis of the actual autofocus data during the wafer inspection in order to control the sixth fast autofocus correction lens in high-frequency fashion during the wafer inspection at the respective working point.

Here, the two parts of the sixth fast autofocus correction lens are optionally arranged symmetrically in relation to the intermediate image plane. As a consequence, the sixth fast autofocus correction lens as a combination of the lenses can attain the same effect as a single fast correction lens arranged in the intermediate image plane. By way of example, via the sixth fast autofocus correction lens it is possible to set the telecentricity of the individual particle beams in the object plane in high-frequency fashion.

According to an embodiment of the disclosure, the sixth fast autofocus correction lens is provided with a bias. The bias can be negative or positive.

According to an embodiment of the disclosure, the multiple particle beam system furthermore comprises the following:
    a magnetic field compensation lens, which comprises a magnetic lens, wherein the magnetic field compensation lens is arranged between the objective lens and the object plane and
    wherein the controller is configured to control the magnetic field compensation lens with a magnetic field compensation control signal in static or low-frequency fashion, in such a way that the magnetic field in the object plane takes the value of zero.

Unlike the first to fifth fast autofocus correction lens—and optionally one or more fast autofocus correction lenses—the magnetic field compensation lens does not serve for high-frequency autofocus correction. Normally, the magnetic field compensation lens is not suitable for fast autofocus correction either since the magnetic field compensation lens comprises a magnetic lens. On account of hysteresis effects, this magnetic lens is usually switched more slowly or, within the meaning of the definition in this patent application, in low-frequency fashion. According to the disclosure, the magnetic field compensation lens serves to set the magnetic field in the object plane or on the wafer to zero. As a result, it is possible to keep constant the azimuthal landing angle in the object plane or on the wafer, or to pull this to zero. Simulations by the inventors have shown that a high-frequency correction of the azimuthal landing angle is not mandatory either since the residual error to be corrected theoretically is significantly smaller in terms of percentages than in the case of other beam parameters following the high-frequency correction and, in particular, is significantly smaller than the residual error of the radial landing angle following a high-frequency correction.

According to an embodiment of the disclosure, the magnetic field compensation lens is coupled to the objective lens. Such a configuration of a magnetic field compensation lens is already known. An example is described in the international patent application with the publication number WO 2007/060017 A2, the disclosure of which is incorporated in the present application in full by reference. Coupling of the magnetic field compensation lens to the objective lens relates to the magnetic flux in the lower pole shoe of the objective lens in the aforementioned example. Since the magnetic field compensation lens with a further winding is situated below the objective lens, a magnetic flux can also be generated in the lower pole shoe of the objective lens when exciting this further winding. The magnetic flux caused by the first winding, which should be assigned to the objective lens, in the lower pole shoe of the objective lens is oriented substantially in the same direction as the magnetic flux that is generated by an excitation of the winding belonging to the magnetic field compensation lens. Specifically, the current direction in the winding belonging to the objective lens is oriented inversely to the current direction in the winding belonging to the magnetic field compensation lens. What can be achieved by way of an appropriate control of the magnetic field compensation lens and/or the objective lens at a working point is that the magnetic field in the object plane substantially takes the value of zero. It is also possible to realize a magnetic field compensation lens in a different way.

The present patent application has described various embodiments of fast autofocus correction lenses, telecentricity correction mechanism, rotation correction mechanism and position correction mechanism. Specific configurations and arrangements of first, second, third, fourth, fifth, sixth and further fast autofocus correction lenses were likewise described. They can all contribute to the multiple particle beam system being configured such that the beam parameters of focus, landing angle and grid arrangement in the object plane are kept constant at a working point via high-frequency corrections. Comprehensive investigations and simulations by the inventors have now shown that some combinations of autofocus correction lenses and further correctors are particularly well suited to realize a fast autofocus in the first particle optical beam path of the multiple particle beam system. In particular, two combinations were found to be particularly suitable. Via these combinations, it is possible to respectively realize a fast autofocus at different working points while keeping the remaining beam parameters of landing angle, rotation and position in the object plane constant. These two exemplary embodiments will be described in more detail below:

According to an embodiment of the disclosure, the multiple particle beam system furthermore comprises the following:
    a first fast autofocus correction lens, which as at least two-part fast electrostatic lens is arranged between the upper and the lower pole shoe of the magnetic objective lens;
    the fourth fast autofocus correction lens, which comprises a fast electrostatic lens arranged within a magnetic field of a magnetic lens of the field lens system; and the fifth fast autofocus correction lens, which is arranged at the multiple particle generator;
    wherein the controller is configured to generate an autofocus correction lens control signal on the basis of the actual autofocus data during the wafer inspection in order to control the at least two-part fast autofocus correction lens via the first autofocus correction lens control signal with voltages of different signs during the wafer inspection at the respective working point;
    wherein the controller is configured to generate a fourth autofocus correction lens control signal on the basis of the actual autofocus data during the wafer inspection in order to control the fourth fast autofocus correction lens in high-frequency fashion during the wafer inspection at the respective working point; and
    wherein the controller is configured to generate a fifth autofocus correction lens control signal on the basis of the actual autofocus data during the wafer inspection in order to control the fifth fast autofocus correction lens in high-frequency fashion during the wafer inspection at the respective working point. A constraint applying here is that the magnetic field in the object plane takes the value of zero, as can be achieved, for example, using the above-described magnetic field compensation lens. Moreover, it can be the case that both the focus stroke and the image field rotation are set via the at least two-part first fast autofocus correction lens. Optionally, it is moreover the case that the radial image position in the object plane is predominantly set via the fifth fast autofocus correction lens. Finally, substantially the radial landing angle in the object plane is corrected or drawn to zero (perpendicular incidence) via the fourth fast autofocus correction lens, which is optionally arranged within an interruption of the beam tube within a magnetic lens of the field lens system.

According to an embodiment variant of the disclosure, the multi-beam particle beam system furthermore comprises the following:
    the first fast autofocus correction lens, which in particular has a one-part embodiment and which, as fast electrostatic lens, is arranged between the upper and the lower pole shoe of the magnetic objective lens;
    the third fast autofocus correction lens, wherein the third fast autofocus correction lens comprises a fast magnetic lens, in particular an air coil, which is arranged outside around the beam tube in the first particle optical beam path and arranged in a position that is substantially magnetic field-free;

the fourth fast autofocus correction lens, which comprises a fast electrostatic lens arranged within a magnetic field of a magnetic lens of the field lens system; and the fifth fast autofocus correction lens, which is arranged at the multiple particle generator;

wherein the controller is configured to generate a first autofocus correction lens control signal on the basis of the actual autofocus data during the wafer inspection in order to control the first fast autofocus correction lens in high-frequency fashion during the wafer inspection at the respective working point;

wherein the controller is configured to generate a third autofocus correction lens control signal on the basis of the actual autofocus data during the wafer inspection in order to control the third fast autofocus correction lens in high-frequency fashion during the wafer inspection at the respective working point;

wherein the controller is configured to generate a fourth autofocus correction lens control signal on the basis of the actual autofocus data during the wafer inspection in order to control the fourth fast autofocus correction lens in high-frequency fashion during the wafer inspection at the respective working point; and wherein the controller is configured to generate a fifth autofocus correction lens control signal on the basis of the actual autofocus data during the wafer inspection in order to control the fifth fast autofocus correction lens in high-frequency fashion during the wafer inspection at the respective working point. Once again, a constraint applying here is that the magnetic field in the object plane takes the value of zero, as can be achieved, for example, via the above-described magnetic field compensation lens. Here, it can be the case that the focus is set via the first fast autofocus correction lens while the rotation is set via the third fast autofocus correction lens. The radial landing angle can be set or kept constant via the fourth fast autofocus correction lens and the radial position in the object plane can be set or kept constant via the fifth fast autofocus correction lens.

According to an embodiment of the disclosure, the controller is configured to carry out the determination of the autofocus correction lens control signals on the basis of the actual autofocus data using an inverted sensitivity matrix which describes the influence of control changes of particle optical components on particle optical parameters that characterize the particle optical imaging at the respective working point. In respect of details relating to the inverted sensitivity matrix, reference is once again made to the German patent application DE 10 2014 008 383 A1, the disclosure of which is incorporated in this patent application in full by reference.

According to an embodiment of the disclosure, the controller is configured to determine the autofocus correction lens control signals using multidimensional lookup tables. The multidimensional property of the lookup tables arises from the fact that the multi-beam particle beam system according to the disclosure can realize a fast autofocus at more than one working point. Values for a specific working point are located in each dimension of the lookup table. In particular, lookup tables can find use if a feedforward loop is implemented in the system for the purposes of determining the autofocus correction lens control signals.

According to an embodiment of the disclosure, the multiple particle beam system furthermore comprises the following:

a hysteresis correction measuring element in the second particle optical beam path in order to generate hysteresis correction measurement data for characterizing the particle optical imaging in the object plane following a low-frequency change in the control of at least one magnetic lens in the first particle optical beam path, in particular following a change in the working distance, with otherwise unchanged settings in the second particle optical beam path, wherein the controller is configured to generate a hysteresis correction control signal on the basis of the hysteresis control measurement data during the wafer inspection in order to correct at least one autofocus correction lens control signal in high-frequency fashion at the respective working point.

This embodiment variant can offer the option of implementing additional feedback loops in the multi-beam particle beam system. The autofocus determining element is configured to generate data, in particular measurement data, during the wafer inspection for the purposes of determining actual autofocus data and to undertake a high-frequency adaptation of the focusing on the basis of these data. This means that the parameter to be adapted is improved directly by these data or by measurement values, or is adapted in a feedback loop. No conventional feedback loop is implemented in the system in respect of the other beam parameters, such as, for example, rotation and magnification. Instead, an adaptation of the other beam parameters is also undertaken (a so-called feedforward) on the basis of the data, in particular measurement data, for the focusing, i.e., on the basis of the generated or measured actual autofocus data. This situation is different in the case of the implemented hysteresis correction measuring element: Via the hysteresis correction measuring element, it is also possible to generate measurement values for other particle optical parameters than the focus and to use these in a feedback loop for high-frequency correction. This correction is particularly expedient in systems where hysteresis occurs. This is the case when conventional magnetic lenses are used. If a feedforward is implemented in respect of the control of other correction lenses instead of an additional feedback, this is implemented under the assumption that the hysteresis in the system has no effect at all on the utilized settings. Should this nevertheless be the case, a setting via a feedforward is not optimal in the system. In this case, the implementation of an additional feedback in respect of other beam parameters can offer optimization features.

According to an embodiment of the disclosure, the hysteresis correction measuring element comprises a CCD camera in the second particle optical beam path. Such a CCD camera is arranged in the projection path in any case in known multiple particle beam systems. It can now be used to characterize the particle-optical imaging in the object plane. The CCD camera can be the same camera as will still be described below in respect of obtaining projection path measurement data for characterizing the particle optical imaging in the secondary path.

According to an embodiment of the disclosure, the hysteresis correction control signal realizes a correction of the individual beam parameters of radial position and/or azimuthal position in the object plane. Expressed differently, a correction of the individual beam parameters can be ascertained in respect of the magnification and in respect of the image field rotation. The insights obtained therefrom can be used for generating a feedback signal for controlling autofocus correction lenses. The controlled autofocus correction lenses can be those correction lenses that do not serve exclusively for the correction of the relative focal position. However, it is also possible for the autofocus correction lens that predominantly sets the focus of the system in the object plane to also be controlled.

According to an embodiment of the disclosure, the multiple particle beam system furthermore comprises the following:
- at least one fast electrostatic aberration correction mechanism, which is arranged in the particle optical beam path upstream of any fast autofocus correction lens, in particular upstream of each implemented fast autofocus correction lens, and which is set up to keep the path of the individual particle beams through the column constant in highly precise fashion,
- wherein the controller is configured to generate an aberration correction control signal during the wafer inspection in order to control the one fast aberration correction mechanism or the fast aberration correction mechanism at the respective working point in high-frequency fashion.

The fast electrostatic aberration correction mechanism or the multiplicity of fast electrostatic aberration correction mechanism serve to compensate invariably occurring tolerance aberrations. It is very important that the relative position of the individual particle beams does not change in the column during an autofocus setting; they should experience neither an offset nor a tilt and astigmatism should be prevented as well.

By way of example, the fast electrostatic aberration correction mechanism can be a fast electrostatic deflector or a corresponding deflector arrangement.

According to an embodiment, the aberration correction mechanism has an electrode arrangement in the form of an octupole. Via this octupole, it is possible to correct both a beam offset and a beam tilt and also possibly occurring astigmatism.

Keeping the beam paths constant during their passage through the column is very important; in particular, it is important that the individual particle beams in the crossover are incident exactly in centric fashion on a scan deflector (octupole) arranged there because only this ensures that the pixel size does not change from left to right during a scan over the image field. If the condition that the crossover is directed at the scan deflector in 100 percent centric fashion is not satisfied, the pixel size changes from left to right over the image field by approximately 0.01-0.1 parts per thousand; this value does not appear high but is too large for a high precision application. It can be corrected via the above-described measure(s). Further details can be gathered from the German application with the application No. 102020209833.6, filed on Aug. 5, 2020, the disclosure of which is incorporated in this patent application in full by reference.

Optionally, the beam position of the individual particle beams does not change during the passage through the entire column during an autofocus setting. However, it is also already desirable for the positions of the individual particle beams in the crossover itself and upon entry into the objective lens do not change or are not kept constant in highly precise fashion. To this end, the multiple particle beam system according to the disclosure comprises a fast electrostatic aberration correction mechanism, wherein the aberration correction mechanism is arranged in the first particle optical beam path upstream of the crossover of the first individual particle beams and is set up to keep the position of the first individual particle beams constant in highly precise fashion for the purposes of forming the crossover and
- wherein the controller is configured to generate an aberration correction control signal during the wafer inspection in order to control the fast aberration correction mechanism at the respective working point in high-frequency fashion. In this embodiment variant, too, use can be made for example of an electrode arrangement in the form of an octupole as an aberration correction mechanism.

According to an embodiment of the disclosure, the multibeam particle beam system furthermore comprises the following:
- a scanning unit and a beam deflection system between the beam switch and the objective lens, the beam deflection system being configured to raster-scan the wafer surface by way of a scanning movement of the individual particle beams and being able to be controlled via the scanning unit;
- wherein the controller is set up to control the scanning unit via a scanning unit control signal during the wafer inspection at the respective working point and to correct the scanning unit control signal on the basis of the actual autofocus data at the respective working point in high-frequency fashion.

This high frequency correction of the scanning parameters is helpful in order to correct small changes that arise from the adaptation of the overall system during the autofocus setting. Additionally, a slightly changed control of deflectors and/or stigmators can lead to a slight change in the scanning parameters. These scanning parameters include the pixel dimension, the rotation, the skew and the quadraticity. The pixel dimension describes the pixel dimension, the rotation describes the rotation of an X-axis of the image, the skew describes the angle between the X-axis and the Y-axis of the image and the quadraticity specifies whether the pixel size is the same along both axis directions. In practice, these scanning parameters are described by simple 2×2 matrices. A correction of the scanning parameters can be implemented dynamically during an autofocus step via lookup tables. Accordingly, the scanning parameters of pixel size, rotation, skew and/or quadraticity are corrected in high-frequency fashion via lookup tables according to an embodiment of the disclosure.

The multiple particle beam system described in various embodiments above facilitates a high-frequency correction of the focus in the object plane at a working point and at various working points; however, it additionally also allows other beam parameters, for example the rotation, the position and the landing angle, to be kept constant. This is desirable for many applications in the field of multiple particle beam systems. In general, however, there are also applications where it is not necessary to actually keep all beam parameters constant in the object plane. By way of example, it may be desirable to only keep the focus and the landing angle constant. Accordingly, according to an embodiment of the disclosure, the system is set up to undertake a high-frequency correction of the beam parameters of focus and landing angle in the object plane via fast autofocus correction mechanism, in particular via fast autofocus correction lenses, and to undertake a high-frequency correction of the beam parameters of magnification and image field rotation in the object plane via control of a scanning unit. In this case, the beam parameters not physically corrected in the object plane are optionally corrected purely by computation. This is because there are beam parameters that can be corrected with comparatively little computational effort. By way of example, these include beam positions since a displacement of an image involves comparatively little computational effort and also does not change the data directly. By contrast, correcting the rotation involves much computational effort and, additionally, the data are altered by an interpolation used in the process. By contrast, it is not even possible to correct a landing angle by way of a calculation and a physical correction is expedient or indispensable if the sample to be examined has 3-D structures. According to the disclosure, only those beam parameters whose numerical correction is complicated or impossible are now physically corrected by way of correction mechanism using fast autofocus correction lenses/correction mechanism in this embodiment variant. The result is a hybrid system.

According to an embodiment of the disclosure, a change in the image field rotation of the individual particle beams in the object plane is compensated by an adjustment of the rotation via the scanning unit and a change of the magnification in the object plane is corrected by an adjustment of the pixel size via the scanning unit. Then, it can be the case that an image displacement of the individual particle beams in the object plane is corrected purely by computation via the controller. To this end, it is not necessary to alter the obtained image data itself but only the tags thereof (position of pixel 1). The features are enormous because it is possible to dispense with a multiplicity of correction elements/lens elements in the case of such applications. To correct image displacements, generated by charging artifacts of the sample and other distortion effects for example, experience teaches us that this step is involved in any case within the scope of multi-beam systems.

According to an embodiment of the disclosure, the system is then set up to undertake a high-frequency correction of the beam parameters only using those fast correction mechanism arranged downstream of the crossover in the direction of the particle optical beam path. These correction mechanism can be fast autofocus correction lenses and/or fast electrostatic aberration correction mechanism (deflectors and/or stigmators).

According to an embodiment of the disclosure, the controller of the multiple particle beam system is furthermore configured for a static or low-frequency adaptation of a focusing in the second particle optical beam path in order, at the respective working point with the associated working distance, to control particle optical components in the second particle optical beam path in such a way that the second individual particle beams, which emanate from the wafer surface situated at the respective working distance, are focused on the detection regions in the third field. By way of example, the particle optical components which can be used for setting the focus and/or further particle optical parameters describing the particle optical imaging in the second particle optical beam path can be a projection lens system. The particle optical components and, in particular, the projection lens system can also comprise a magnetic lens or a plurality of magnetic lenses, the effect(s) of which can be adjusted comparatively slowly by the controller. Other and/or further magnetic and/or electrostatic lenses, deflectors and/or stigmators can also be controlled by the controller to set the focus and/or other parameters such as the magnification (pitch of the second individual particle beams in the detection plane, position), the rotation and/or the telecentricity at the respective working point with a specified working distance. It is possible for the control of some or all components to be implemented quickly and not slowly (at a low frequency); however, a fast control is not necessary in the secondary path for the basic adjustment at the first working point.

According to an embodiment of the disclosure, the multiple particle beam system furthermore comprises a fast projection path correction mechanism, which may have a multi-part embodiment and which is configured to undertake a high-frequency adaptation of the focus of the second individual particle beams, of the grid arrangement, of landing angles and/or of the contrast of the second individual particle beams upon incidence on the detection regions in the third field. Here, the controller is configured to generate a projection path control signal or a set of projection path control signals on the basis of the actual autofocus data during the wafer inspection at the respective working point in order to control the fast projection path correction mechanism. The set of projection path control signals is generated, in particular, if the projection path correction mechanism has a multi-part embodiment and the components thereof are controlled separately.

In particular, the high-frequency adaptations in the secondary path are desirable if the second individual particle beams, which emanate from the wafer surface, also pass through the fast autofocus correction lens. This is because the latter also has an influence on the trajectory of the second individual particle beams in this case. However, even if the second individual particle beams do not pass through the fast autofocus correction lens, a resetting of the focus and/or other parameters describing the particle optical imaging in the secondary path may be implemented or may become desirable in the secondary path. In the secondary path, it is normally desirable for the second individual particle beams to be incident on the detection regions in focused fashion and with predetermined landing angles, in particular in telecentric fashion, and with a predetermined grid arrangement (pitch of the incidence locations and orientation of the incidence locations in the third field). Therefore, a high-frequency adaptation of fast particle optical components is also desirable in the secondary path. The manner of the adaptation can be implemented here substantially analogously to the procedure in the primary path. Here, too, the particle optical components described above in conjunction with the primary beams, or else other components, can be used to undertake—optionally after an appropriate orthogonalization—fast/high-frequency corrections in the beam profile of the second individual particle beams. By way of example, a further fast autofocus correction lens can be arranged in the (pure) secondary beam path, i.e., between the beam switch and the detection unit. By way of example, this can be a fast electrostatic lens or a fast magnetic lens, in particular in the form of an air coil with only a few turns. By way of example, this second autofocus correction lens can be arranged in the region of a crossover plane in the secondary path. By way of example, such a crossover plane in the secondary path is arranged in the region of the projection lens system in the secondary path. However, a different arrangement of the second autofocus correction lens in the secondary path is also possible. By way of example, the fast telecentricity correction mechanism described in conjunction with the primary path can also be used in the secondary path; in the mechanism, for example, a deflector array is arranged in an intermediate image plane in the secondary path. It is also possible, as described for the primary path, to use a rotation correction mechanism which, for example in the form of a further deflector array, can be arranged directly upstream or downstream of the deflector array for correcting the telecentricity in the secondary path.

According to the embodiment described, the generation of the projection path control signals is based on the ascertained actual autofocus data for the first particle optical beam path. To this end, work can be carried out using empirical values/lookup tables, for example, which directly or indirectly assign to the actual autofocus data used corrections for the focus on the detector and/or for other parameters in the secondary path. The associated control signals/the set of control signals can be stored.

According to a further embodiment of the disclosure, the multiple particle beam system furthermore comprises a projection path measuring element for generating projection path measurement data for characterizing the particle optical imaging in the secondary path during the wafer inspection, wherein the multiple particle beam system furthermore has a fast projection path correction mechanism, which may have a multi-part embodiment and which is configured to undertake a high-frequency adaptation of the focus of the second individual particle beams, of the grid arrangement, of landing angles and/or of the contrast of the second individual particle beams upon incidence on the detection regions in the third field, and wherein the controller is configured to generate a projection path control signal or a set of projection path control signals on the basis of the projection path measurement data during the wafer inspection at the respective working point in order to control the fast projection path correction mechanism. Thus, the controller does not or not only use the actual autofocus data for the high-frequency/fast adaptation of the particle optical components in this embodiment variant of the disclosure; instead, the measurement data in the secondary path are used for the high-frequency adaptation. Fast measurement methods, which supply data for an adaptation "on-the-fly", are already known in general. Data for a high-frequency adaptation can be ascertained for example by way of evaluating images of a CCD camera, which are recorded in addition to the scanned images that are obtained via the detection regions in the third field. Via known measuring methods, it is possible, in particular, to determine the current relative focal position, the landing angle and/or the grid arrangement in the third field upon incidence on the detection regions.

There may be a particular desired property for the second particle optical beam path in respect of the topography contrast: It is possible to provide a contrast aperture stop within a crossover plane in the second particle optical beam path. A ring-shaped stop can be used to filter the interaction products in accordance with their starting angle upon emergence from the wafer. Then, only those second individual particle beams that have left the wafer surface within a certain angular range can pass through the contrast aperture stop. The topography contrast can be increased via such a contrast aperture stop since the interaction products (e.g., secondary electrons) predominantly emerge at a greater inclination angle relative to the incident particles at edges of the wafer surface. Further information in respect of contrast settings and in respect of aperture stops can be gathered from DE 10 2015 202 172 B4 and US 2019/0355544 A1, the disclosures of which are each incorporated in this application in full by reference. According to an embodiment of the disclosure, a contrast aperture stop is arranged in the second particle optical beam path in a crossover plane, wherein the projection path correction mechanism comprises a fast contrast correction mechanism with at least one electrostatic deflector, at least one electrostatic lens and/or at least one electrostatic stigmator for influencing the particle optical beam path through the contrast aperture stop, and wherein the controller is configured to control the contrast correction mechanism using a contrast correction control signal or a set of contrast correction control signals, in such a way that a contrast of the second individual particle beams is kept substantially constant upon incidence on the detection regions in the third field. What can be achieved via the electrostatic components of the fast contrast correction mechanism is a high-frequency adaptation and, in particular, a constancy of the contrast. Here, the contrast correction control signal can be determined for example on the basis of the projection path measurement data of the secondary path and/or on the basis of the actual autofocus data of the primary path.

All the aforementioned explanations apply not only to fast autofocusing but also to fast auto-stigmation. By definition, focusing also comprises a stigmation within the scope of this application. In general, a stigmation can be physically equated to focusing in only one direction or with different focusings in different directions. The number of particle optical parameters describing the particle optical imaging is increased or doubled if a stigmation is taken into account: By way of example, two parameters for the focus and two parameters for the position, two parameters for the landing angle and two parameters for the rotation are involved in each case. In this context, reference is also made to fast multi-pole lenses which are described, for example, in the German patent application with application number 10 2020 107 738.6, filed on Mar. 20, 2020, which has not yet been laid open; the disclosure of the patent application is incorporated in the present patent application in full by reference.

According to a second aspect of the disclosure, the latter relates to a multiple particle beam system for semiconductor inspection, comprising the following:
- a multi-beam particle generator, which is configured to generate a first field of a multiplicity of charged first individual particle beams;
- a first particle optical unit with a first particle optical beam path, which is configured to image the generated first individual particle beams onto a wafer surface in the object plane such that the first individual particle beams strike the wafer surface at incidence locations, which form a second field;
- a detection system with a multiplicity of detection regions that form a third field;
- a second particle optical unit with a second particle optical beam path, which is configured to image second individual particle beams, which emanate from the incidence locations in the second field, onto the third field of the detection regions of the detection system;
- a magnetic and/or electrostatic objective lens, in particular a magnetic and/or electrostatic immersion lens, through which both the first and the second individual particle beams pass;
- a beam switch, which is arranged in the first particle optical beam path between the multi-beam particle generator and the objective lens and which is arranged in the second particle optical beam path between the objective lens and the detection system;
- a sample stage for holding and/or positioning a wafer during the wafer inspection;
- an autofocus determining element, which is configured to generate data for determining actual autofocus data during the wafer inspection;
- a fast autofocus correction lens; and
- a controller;
- wherein the controller is configured for static or low-frequency adaptation of a focusing in order to control at least the magnetic objective lens and/or an actuator of the sample stage at a first working point with a first working distance, in such a way that the first individual particle beams are focused on the wafer surface situated at the first working distance.

Thus, in this embodiment of the disclosure the controller is configured to set the focusing for a given first working point which is assigned a first working distance. Thus, it is possible via the system to adjust the working point as described and then set the focusing.

According to an embodiment of the disclosure, the controller is furthermore configured for high-frequency adaptation of the focusing in order to generate an autofocus correction lens control signal on the basis of the actual autofocus data at the first working point during the wafer inspection in order to control the fast autofocus correction lens during the wafer inspection at the first working point.

Otherwise, everything that was defined and/or described in conjunction with the first aspect of the disclosure also applies to the second aspect of the disclosure.

According to a third aspect of the disclosure, the latter relates to a method for operating a multiple particle beam system, in particular a multiple particle beam system as described in conjunction with the first aspect of the disclosure. All terms and definitions explained or introduced in conjunction with the first aspect of the disclosure also apply to the method according to the disclosure. The method for operating a multiple particle beam system includes the following steps:
    generating measurement data at a first working point for a current focus on the wafer surface;
    determining actual autofocus data on the basis of the measurement data;
    determining an autofocus correction lens control signal on the basis of the actual autofocus data; and
    controlling a fast autofocus correction lens system with a first fast autofocus correction lens and keeping the focus on the wafer surface constant in high-frequency fashion, wherein the landing angle, the rotation and/or the position of the first individual particle beams upon incidence on the wafer surface are likewise kept constant at the first working point.

According to an embodiment of the disclosure, the fast autofocus correction lens comprises at least one electrostatic lens and/or consists of exactly one electrostatic lens. What was already stated in conjunction with the multiple particle beam system according to the disclosure applies in respect of the options for configuring the electrostatic lens and the placements thereof in the beam path.

According to an embodiment of the disclosure, the fast autofocus correction lens comprises at least one fast magnetic lens, in particular an air coil, and/or consists of exactly one magnetic lens. What was already stated in conjunction with the multiple particle beam system according to the disclosure applies in respect of the options for configuring the magnetic lens and the placements thereof in the beam path.

To keep the grid arrangement on the wafer surface and the landing angle constant, it is possible—as described above in conjunction with the first aspect of the disclosure—to use a fast telecentricity correction mechanism and/or a fast rotation correction mechanism and/or a fast position correction mechanism. The fast telecentricity correction mechanism, the fast rotation correction mechanism and/or the fast position correction mechanism then forms/form the autofocus correction lens system together with the autofocus correction lens with optionally a multi-part embodiment.

According to an embodiment of the disclosure, the method furthermore includes the following steps:
    generating a telecentricity correction control signal on the basis of the actual autofocus data; and
    controlling the fast telecentricity correction mechanism.

According to an embodiment of the disclosure, the method furthermore includes the following steps:
    generating a rotation correction control signal on the basis of the actual autofocus data; and
    controlling the fast rotation correction mechanism.

According to an embodiment of the disclosure, the method furthermore includes the following steps:
    generating a second fast autofocus correction lens control signal on the basis of the actual autofocus data and controlling the second fast autofocus correction lens in high-frequency fashion; and/or
    generating a third fast autofocus correction lens control signal on the basis of the actual autofocus data and controlling the third fast autofocus correction lens in high-frequency fashion; and/or
    generating a fourth fast autofocus correction lens control signal on the basis of the actual autofocus data and controlling the fourth fast autofocus correction lens in high-frequency fashion; and/or
    generating a fifth fast autofocus correction lens control signal on the basis of the actual autofocus data and controlling the fifth fast autofocus correction lens in high-frequency fashion; and/or generating a sixth fast autofocus correction lens control signal on the basis of the actual autofocus data and controlling the sixth fast autofocus correction lens in high-frequency fashion.

The second, third, fourth, fifth and/or sixth fast autofocus correction lens is/are the fast autofocus correction lenses already described in conjunction with the first aspect of the disclosure. What was explained in this context also applies without restrictions to the method described in accordance with the third aspect of the disclosure.

According to an embodiment of the disclosure, the method furthermore includes the following steps:
    changing a working point, in particular changing the working distance, and generating hysteresis correction measurement data for characterizing the particle optical imaging in the object plane; and
    correcting the autofocus correction lens control signal or the autofocus correction lens control signals in high-frequency fashion on the basis of the hysteresis correction measurement data.

Depending on what measurement data are available as hysteresis correction measurement data, further feedback loops can be integrated into the workflow for the purposes of controlling further autofocus correction lenses. By way of example, it is possible to generate actual data regarding the magnification and/or regarding the rotation of the individual particle beams in the object plane using a CCD camera arranged in the second particle optical beam path. These data can then be used as actual data for correcting those autofocus correction lenses which correct the corresponding beam parameters in high-frequency fashion. It is not necessary (albeit possible) to also use this additional information for correcting the first autofocus correction lens control signal which is primarily used to correct the focus. Otherwise, what was already stated in conjunction with the first aspect also applies to this embodiment of the disclosure. Further details in relation to the generation of measurement data in the second particle optical beam path can be gathered from US 2019/0355544 A1, the disclosure of which is incorporated in this patent application in full by reference.

According to an embodiment of the disclosure, the method furthermore includes the following steps:

generating aberration correction control signals and correcting beam positions in highly precise fashion via the aberration correction control signals. Such a highly precise correction can be implemented upstream of each fast autofocus correction lens, in particular. The correction serves to keep the position of the individual particle beams constant to high precision when passing through the column. This also includes keeping the path of the individual particle beams constant when passing through the various lens elements. However, a highly precise correction is expedient upstream of the autofocus correction lenses, in particular. In this way, it is also possible to keep a position of the crossover exactly constant so that, during the scanning procedure, a pixel size in the image field does not practically change (accuracy in the range of 0.01-0.1 per thousand). Otherwise, what was already stated in conjunction with the first aspect of the disclosure also applies in this respect.

According to an embodiment of the disclosure, the method furthermore includes the following steps:

generating scanning unit control signals and correcting the scanning unit control signals in high-frequency fashion at the respective working point, in particular via using multidimensional lookup tables. These method steps take account of the fact that, following an adaptation of the autofocus and a corresponding aberration correction optionally undertaken, the scanning parameters of the scanning unit nevertheless can be adapted. Otherwise, everything that was already stated in conjunction with the first aspect of the disclosure also applies in this respect.

According to an embodiment of the disclosure, the method furthermore includes the following steps:

correcting image data in purely computational fashion in respect of at least one beam parameter, in particular correcting image data in purely computational fashion in respect of an image displacement. Moreover, it is possible in particular to confront a rotation of the beam parameters by way of a counter rotation of the scanning unit and to compensate a change in the magnification in the object plane by changing the pixel size setting on the scanning unit.

Accordingly, the disclosure according to a further aspect (fourth aspect) relates to a method for operating a multiple particle beam system for fast autofocus correction at a working point, the method including the following steps:

physically setting the focus in the object plane via at least one fast autofocus correction lens;
physically setting the landing angle in the object plane via at least one fast autofocus correction mechanism;
setting the image field rotation via the scanning unit by quickly setting a counter rotation; setting the magnification via the scanning unit by quickly setting a pixel size; and compensating an image field displacement in purely computational fashion.

Here, this can be a multiple particle beam system as has been described above in a plurality of embodiment variants. The fast autofocus correction mechanism for physically setting the landing angle can be (at least) one fast autofocus correction lens with corresponding properties; however, other embodiment variants are also possible.

According to an embodiment of the disclosure, the method furthermore includes the following steps:

quickly setting the scanning parameter of quadradicity of the scanning unit and/or quickly setting the scanning parameter of skew of the scanning unit.

In this case, this step/these steps is/are optionally carried out before the purely computational compensation of the image displacement.

According to an embodiment of the disclosure, the method furthermore includes the following steps:

orthogonalizing effects of the particle optical components which are used for the correction or corrections of beam parameters.

According to an embodiment of the disclosure, the method furthermore includes the following steps:

generating projection path measurement data for characterizing the particle optical imaging in the secondary path;
determining a projection path control signal or a set of projection path control signals on the basis of the projection path measurement data; and
controlling a fast projection path correction mechanism, which may have a multi-part embodiment, via the projection path control signal or via the set of projection path control signals, wherein the focus, the grid arrangement and the landing angle of the second individual particle beams upon incidence in a detection plane are kept constant at the first working point.

Thus, when the focus is kept constant, the relative focal position is updated while the grid arrangement and the landing angle are kept constant.

According to an embodiment of the disclosure, the method furthermore includes the following step:

controlling a fast contrast correction mechanism via a contrast correction control signal or a set of contrast correction control signals and keeping the contrast constant in the detection plane.

By controlling the fast contrast correction mechanism, it is also possible to influence the relative position of the crossover in the secondary path in a targeted fashion, in particular to keep the latter constant.

According to a further aspect of the disclosure, the latter relates to a computer program product having a program code for carrying out the method as described above in conjunction with the third and fourth aspect of the disclosure.

The above-described embodiments of the disclosure in accordance with the above-described aspects of the disclosure can be combined with one another in full or in part, provided that no technical contradictions arise as a result.

BRIEF DESCRIPTION OF THE DRAWINGS

The disclosure will be understood even better with reference to the accompanying figures. In the figures.

DETAILED DESCRIPTION

Below, the same reference signs denote the same features, even if these are not explicitly mentioned in the text.

Figure 1:
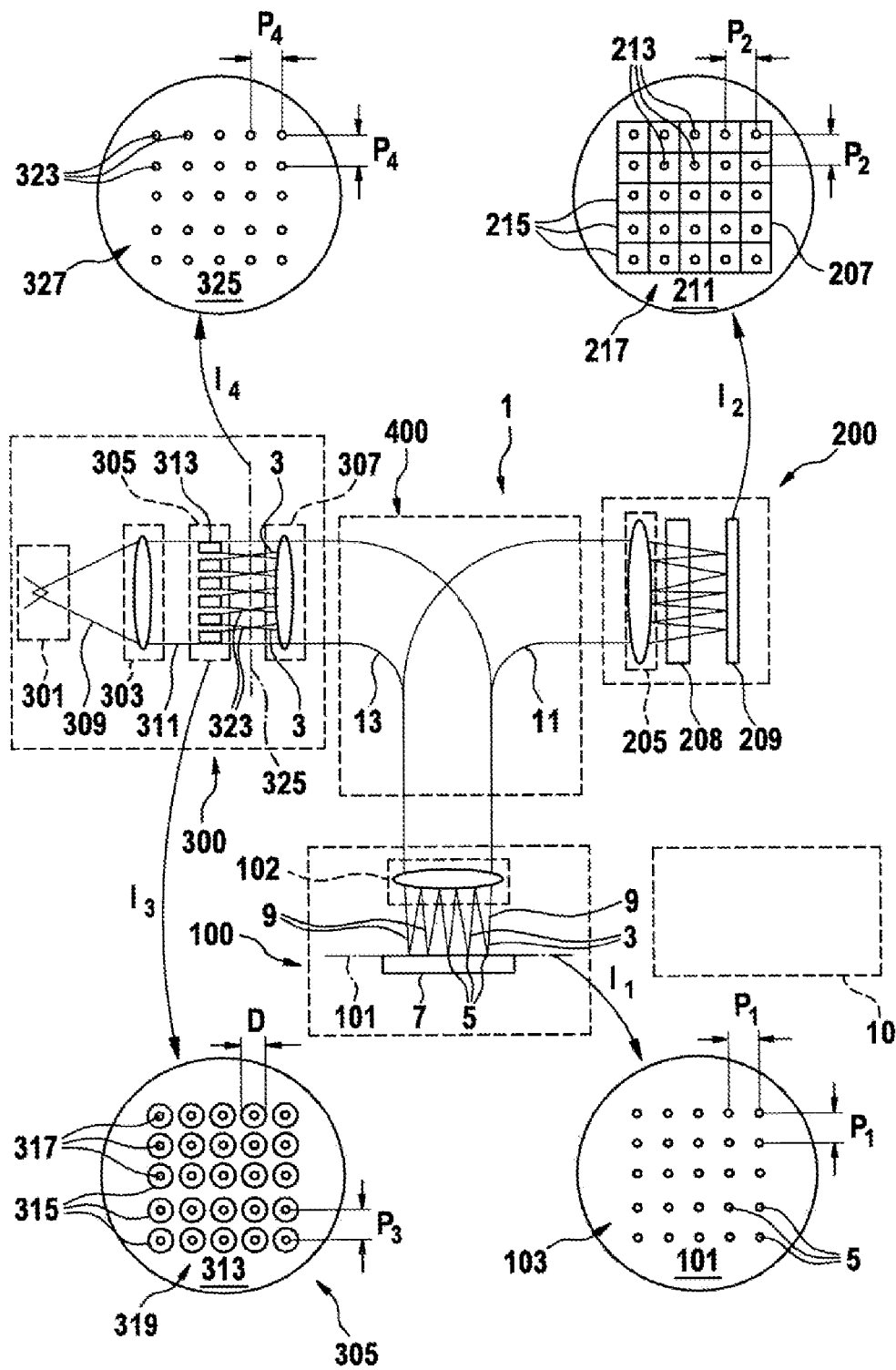
FIG. 1: shows a multi-beam particle microscope in a schematic illustration.

FIG. 1 is a schematic illustration of a particle beam system 1 in the form of a multi-beam particle system 1, which uses a multiplicity of particle beams. The particle beam system 1 generates a multiplicity of particle beams 3 which strike an object to be examined in order to generate there interaction products, e.g., secondary electrons, which emanate from the object and are subsequently detected. The particle beam system 1 is of the scanning electron microscope (SEM) type, which uses a plurality of primary particle beams 3 which are incident on a surface of the object 7 at a plurality of locations 5 and generate there a plurality of electron beam spots, or spots, that are spatially separated from one another. The object 7 to be examined can be of any desired type, e.g., a semiconductor wafer, in particular a semiconductor wafer with HV structures (i.e., with horizontal and/or vertical structures), or a biological sample, and can comprise an arrangement of miniaturized elements or the like. The surface of the object 7 is arranged in a first plane 101 (object plane) of an objective lens 102 of an objective lens system 100.

The enlarged excerpt $I_1$ in FIG. 1 shows a plan view of the object plane 101 having a regular rectangular field 103 of incidence locations 5 formed in the first plane 101. In FIG. 1, the number of incidence locations is 25, which form a 5×5 field 103. The number 25 of incidence locations is a number chosen for reasons of simplified illustration. In practice, the number of beams, and hence the number of incidence locations, can be chosen to be significantly greater, such as, for example, 20×30, 100×100 and the like.

In the embodiment illustrated, the field 103 of incidence locations 5 is a substantially regular rectangular field having a constant pitch $P_1$ between adjacent incidence locations. Exemplary values of the pitch $P_1$ are 1 micrometer, 10 micrometers and 40 micrometers. However, it is also possible for the field 103 to have other symmetries, such as a hexagonal symmetry, for example.

A diameter of the beam spots shaped in the first plane 101 can be small. Exemplary values of the diameter are 1 nanometer, 5 nanometers, 10 nanometers, 100 nanometers and 200 nanometers. The focusing of the particle beams 3 for shaping the beam spots 5 is carried out by the objective lens system 100. In this case, the objective lens system can comprise a magnetic immersion lens, for example.

The primary particles striking the object generate interaction products, e.g., secondary electrons, back-scattered electrons or primary particles that have experienced a reversal of movement for other reasons, which emanate from the surface of the object 7 or from the first plane 101. The interaction products emanating from the surface of the object 7 are shaped by the objective lens 102 to form secondary particle beams 9. The particle beam system 1 provides a particle beam path 11 for guiding the multiplicity of secondary particle beams 9 to a detector system 200. The detector system 200 comprises a particle optical unit with a projection lens 205 for directing the secondary particle beams 9 at a particle multi-detector 209.

The excerpt $I_2$ in FIG. 1 shows a plan view of the plane 211, in which individual detection regions of the particle multi-detector 209 on which the secondary particle beams 9 are incident at locations 213 are located. The incidence locations 213 lie in a field 217 with a regular pitch $P_2$ with respect to one another. Exemplary values of the pitch $P_2$ are 10 micrometers, 100 micrometers and 200 micrometers.

The primary particle beams 3 are generated in a beam generation apparatus 300 comprising at least one particle source 301 (e.g., an electron source), at least one collimation lens 303, a multi-aperture arrangement 305 and a field lens 307, or a field lens system made of a plurality of field lenses. The particle source 301 generates at least one diverging particle beam 309, which is collimated or at least substantially collimated by the at least one collimation lens 303 in order to shape a beam 311 which illuminates the multi-aperture arrangement 305.

The excerpt $I_3$ in FIG. 1 shows a plan view of the multi-aperture arrangement 305. The multi-aperture arrangement 305 comprises a multi-aperture plate 313, which has a plurality of openings or apertures 315 formed therein. Midpoints 317 of the openings 315 are arranged in a field 319 that is imaged onto the field 103 formed by the beam spots 5 in the object plane 101. A pitch $P_3$ between the midpoints 317 of the apertures 315 can have exemplary values of 5 micrometers, 100 micrometers and 200 micrometers. The diameters D of the apertures 315 are smaller than the pitch $P_3$ between the midpoints of the apertures. Exemplary values of the diameters D are $0.2 \times P_3$, $0.4 \times P_3$ and $0.8 \times P_3$.

Particles of the illuminating particle beam 311 pass through the apertures 315 and form particle beams 3. Particles of the illuminating beam 311 which strike the plate 313 are absorbed by the latter and do not contribute to the formation of the particle beams 3.

On account of an applied electrostatic field, the multi-aperture arrangement 305 focuses each of the particle beams 3 in such a way that beam foci 323 are formed in a plane 325. Alternatively, the beam foci 323 can be virtual. A diameter of the beam foci 323 can be, for example, 10 nanometers, 100 nanometers and 1 micrometer.

The field lens 307 and the objective lens 102 provide a first imaging particle optical unit for imaging the plane 325, in which the beam foci 323 are formed, onto the first plane 101 such that a field 103 of incidence locations 5 or beam spots arises there. Should a surface of the object 7 be arranged in the first plane, the beam spots are correspondingly formed on the object surface.

The objective lens 102 and the projection lens arrangement 205 provide a second imaging particle optical unit for imaging the first plane 101 onto the detection plane 211. The objective lens 102 is thus a lens that is part of both the first and the second particle optical unit, while the field lens 307 belongs only to the first particle optical unit and the projection lens 205 belongs only to the second particle optical unit.

A beam switch 400 is arranged in the beam path of the first particle optical unit between the multi-aperture arrangement 305 and the objective lens system 100. The beam switch 400 is also part of the second optical unit in the beam path between the objective lens system 100 and the detector system 200.

Further information relating to such multi-beam particle beam systems and components used therein, such as, for instance, particle sources, multi-aperture plate and lenses, can be obtained from the international patent applications WO 2005/024881, WO 2007/028595, WO 2007/028596, WO 2011/124352 and WO 2007/060017 and the German patent applications having the publication numbers DE 10 2013 016 113 A1 and DE 10 2013 014 976 A1, the disclosure of which in the full scope thereof is incorporated by reference in the present application.

The multiple particle beam system furthermore comprises a computer system 10 configured both for controlling the individual particle optical components of the multiple particle beam system and for evaluating and analyzing the signals obtained by the multi-detector 209. In this case, the computer system 10 can be constructed from a plurality of individual computers or components. It can also control the fast autofocus correction lens according to the disclosure and the telecentricity correction mechanism and/or the fast rotation correction mechanism and/or further fast correction mechanism (none of which are illustrated in FIG. 1).

Figure 2:
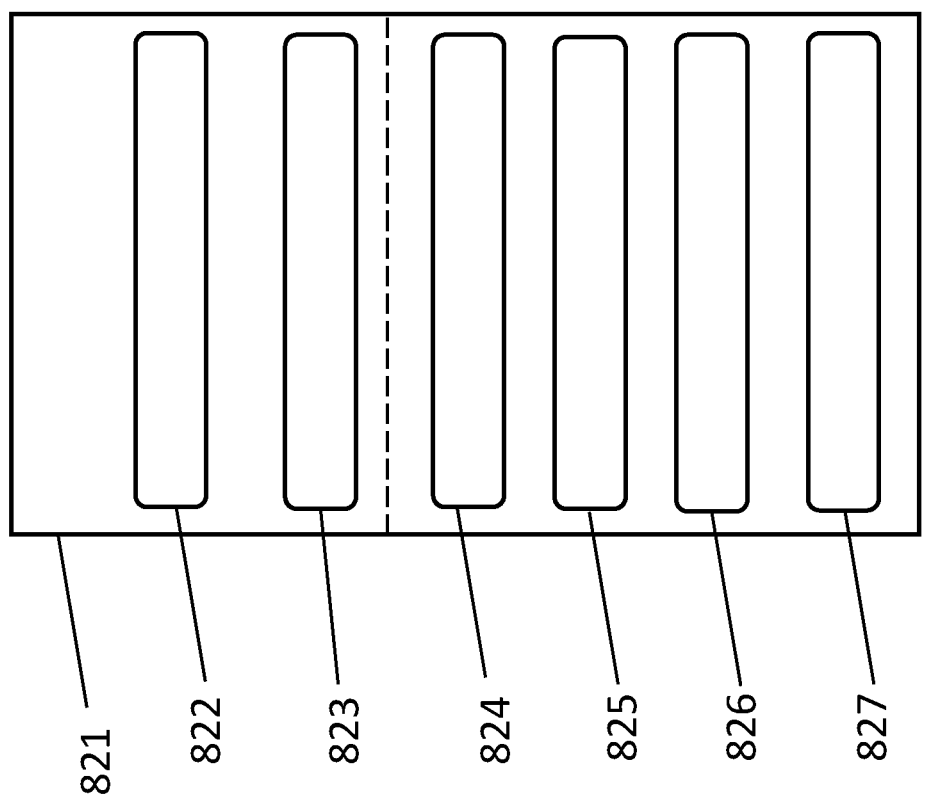
FIG. 2: shows a schematic illustration of an excerpt of a controller of the multi-beam particle microscope with a fast autofocus correction lens.

FIG. 2 shows a schematic illustration of an excerpt of a controller of the computer system 10 of the multi-beam particle microscope 1 with a fast autofocus correction lens 824. Specifically, the excerpt shows the controller 821 for the fast autofocus. The controller 821 for the fast autofocus is set up to carry out high-frequency adaptations of the focusing at a working point during the wafer inspection. This means that adaptations of the focusing can be carried out very quickly, for example within a few microseconds. In addition to the overarching control system 821 (a part of the computer system 10 in this case), the following further components are provided for these fast adaptations: a measuring element 822, an autofocus algorithm 823 for processing the measurement data, and at least one final controlling element which is set in accordance with the processing of the measurement data. In the specific example, a final controlling element is provided by the autofocus correction lens 824. Additional fast final controlling elements, specifically a telecentricity correction mechanism 825, a fast rotation correction mechanism 826 and a fast position correction mechanism 827 in this case, are likewise provided in this example. In this case, these additional final controlling elements can be formed by further fast autofocus correction lenses; however, they can also be configured differently to fast lenses. The measuring element 822 is configured to generate measurement data for determining actual autofocus data during the wafer inspection. In this case, the actual autofocus data describe the current position of the focus with respect to the wafer surface directly or indirectly. Instead of the autofocus measuring element 822, provision can also be made more generally of an autofocus determining element which generates data for determining actual autofocus data, for example on the basis of a model of a wafer. In general, autofocus measuring elements are known. Examples in this respect are the use of astigmatic auxiliary beams for setting the focus and height measurements at a sample surface (e.g., via a z-sensor). What is important is that the measuring member 822 or measuring members 822 also allow the determination of continuous, i.e., ongoing "on-the-fly" settings of the focus for each image field obtained in each case via the multiplicity of individual particle beams. Now—depending on the measuring element 822 and manner of evaluation—the autofocus algorithm 823 is set up to generate actual autofocus data from the measurement data and to generate an autofocus correction lens control signal on the basis of the actual autofocus data in order to control the fast autofocus correction lens 824 in high-frequency fashion during the wafer inspection at a working point. As a result, the relative focal position is adapted. As already explained multiple times, the effects of particle optical components of a multiple particle beam system are normally not orthogonal to one another. This means that a variation of an effect at only one particle optical component normally does not allow only a single parameter characterizing the particle optical imaging to be altered. Instead, the system is more complex and changing a parameter of the particle optical imaging normally involves a variation of effects at a plurality of particle optical components. In the specific case, this means that a readjustment/fine setting of the relative focal position is accompanied by the change in further particle optical parameters. By way of example, these are the magnification (coupled to the beam pitch of the individual particle beams), the telecentricity and the rotation of the individual particle beams upon incidence on the sample or the wafer 7. However, a change in these additional parameters is undesired, and so these are also corrected and/or kept constant within the scope of the fast autofocus. Thus, provision is made in exemplary fashion of a telecentricity correction mechanism 825, a rotation correction mechanism 826 and a position correction mechanism 827. The fast telecentricity correction mechanism is configured to substantially contribute to correcting a tangential or radial telecentricity error of the first individual particle beams 3 in the second field 103, and the fast autofocus controller 821 is set up to generate a telecentricity correction mechanism control signal for high-frequency adaptations at the respective working point during the wafer inspection on the basis of the actual autofocus data in order to control the fast telecentricity correction mechanism during the wafer inspection. By way of example, a first deflector array arranged in an intermediate image plane, for example in the intermediate image plane 325, of the first particle optical beam path can be used as telecentricity correction mechanism. However, other embodiment variants are also possible.

To correct the rotation, specifically the unwanted rotation of the grid arrangement in the second field 101, provision is furthermore made of a fast rotation correction mechanism 826, which is configured to substantially contribute to correcting a rotation of the first individual particle beams 3 in the second field 101. Here, the fast autofocus controller 821 is configured to generate a rotation correction mechanism control signal for high-frequency adaptations on the basis of the actual autofocus data during the wafer inspection at the respective working point in order to control the fast rotation correction mechanism 826 during the wafer inspection. By way of example, such a rotation correction mechanism 826 can be realized as a second deflector array, which is arranged, at a distance, directly upstream or downstream of the first deflector array for the telecentricity correction. However, other embodiments are also possible, for example via a multi-lens array which is arranged, at a distance, directly upstream or downstream of the first deflector array and in such a way that the first individual particle beams 3 pass through the multi-lens array in off-axis fashion. Alternatively, the multi-beam particle generator 305 can comprise the fast rotation correction mechanism 826 and the rotation correction mechanism 826 can be actively rotated by the rotation correction mechanism control signal. It is also possible to combine two magnetic field generating devices to one another for weak magnetic fields directed against one another and to use each of the magnetic fields only for a change of the rotation in a certain direction.

Figure 3:
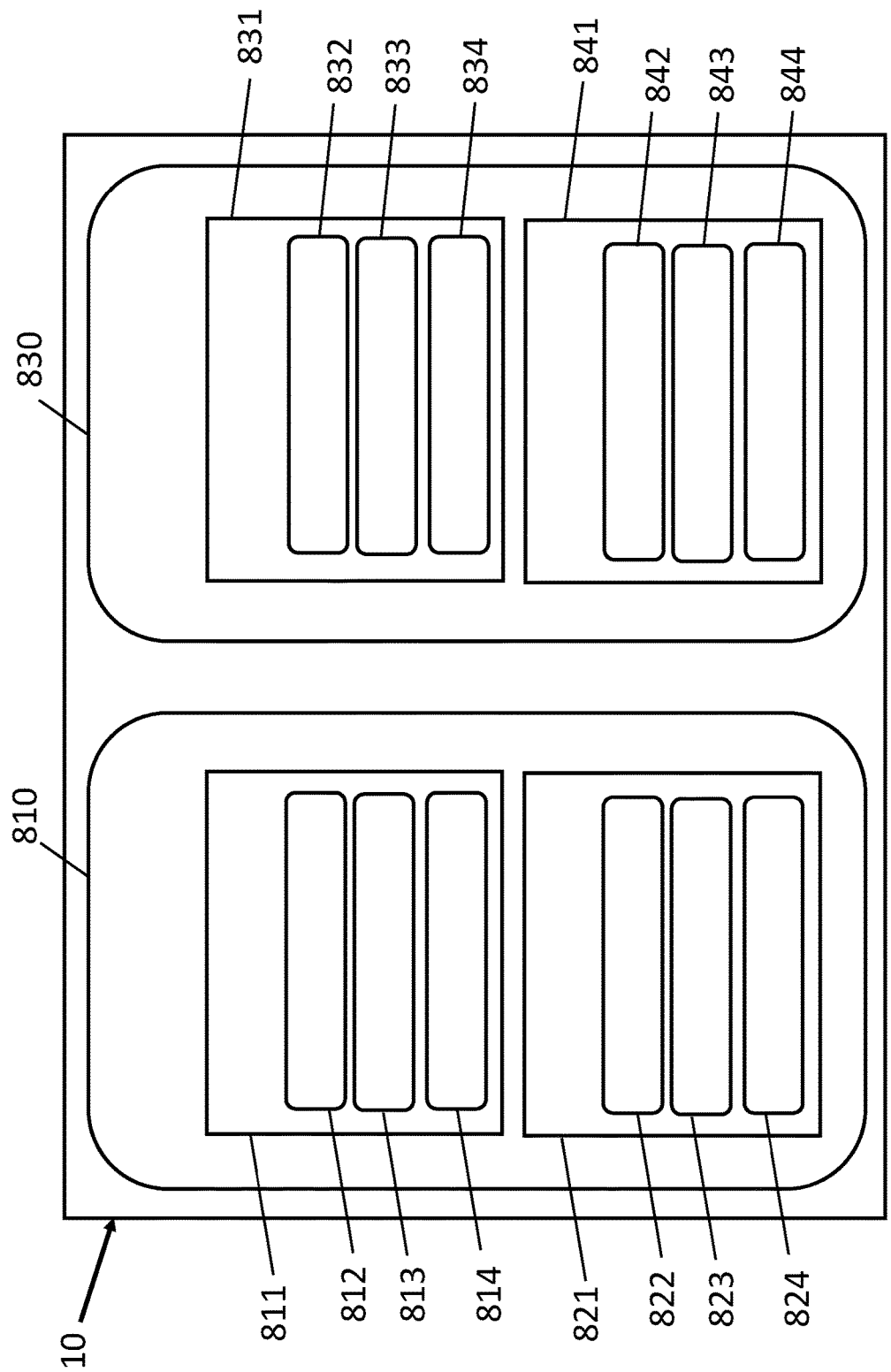
FIG. 3: shows a schematic illustration of a larger excerpt of a controller of the multi-beam particle microscope with a fast autofocus correction lens.

FIG. 3 shows a schematic illustration of a larger excerpt of a controller of the computer system 10 of the multi-beam particle microscope 1 with a fast autofocus correction lens 824. Control units 810 for the primary path and 830 for the secondary path are illustrated in exemplary fashion. In this case, the controller of the computer system 10 can have further constituent parts to the ones shown in FIG. 3. In view of the present disclosure, a few important control elements should be discussed below. The controller 810 in the primary path comprises a controller 811 for setting the working point and the controller 821 for setting the fast autofocus. In this case, in particular, the controller 811 is configured for static or low-frequency adaptation of a focusing in order to control at least the magnetic objective lens and/or an actuator of the sample stage at a first working point with a first working distance, in such a way that the first individual particle beams are focused on the wafer surface situated at the first working distance. In addition to the focus, other parameters of the particle optical imaging are also set, for example the individual beam spacing (pitch), the magnification connected therewith, a rotation of the grid arrangement of the individual particle beams upon incidence on the wafer surface and the desired landing angle upon incidence on the wafer surface. Thus, the working point setting 811 comprises a slow autofocus and additional correction functions. For the setting itself, provision is made of a measuring element 812, an adjustment algorithm 813 and various final controlling elements 814. These final controlling elements 814 include, in particular, the magnetic and/or electrostatic objective lens 102 and, in the case of a height-adjustable sample stage, optionally an actuator of the sample stage as well. The final controlling elements 814 for setting the working point moreover comprise for example a field lens system 307 and the multi-beam particle generator 305. Further particle optical elements in the first particle optical beam path can act as further final controlling elements 814; they can be magnetic and/or electrostatic lenses. A comparatively long stroke for changing the working distance can be generated by the mechanism for setting the working point; by way of example, the stroke can be +/−300, 200, 100 µm. An adaptation time to a selected working distance is comparatively long in this case; by way of example, it can lie in the range of several ten to several hundred milliseconds.

The controller 821 for fast autofocusing comprises the measuring element 822 (or, more generally, the autofocus determining element), an autofocus algorithm 823 and at least the autofocus correction lens 824; however, other correction mechanism may also be provided, for example the above-described telecentricity correction mechanism 825, the rotation correction mechanism 826 and/or the position correction mechanism 827. A high-frequency adaptation of the focus is possible via the controller 821 for the fast autofocus, typical adaptation times lie in the region of a few microseconds; by way of example, an adaptation time is TA≤500 µs, optionally TA≤100 µs and/or TA≤50 µs. The stroke for changing the relative focal position is typically several micrometers, for example +/−20 µm, +/−15 µm and/or +/−10 µm. In this case, for example, an adaptation time TA for the high-frequency adaptation is shorter than the adaptation time TA for the low-frequency or static adaptation via the controller for setting the working point 811 at least by a factor of 10, optionally at least by a factor of 100 and/or 1000.

A change in the relative focal position or the position of the wafer surface may also entail a resetting or readjustment of particle optical components in the secondary path. Accordingly, the controller 830 for controlling the secondary path is part of the controller of the computer system 10. The control elements in the secondary path can also be subdivided into low-frequency or static control elements 831 and high-frequency control elements 841 (corresponding to a second fast autofocus, for example). The slow working point setting is controlled by the controller 831; a measuring element 832, for example a CCD camera, a second adjustment algorithm 833 and a final controlling element 834 or a plurality of final controlling elements 834 are provided to this end. By way of example, these final controlling elements 834 include magnetic projection lenses 205, which are controlled in such a way that the foci of the second individual particle beams 9 are imaged exactly on the surface of the detection regions of the detection unit 209. However, other final controlling elements can also be controlled via the controller 831 for setting the working point. The controller 841 controls the fast second autofocus in the secondary path: In this case, refocusing is carried out in the secondary path during the wafer inspection. Also, it is possible that further particle optical parameters such as position, telecentricity and rotation are likewise quickly readjusted. To this end, the controller 841 comprises a measuring element 842, a second autofocus algorithm 843 and fast projection path correction mechanism 844, in particular electrostatic lenses, electrostatic deflectors, and/or electrostatic stigmators, in this embodiment. By way of example, a fast CCD camera is considered as measuring element 842, or else, e.g., a mechanism for measuring current around a contrast stop arranged in a crossover plane in the secondary path. However, it is also possible to dispense with the measuring element 842 in the secondary path and instead work with a feedforward loop. Then, control signals for the fast projection path correction mechanism 844 are determined via the second autofocus algorithm 843 on the basis of values/settings that were determined for the primary path, and the projection path correction mechanism 844 are controlled accordingly. In this case, the autofocus algorithm 843 can comprise lookup tables. It is also possible to combine the two described variants with one another, i.e., additionally use a measuring element 842 and, for example, explicitly redetermine the settings of the final controlling elements/projection path correction mechanism 844 for the secondary path only in the case of certain measured deviations from a reference value.

The controller of the computer system 10 with control elements 810 for controlling the primary path and 830 for controlling the secondary path now is set up, furthermore, in such a way that the controllers 810 and 830 are matched to one another in time, i.e., synchronized, with their respective constituent parts. The electronics used for the control are likewise very fast but it is desirable to ensure that, for example for each image field (mFOV), settings of the particle optical components in the primary path and also in the secondary path that are as optimal as possible are guaranteed. Details in respect of realizing a fast control of particle optical components/in respect of fast electronics are known to a person skilled in the art and are also disclosed, for example, in the German patent application 102020209833.6, filed on Aug. 5, 2020, the disclosure of which is incorporated in this patent application in full by reference.

Figure 4:
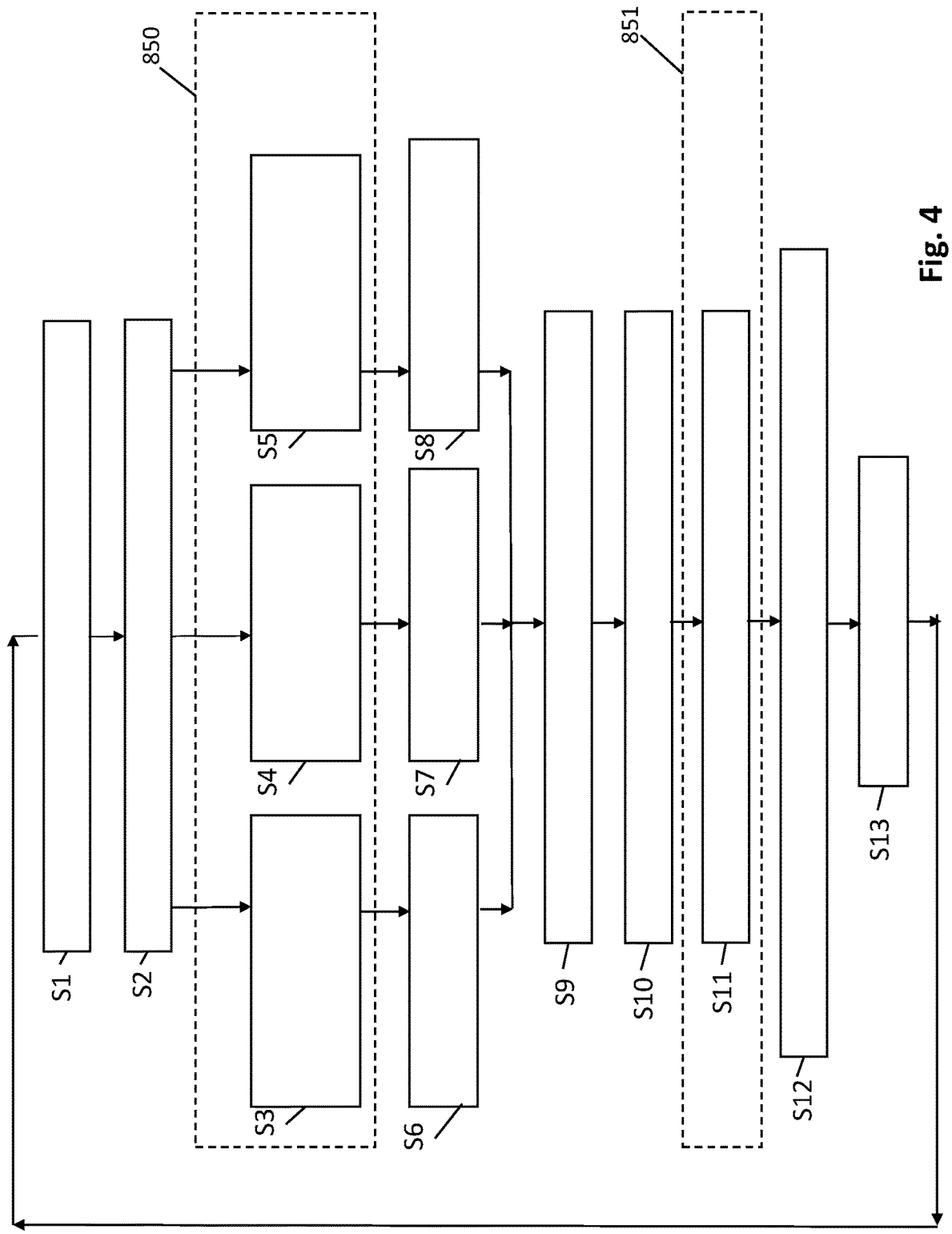
FIG. 4: schematically shows a method for setting a fast autofocus via an autofocus correction lens.

FIG. 4 schematically shows a method for setting a fast autofocus via an autofocus correction lens 824. It is assumed that a (slow) adjustment of the system at a first working point with an associated first working distance has already been implemented via adjusting the magnetic objective lens and/or via controlling an actuator for a sample stage; in the process, other parameters have also already been set in accordance with specifications for the working point (magnification, telecentricity, rotation).

In a method step S1, measurement data are generated for a current focus at the selected working point AP. A working point is defined at least by the working distance between the objective lens and the wafer surface; however, further parameters can also be used to define the working point. Examples thereof include the relative focal position, the position and the telecentricity or the landing angle of individual particle beams 3 on the wafer surface and the rotation of a grid arrangement of individual particle beams 3 upon incidence on the wafer surface. An example is intended to be used below but should not be construed as restrictive for the disclosure. In a method step S2, actual autofocus data are determined on the basis of measurement data. These measurement data can be obtained using the above-described measuring elements 812 and the actual autofocus data can be determined therefrom via the adjustment algorithm 813. Thus, for example, the actual autofocus data specify whether over-focusing or under-focusing is present, or what the magnitude of the same is. However, it is also possible for the measurement data to form the actual autofocus data directly (identity map). After the actual autofocus data have been determined, control signals are generated in steps S3, S4 and S5 on the basis of the actual autofocus data: In step S3, an autofocus correction lens control signal is generated on the basis of the actual autofocus data. In step S4, a telecentricity correction mechanism control signal is generated on the basis of actual autofocus data. In step S5, a rotation correction mechanism control signal is generated on the basis of the actual autofocus data. In this case, adjusting the autofocus correction lens does not only alter the relative focal position but normally also alters the magnification (position, not illustrated), the telecentricity and/or the rotation of a grid arrangement of the individual particle beams. Within the scope of determining the control signals, an orthogonalization matrix or inverted sensitivity matrix 850 is used in the example shown; from this, it is possible to derive which particle optical components have to be excited differently by what absolute value in order to exactly set a particle optical parameter differently. As a result, there is optionally simultaneous control of the autofocus correction lens in step S6, control of the telecentricity correction mechanism in step S7 and control of the rotation correction mechanism in step S8, and optional control of further fast correction mechanism.

Once these adjustments have been implemented for the primary path, the secondary path is updated in high-frequency fashion: This is feedforward in the example shown, while feedback is implemented in the primary path: Second measurement data for the current second relative autofocus position (detection plane) in the secondary path are generated in a method step S9. In addition or as an alternative thereto, it is possible to determine the current relative position of the crossover of the second individual particle beams in the secondary path. Second actual autofocus data for the secondary path are ascertained in method step S10. In addition or as an alternative thereto, values can also be used for the secondary path which were already assigned to the actual autofocus data of the primary path in advance. Projection path correction mechanism control signals are then determined on the basis of the second actual autofocus data in method step S11. Here, this may be a set of control signals. Optionally, a second orthogonalization matrix or second inverted sensitivity matrix 851 for the secondary path is used for the generation of the control signals. Then, fast projection path correction mechanism are controlled in a method step S12 using the control signals. This optionally includes a fast second autofocus correction lens. Moreover, it is possible to control a fast telecentricity correction mechanism (e.g., in the form of a deflector array in an intermediate image plane in the secondary path) and/or a fast rotation correction mechanism (e.g., in the form of a second deflector array directly upstream or downstream of the deflector array for fast telecentricity correction in the secondary path) and/or further fast correction mechanism, for example electrostatic lenses, electrostatic deflectors and/or electrostatic stigmators. It is also possible to control a fast contrast correction mechanism. By way of example, a fast contrast correction mechanism can be integrated in the projection lens system of the secondary path, for example as described in US 2019/0355544 A1, the disclosure of which is incorporated in this application in full by reference. Then, an image field is recorded in method step S13 using the settings of step S12. Then, measurement data for the current focus at the working point can be generated anew (method step S1). A corresponding procedure is carried out until the entire image recording process has been completed.

In one example, the first or second orthogonalization or inverted sensitivity matrix 850, 851 may depend on the working point setting according to the adjustment using the controllers 811 and 831. By way of example, a dynamic correction for a tangential or radial telecentricity error parallel to a fine correction of a focus plane may depend on a few μm of the working point or the coarse focus setting within the long-range focal range of several 100 μm. In this case, the orthogonalization or inverted sensitivity matrices 850, 851 for a selected working point are chosen from a memory in which a plurality of orthogonalization or inverted sensitivity matrices 850, 851 are stored for different focus setting within the long-range focal range.

Figure 5:
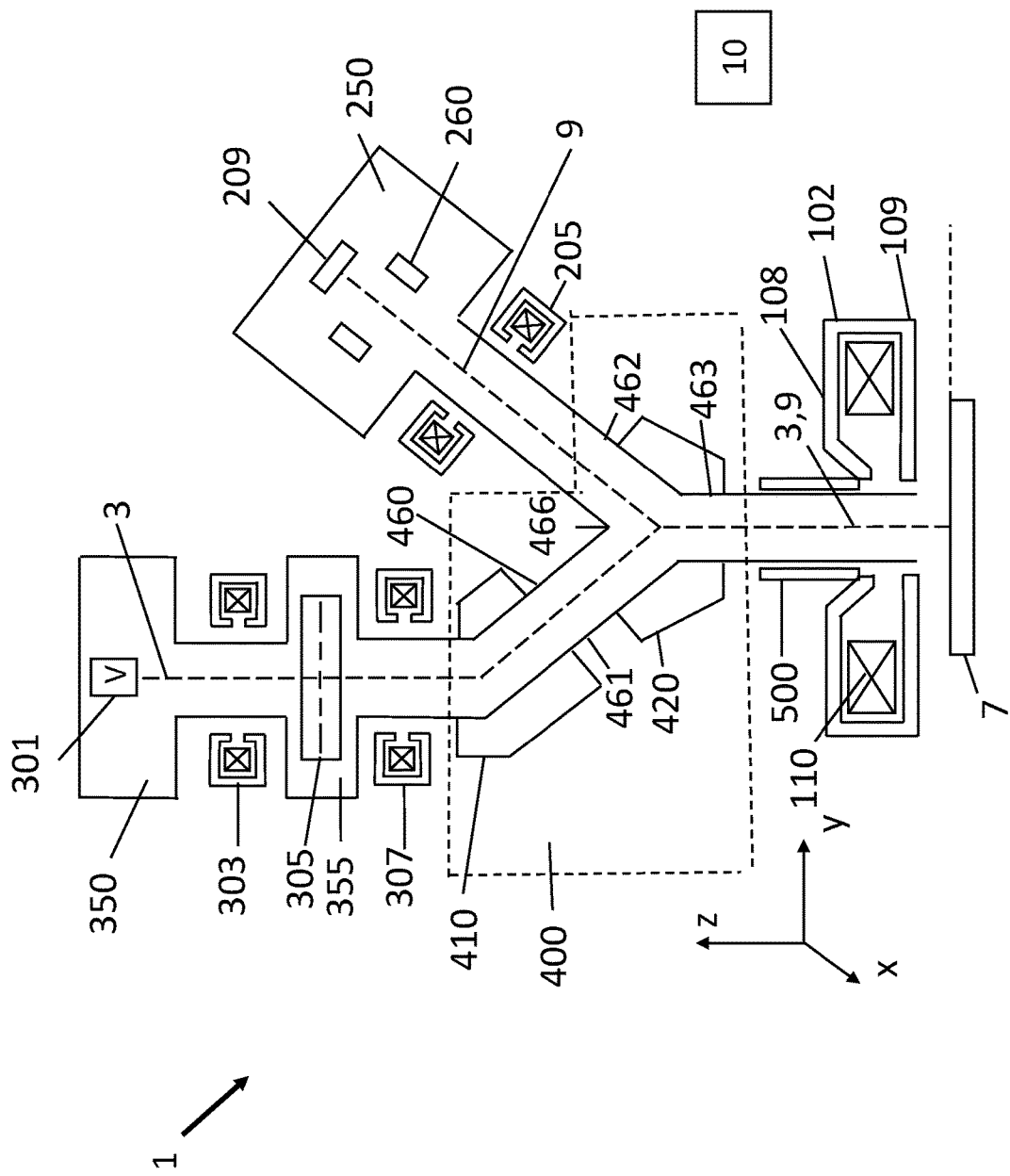
FIG. 5: schematically shows a section through a multi-beam particle microscope in which the autofocus correction lens according to the disclosure can be arranged.

FIG. 5 schematically shows a section through a multi-beam particle microscope 1 in which the autofocus correction lens 824 according to the disclosure can be arranged. The multiple particle beam system 1 initially comprises a particle source 301. In the shown example, this particle source 301 emits an individual particle beam with charged particles, e.g., electrons. In FIG. 5, particle beams or a particle optical beam path are illustrated schematically by the dashed line with reference sign 3. The individual particle beam initially passes through a condenser lens system 303 and subsequently strikes a multi-aperture arrangement 305. This multi-aperture arrangement 305, possibly with further particle optical components, serves as a multi-beam generator. The first particle beams emanating from the multi-aperture arrangement 305 then pass through a field lens or a field lens system 307 and subsequently enter a beam switch 400. This beam switch 400 comprises a beam tube arrangement 460, which has a Y-shaped embodiment and three limbs 461, 462 and 463 in the example shown. Here, in addition to two flat, interconnected structures for holding the magnetic sectors 410, 420, the beam switch 400 includes the magnetic sectors 410 and 420 which are contained in, or secured to, the structures. After passing through the beam switch 400, the first particle beams pass through a scan deflector 500 and, thereupon, a particle optical objective lens 102, before the first particle beams 3 are incident on an object 7, in this case a semiconductor wafer with HV structures. As a result of this incidence, secondary particles, e.g., secondary electrons, are released from the object 7. These secondary particles form second particle beams, which have assigned a second particle optical beam path 9. After emerging from the object 7, the second particle beams initially pass through the particle optical objective lens 102 and subsequently pass through the scan deflectors 500, before the second particle beams enter the beam switch 400. Subsequently, the second particle beams 9 emerge from the beam switch 400, pass through a projection lens system 205 (illustrated in much simplified fashion), pass through an electrostatic element 260 and then are incident on a particle optical detection unit 209 (in this case, the reference sign 260 denotes the so-called anti-scan, which compensates the otherwise occurring scanning movement of the secondary beams 9 upon incidence on the detection unit 209).

Situated within the beam switch 400, there is the beam tube arrangement 460, which also extends beyond the beam switch 400 in the example shown. Splitting the beam path within the beam switch 400 into the first particle optical beam path 3 and the second particle optical beam path 9 is implemented within the beam switch 400 with the aid of magnetic sectors 410, 420. In the example illustrated in FIG. 5, the beam tube arrangement 460 also continues outside of the beam switch 400. In this case, it extends, in particular, to the particle optical objective lens 102 or into the particle optical objective lens 102 (beam tube extension). The beam tube arrangement 460 expands into vacuum chambers 350, 355 and 250 in the region of the particle source 301, in the region of the multi-aperture arrangement 305, and in the region of the detector unit 209. At least in the region of the beam switch 400, the beam tube arrangement normally has a one-piece embodiment, i.e., it has neither weld points or weld seams nor solder points or solder seams. The beam tube arrangement contains copper in the shown example; however, it could also include titanium or any other element or any other compound. Here, there is a high vacuum in the region of the beam tube arrangement 460 within the beam switch 400, optionally with a pressure of less than $10^{-5}$ mbar, in particular less than $10^{-7}$ mbar and/or $10^{-9}$ mbar. In the chambers 350, 355 and 250, already mentioned, there is a vacuum, optionally with respective pressures of less than $10^{-5}$ mbar, in particular less than $10^{-7}$ mbar and/or $10^{-9}$ mbar.

In the example shown, the objective lens 102 has an upper pole shoe 108 and a lower pole shoe 109. A winding 110 for generating a magnetic field is situated between the two pole shoes 108 and 109. Here, the upper pole shoe 108 and the lower pole shoe 109 can be electrically insulated from one another. In the example shown, the particle optical objective lens 102 is a single magnetic lens in the form of an immersion lens; however, the objective lens or the objective lens system can also comprise further magnetic lenses or electrostatic lenses.

Now, the fast autofocus correction lens 824 according to the disclosure can be integrated, in a plurality of configurations and at a plurality of positions, optionally with further fast correctors, in the multi-beam particle microscope 1 shown in FIG. 5. Depending on the position, the fast autofocus correction lens 824 acts more or less strongly on the focus of the individual particle beams 3 in this case; however, it may also act on other particle optical parameters such as the position, the landing angle and/or the rotation of the individual particle beams 3. Additionally, a second or an additional or a plurality of further autofocus correction lens(es) can be integrated in the primary path and/or in the secondary path; optionally, further fast correction mechanism can be provided in the primary path and/or in the secondary path.

Figure 6:
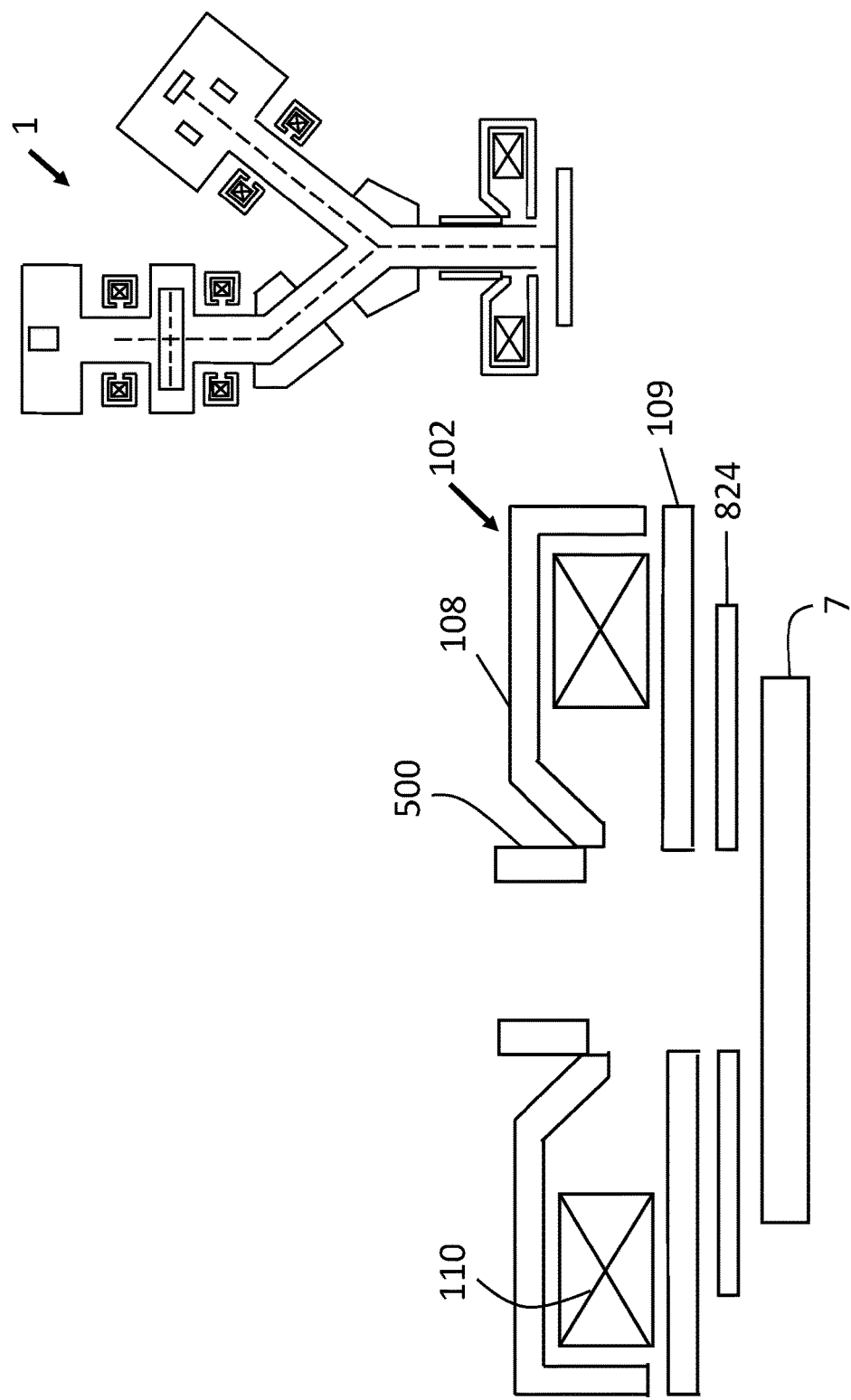
FIG. 6: schematically illustrates an embodiment of the disclosure with an autofocus correction lens.

FIG. 6 schematically illustrates an embodiment of the disclosure with a fast autofocus correction lens 824. In this embodiment, the autofocus correction lens 824 is provided in the form of an additional electrode. By way of example, it can be embodied as a single aperture plate with a central opening, to which a voltage $U_{AF}$ is applied. Level and the sign of the voltage can be provided in this case via the controller 821 for the fast autofocus. This exemplary embodiment is desirable in that the autofocus correction lens, as penultimate lens, is realized comparatively far down in the beam path. As a result, only small subsequent aberrations are generated. The greater the voltage $U_{AF}$ is in terms of absolute value, the more difficult it is to realize fast changes in the voltage from a technical point of view. The exemplary embodiment shown is therefore particularly well suitable if the sample voltage $U_{Sample}$ applied to the sample 7 is not too high.

Figure 7:
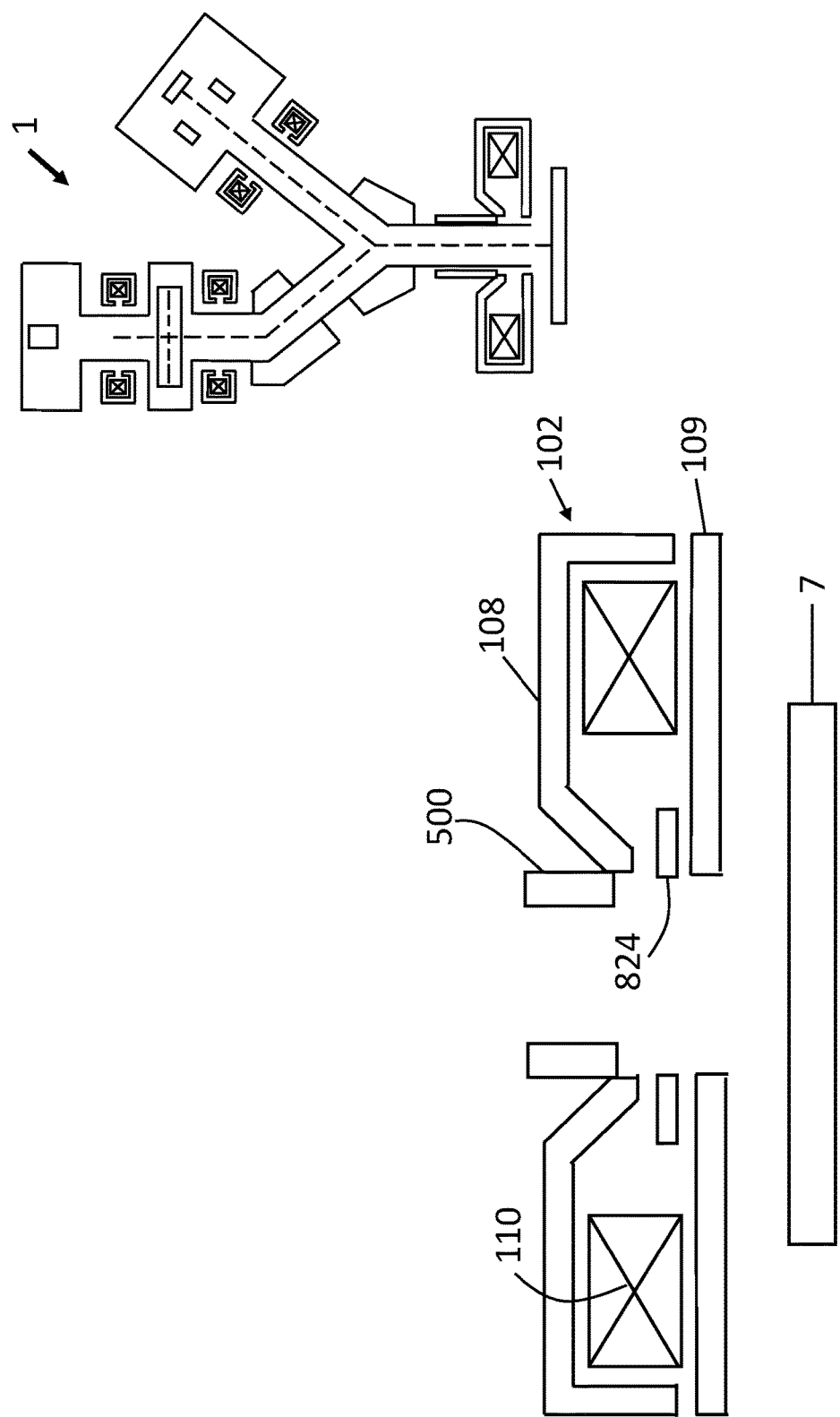
FIG. 7: schematically illustrates an embodiment of the disclosure with an autofocus correction lens.

FIG. 7 schematically illustrates a further embodiment of the disclosure with an autofocus correction lens 824. In the example shown, the autofocus correction lens 824 is arranged within the magnetic objective lens 102. Here, the autofocus correction lens 824 is situated between the upper pole shoe 108 and the lower pole shoe 109 of the objective lens 102. In this case, a voltage $U_1$ is applied to the upper pole shoe 108 and a voltage $U_2$ is applied to the lower pole shoe 109. These voltages can be comparatively high and are a few kilovolts, for example. The same can also apply to the voltage $U_{AF}$ that is able to be applied to the autofocus correction lens 824. In this case, too, the autofocus correction lens 824 can therefore be operated at a comparatively high voltage $U_{AF}$. However, if the upper pole shoe 108 is at ground potential, the voltage $U_{AF}$ can be chosen to be comparatively small in terms of absolute value. In this embodiment, too, the autofocus correction lens 824 is arranged comparatively far down in the first particle optical beam path; it is the penultimate particle optical element in the example shown. This is once again desirable in that possible subsequent aberrations are also small in this embodiment variant.

Figure 8:
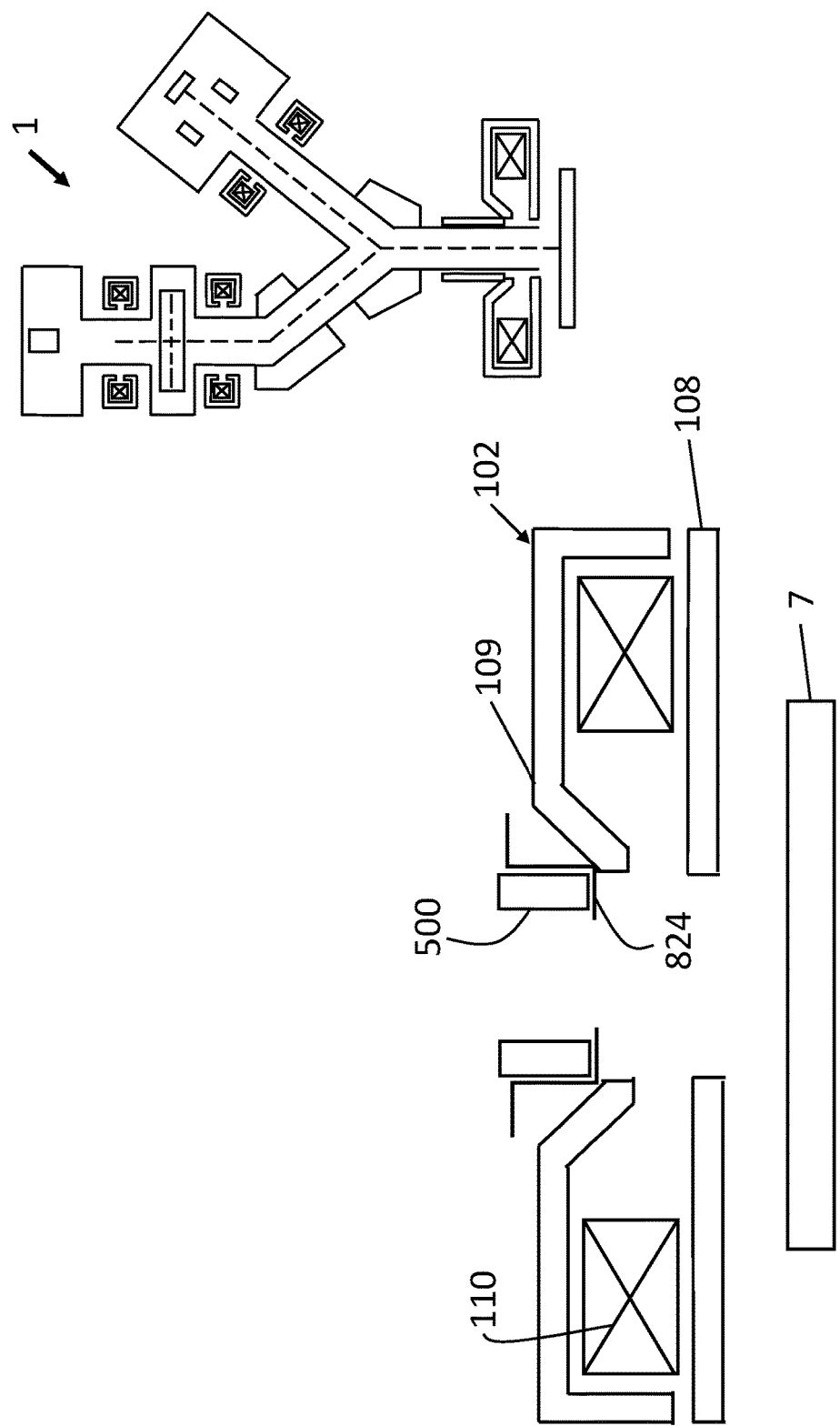
FIG. 8: schematically illustrates an embodiment of the disclosure with an autofocus correction lens.

FIG. 8 shows a further embodiment of the disclosure with a fast autofocus correction lens 824 in a schematic illustration. In this embodiment variant, the autofocus correction lens 824 is provided between the beam deflection system 500 and the upper pole shoe 108 of the magnetic objective lens 102. This is a quickly controllable electrode, to which the voltage $U_{AF}$ is applied, the value of the latter being adjustable via the controller 821 of the fast autofocus. This embodiment variant is desirable in that the electrode 824 is substantially arranged within the crossover plane. Comprehensive calculations of the inventors in this respect have shown that the influence of the electrode 824 at this position is substantially directed at the focus. The other particle optical parameters such as position, landing angle and rotation remain substantially unchanged. Moreover, this embodiment is desirable in that the effect in the crossover on all individual particle beams is identical. This makes it easier to precisely set the autofocus.

Figure 9:
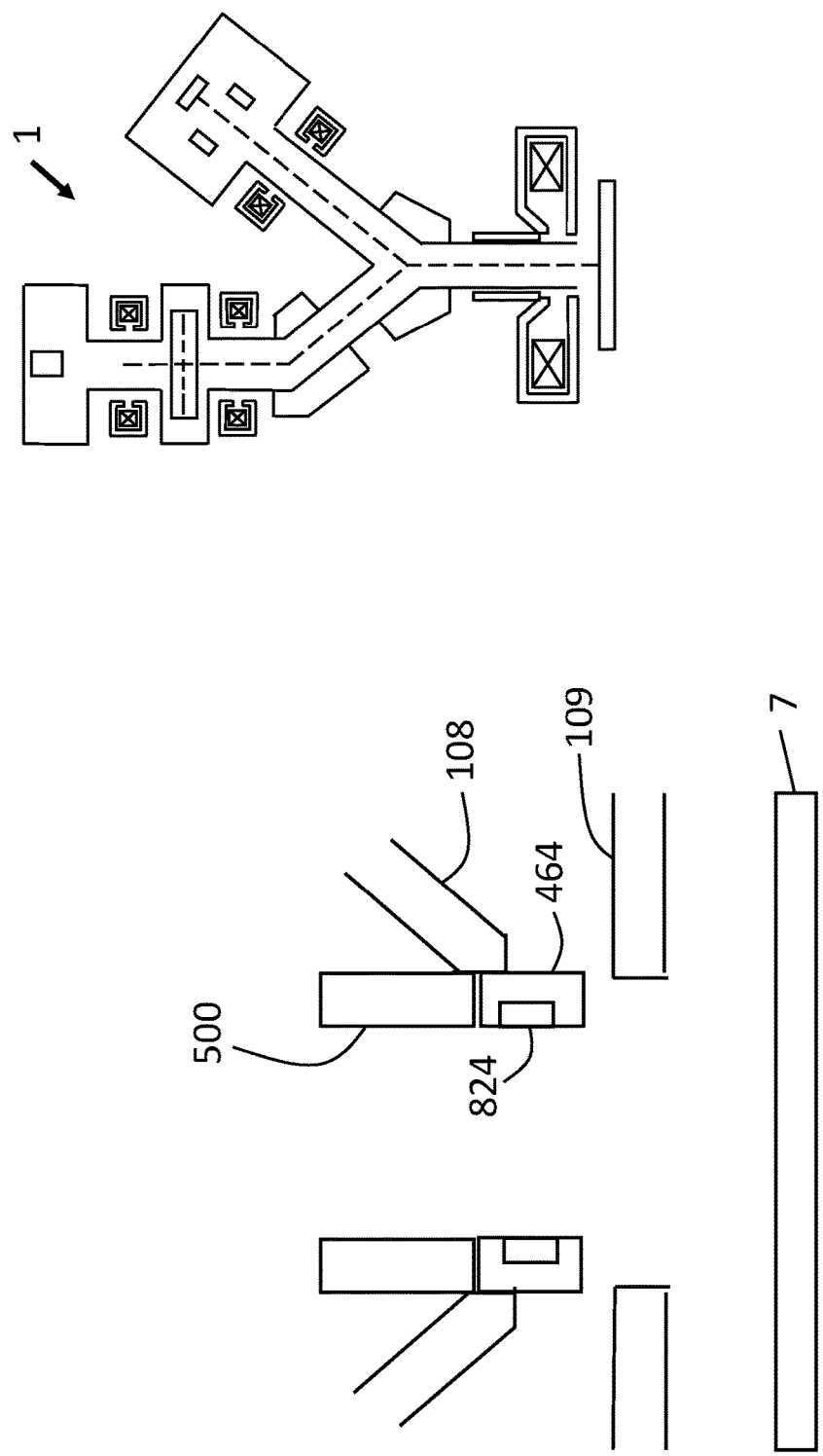
FIG. 9: schematically illustrates an embodiment of the disclosure with an autofocus correction lens.

FIG. 9 schematically illustrates a further embodiment of the disclosure with autofocus correction lens 824. In this case, too, the autofocus correction lens 824 is embodied as a fast electrostatic element or as a fast electrostatic lens. Starting from the upper pole shoe 108 of the objective lens 101, the beam tube extension 464 protrudes a little into the magnetic objective lens 101. This beam tube extension 464 is at ground potential—like the entire beam tube 460. Here, the autofocus correction lens 824 is arranged within the beam tube extension 464. An adjustable voltage $U_{AF}$ is applied, in turn, to the former by way of the controller 821. It can be comparatively low. In this case, the illustrated position of the autofocus correction lens 824 is situated close to the crossover plane. Comprehensive calculations have shown that positioning the autofocus correction lens 824 at the crossover or in the vicinity of the crossover acts predominantly on the focus of the individual particle beams. Therefore, adaptations of further particle optical parameters such as position, landing angle and rotation are either not mandatory or, at least, smaller. This allows a faster readjustment of the remaining parameters or the correction elements can have a weaker design. This generates smaller subsequent aberrations.

Figure 10:
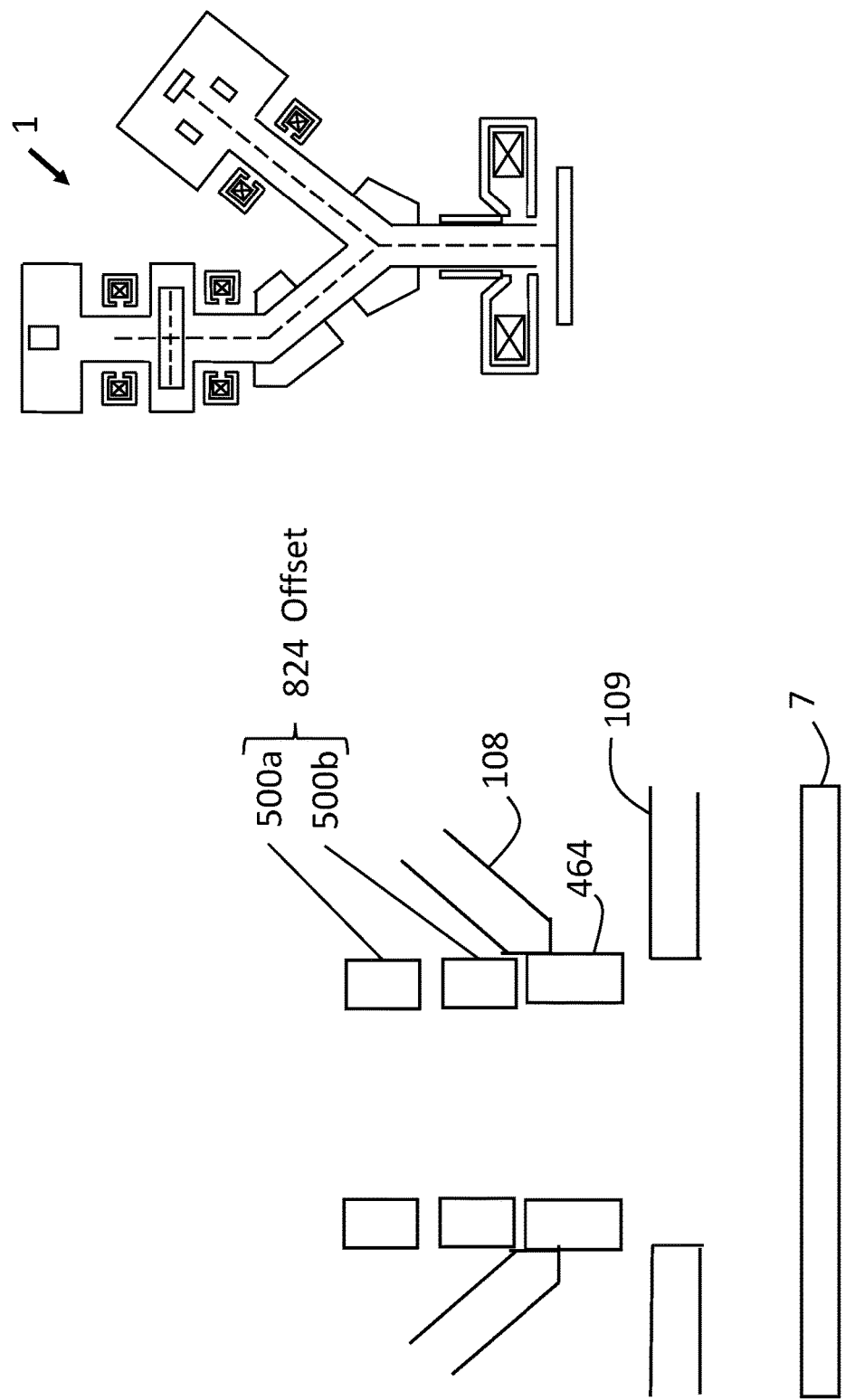
FIG. 10: schematically illustrates an embodiment of the disclosure with an autofocus correction lens.

FIG. 10 schematically illustrates a further embodiment of the disclosure with a fast autofocus correction lens 824. In the exemplary embodiment shown, the autofocus correction lens 824 is provided as an offset for the scan deflector 500: In the illustrated example, the scan deflector 500 comprises an upper deflector 500a and a lower deflector 500b. Here, in general, the upper deflector 500a and the lower deflector 500b can have the same design. By way of example, they can be embodied as a deflector plate pair, as a quadrupole element or as an octupole element. The voltage $U_{AF}$ is now applied to both the upper deflector 500a and the lower deflector 500b as an offset. Once again, the corresponding control signal is provided via the controller 821 for the fast autofocus. This embodiment variant is desirable in that the fast autofocus correction lens 824 is once again arranged close to the crossover of the individual particle beams 3. In this case, too, an excitation of the autofocus correction lens 824 therefore acts substantially on the focus. Moreover, this realization does not require additional hardware: It is desirable to apply the voltage $U_{AF}$ as an offset to the upper deflector 500a and the lower deflector 500b.

Figure 11:
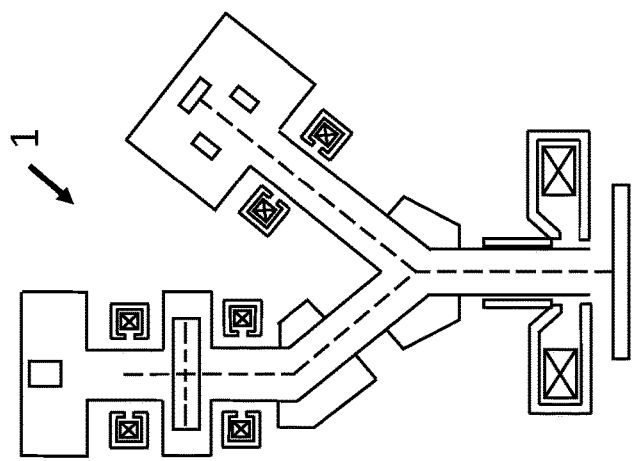
FIG. 11: schematically illustrates an embodiment of the disclosure with an autofocus correction lens.
Figure 11:
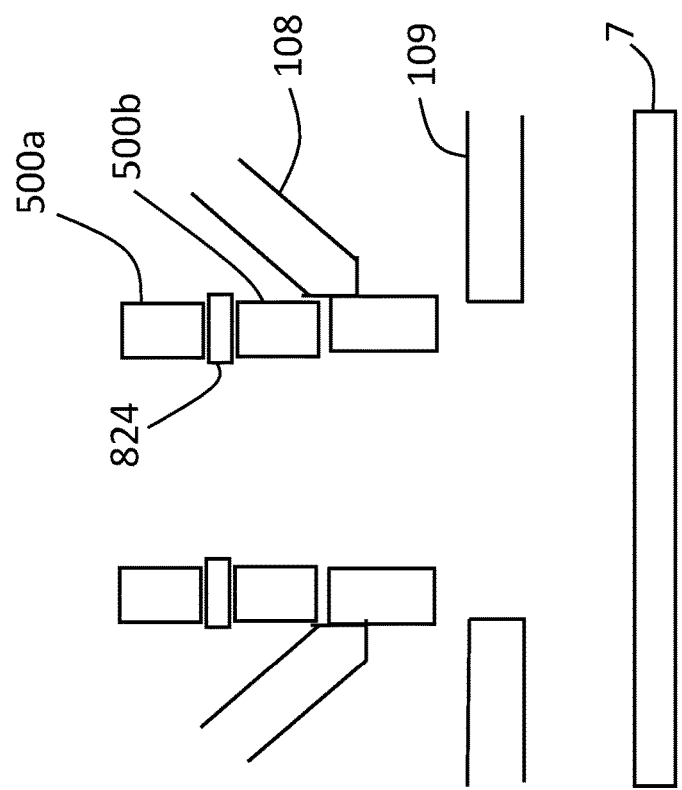

FIG. 11 shows a further embodiment of the disclosure with a fast electrostatic autofocus correction lens 824. In this embodiment, the fast autofocus correction lens 824 is provided as a ring electrode between the upper deflector 500a and the lower deflector 500b. In this case, it is also true that the autofocus correction lens 824 is arranged relatively close to the crossover of the individual particle beams 3. Therefore, the lens 824 mainly acts on the focus of the individual particle beams. Moreover, changes to the hardware of the system 1 can be carried out comparatively easily. Instead of as a ring electrode, the fast autofocus correction lens 824 can also be embodied as an air coil around the beam tube 861 (not illustrated in FIG. 11).

Figure 12:
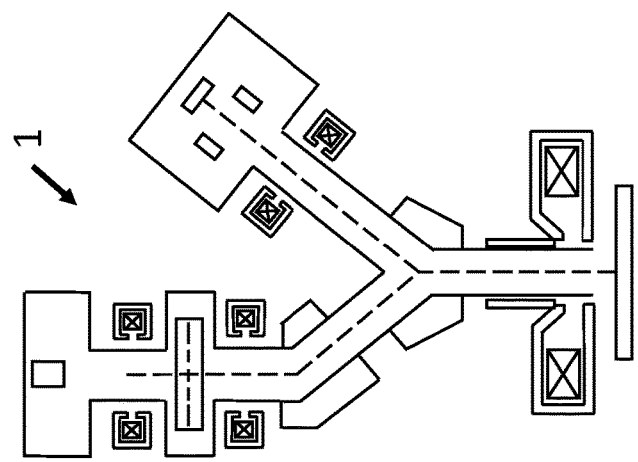
FIG. 12: schematically illustrates embodiments of the disclosure with an autofocus correction lens.
Figure 12:
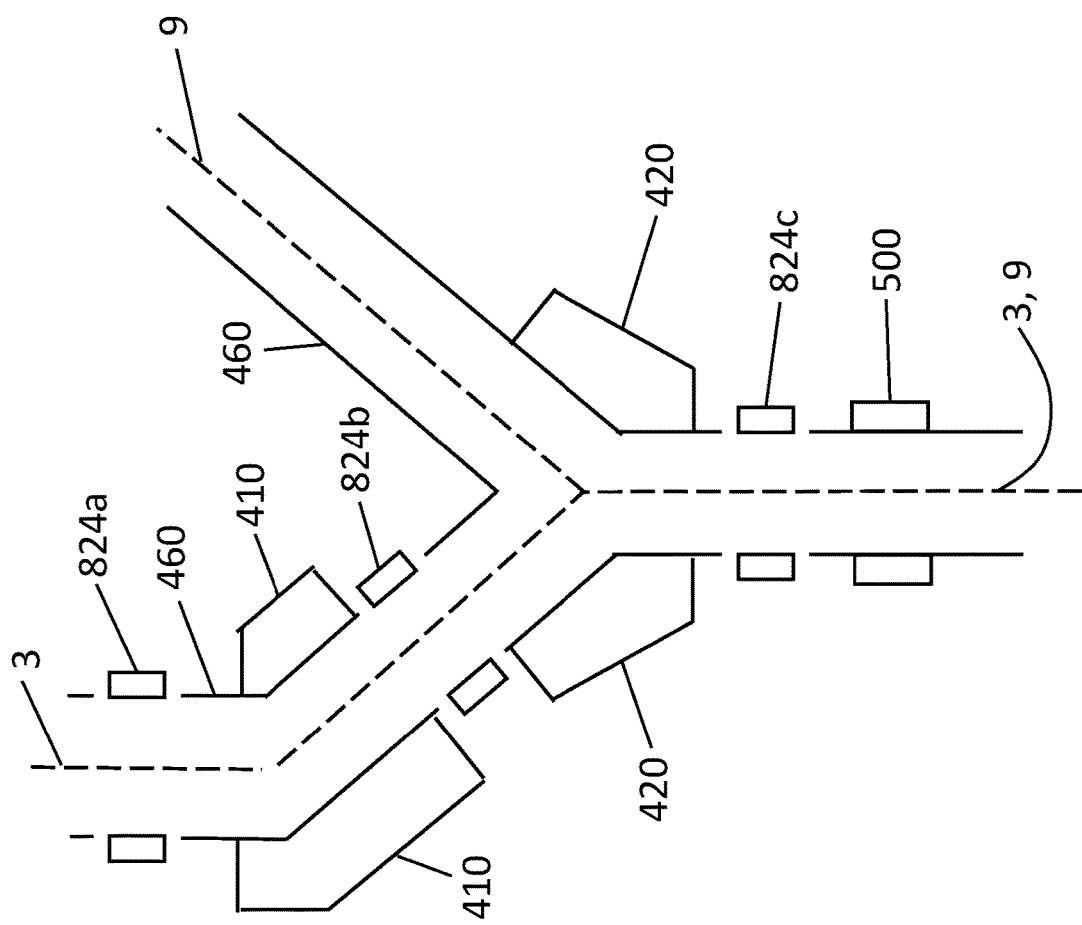

FIG. 12 shows further embodiments of the disclosure with a fast autofocus correction lens 824 in a schematic illustration. In these embodiments, the beam tube 460 is interrupted at the sites at which the autofocus correction lens 824 is provided. In the overall system 1, these positions can offer comparatively large amounts of space, simplifying an integration of the autofocus correction lens 824 in the system overall. Specifically, three different positions at which the autofocus correction lens 824 can be arranged are illustrated in FIG. 12: According to a first example, the autofocus correction lens 824a is situated above the beam switch 400 or above the magnetic sector 410 in the particle optical beam path. Expressed differently, the interruption of the beam tube 460, in which the autofocus correction lens 824a is arranged, is situated between the field lens system 307 (not illustrated in FIG. 12) and the beam switch 400. A second option lies in providing the interruption of the beam tube 460 between the two magnetic sectors 410 and 420 and arranging the autofocus correction lens 824b in this interruption. A third option lies in arranging the beam tube 460 between the beam switch 400 and the beam deflection system 500. Part of the inner wall of the beam tube 460 is therefore replaced by the autofocus correction lens 824a, 824b and/or 824c in these embodiment variants or is not—like the beam tube 460—at ground potential.

Figure 13:
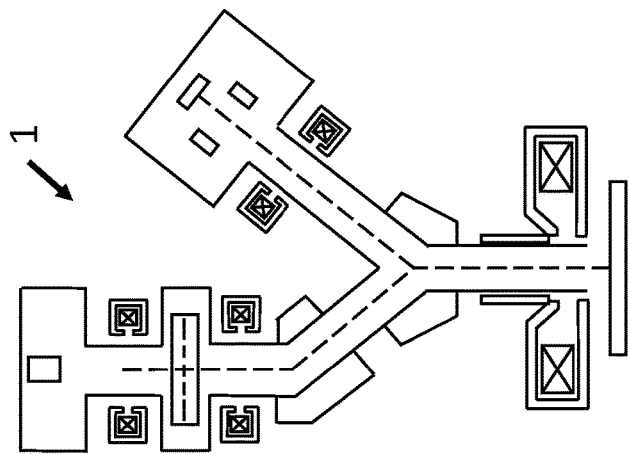
FIG. 13: schematically illustrates embodiments of the disclosure with an autofocus correction lens.
Figure 13:
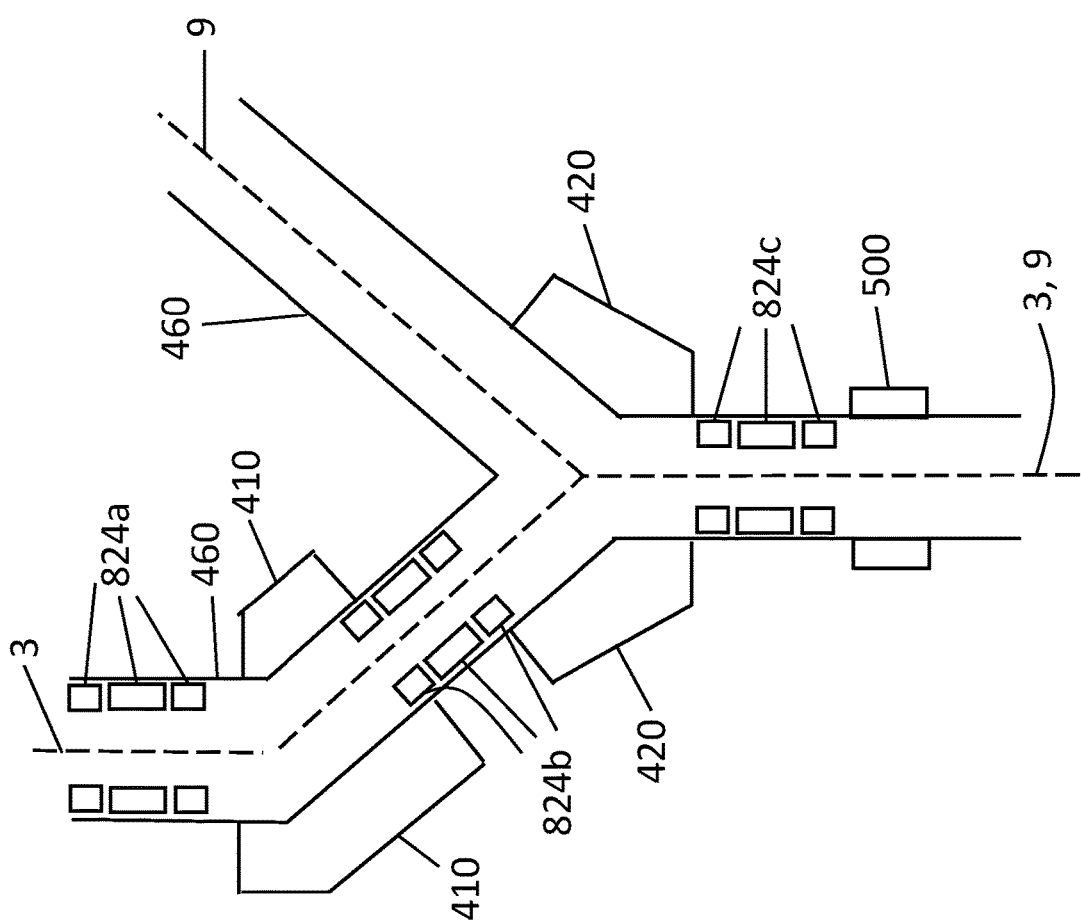

FIG. 13 shows further embodiments of the disclosure with fast autofocus correction lenses 824. The example illustrated in FIG. 13 differs from the example illustrated in FIG. 12 in that no interruption of the beam tube 460 is provided. Instead, a tube lens 824a, 824b and 824c is integrated in the beam tube 460 in each case. This makes it easier to design the beam tube 460 in sealed fashion and to maintain the vacuum or high vacuum situated therein. In the case of the realization variant with the tube lenses, the voltage $U_{AF}$ is applied to the central electrode; the upper and the lower electrode are optionally at ground potential. Alternatively, a fast magnetic lens, for example in the form of an air coil, can be arranged around the beam tube 460 at the sites shown. The latter only has a few turns k, for example $10 \leq k \leq 500$ and/or $10 \leq k \leq 200$ and/or $10 \leq k \leq 50$ applies.

Figure 14:
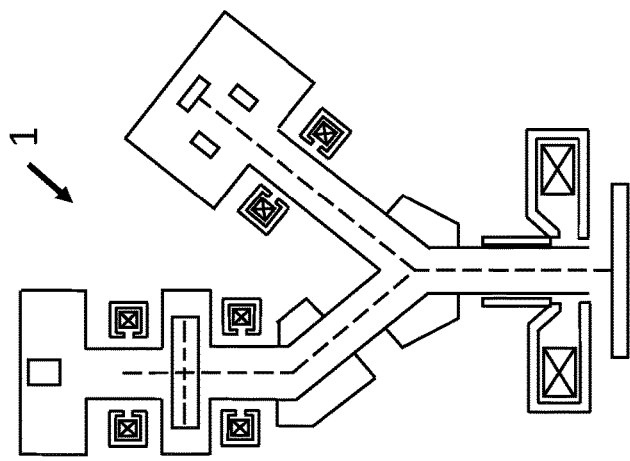
FIG. 14: schematically illustrates an embodiment of the disclosure with an autofocus correction lens.
Figure 14:
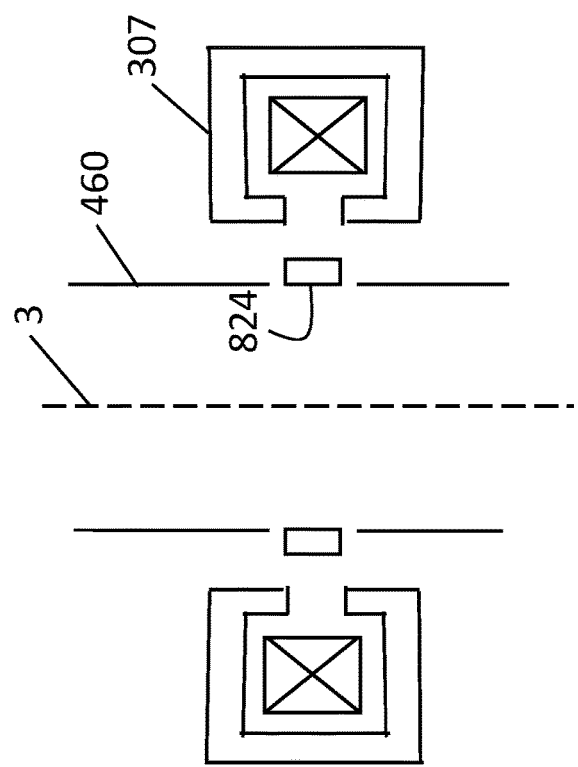

FIG. 14 shows a further embodiment of the disclosure with a fast autofocus correction lens 824, wherein the beam tube 460 is interrupted. The autofocus correction lens 824 is arranged within this interruption. Here, this interruption is situated within a magnetic field lens of the field lens system 307. This embodiment variant can be realized comparatively easily on account of the available installation space. Moreover, the beam tube 460 is at ground potential, which is why only a comparatively low voltage, as voltage $U_{AF}$, is applied to the autofocus correction lens 824 in order to influence the individual particle beams 3. However, in this embodiment the autofocus correction lens acts both on the focus and on the position and the landing angle of the individual particle beams upon incidence on the wafer surface. Conversely, it is possible to use a position within the field lens 307 to correct a tilt of the beams and also the position of the beams.

Figure 15:
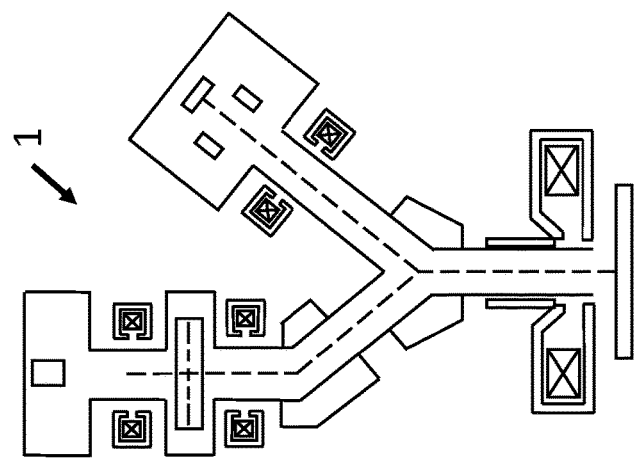
FIG. 15: schematically illustrates an embodiment of the disclosure with an autofocus correction lens.
Figure 15:
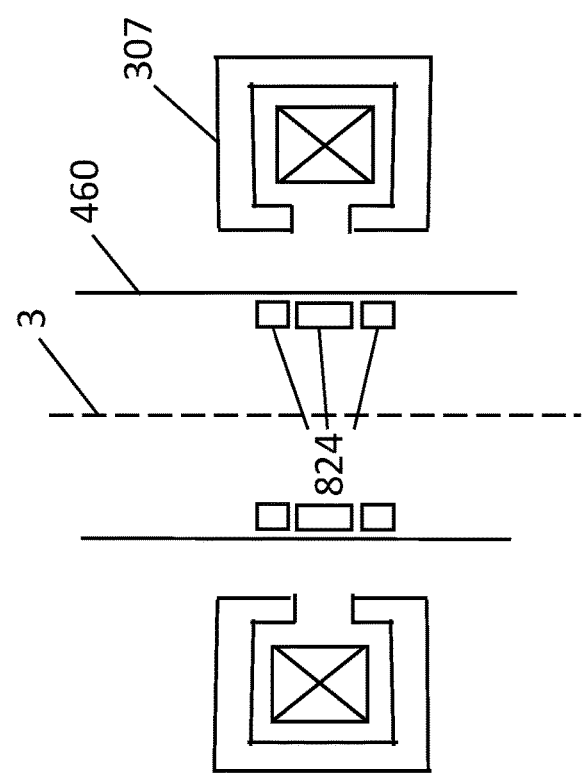

FIG. 15 shows a further embodiment of the disclosure with a fast autofocus correction lens 824. In comparison with the embodiment variant illustrated in FIG. 14, it is the case here that the beam tube 460 does not have an interruption. Instead, a tube lens as a fast autofocus correction lens 824 is arranged within the beam tube 460. In this embodiment variant, too, a realization is comparatively simple if sufficient installation space is available. Conversely, it is once again the case that the autofocus correction lens 824 also acts on the position and the landing angle of the individual particle beams 3 in addition to the focus. It is therefore optionally desirable to (also) correct the tilt of the individual particle beams and/or the position of the individual particle beams by way of the autofocus correction lens.

Figure 16:
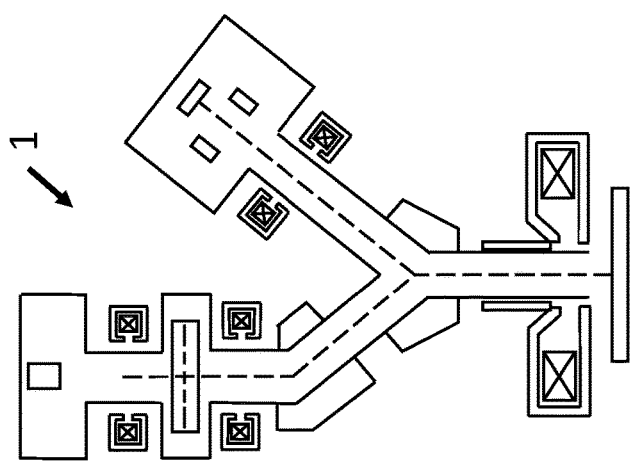
FIG. 16: schematically illustrates an embodiment of the disclosure with an autofocus correction lens.
Figure 16:
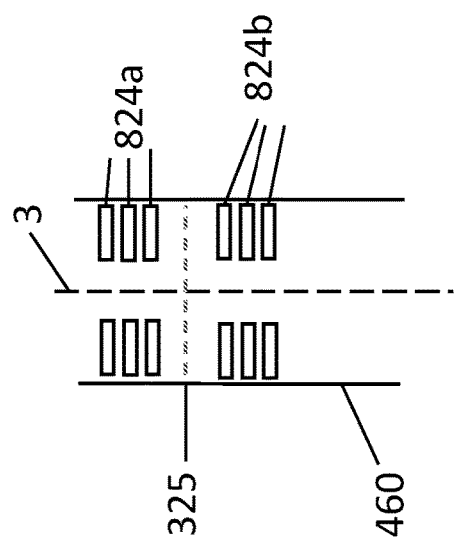

FIG. 16 shows a further embodiment of the disclosure with a fast autofocus correction lens 824 in a schematic illustration. In this exemplary embodiment, the autofocus correction lens 824 is arranged in the vicinity of the intermediate image plane 325: Here, the autofocus correction lens 824 in this example is embodied as a combined lens with a first constituent part 824a and a second constituent part 824b. If these two constituent parts 824a and 824b are provided symmetrically with respect to the intermediate image plane 325, the effect of the combination is the same as if the autofocus correction lens 824 were arranged directly within the intermediate image plane 325. This embodiment variant can allow for the further particle optical components of the overall system 1 to be arranged in the intermediate image plane 325 itself. By way of example, positioning in the intermediate image plane 325 is expedient for a first multi-deflector array since this can implement a fast telecentricity correction for the first individual particle beams, as described above in the general part of the application. However, the autofocus correction lens 824 can alternatively also be embodied in one-part fashion (i.e., only with the constituent part 824a or only with the constituent part 824b in the vicinity of the intermediate image plane 325. In a further alternative, the autofocus correction lens 824 can be arranged in one-part fashion (i.e., only with the constituent part 824a or only with the constituent part 824b as exactly within the intermediate image plane 325 as possible. Then, the autofocus correction lens 824 has a comparatively large effect on the telecentricity of the individual particle beams 3 passing therethrough, like in the case of the symmetric arrangement of the constituent parts 824a and 824b.

Figure 17:
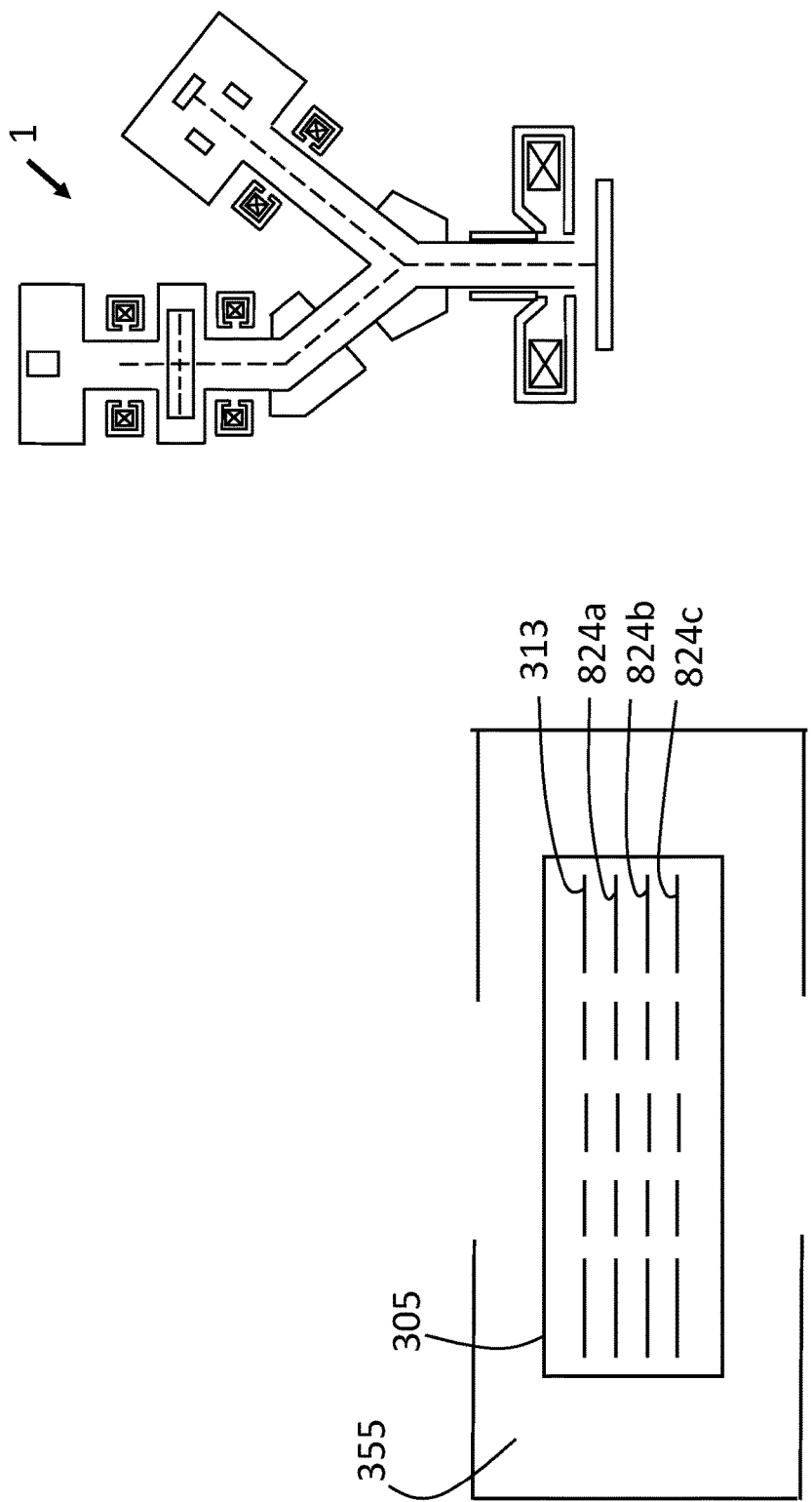
FIG. 17: schematically illustrates an embodiment of the disclosure with an autofocus correction lens.

FIG. 17 shows a further embodiment of the disclosure with a fast autofocus correction lens 824. In this embodiment, the fast autofocus correction lens 824 is integrated in the multi-aperture arrangement 305. In addition to a multi-aperture plate 313, which is used to generate individual beams, this multi-aperture arrangement 305 comprises further multi-aperture plates or multi-lens arrays and/or multi-deflector arrays (e.g., for individual focusing and/or stigmation of the individual particle beams; not illustrated in FIG. 17). In this sequence of the so-called micro-optical unit, the fast autofocus correction lens 824 can be provided in the form of a fast multi-Einzel lens arrangement. In this case, the multi-aperture plate 824a and the multi-aperture plate 824c are at ground potential. Situated therebetween is the multi-aperture plate 824b, to which the autofocus correction voltage $U_{AF}$ can be applied via the controller 821. A feature of this embodiment of the disclosure is that, in general, no change in the position and no tilt of the individual particle beams is caused; however, spherical aberrations in the autofocus correction lens 824 in the form of a multi-Einzel lens arrangement and manufacturing tolerances in the multi-aperture plate may be desirable. Additionally, a comparatively high voltage is desirably currently used as voltage $U_{AF}$.

Figure 18:
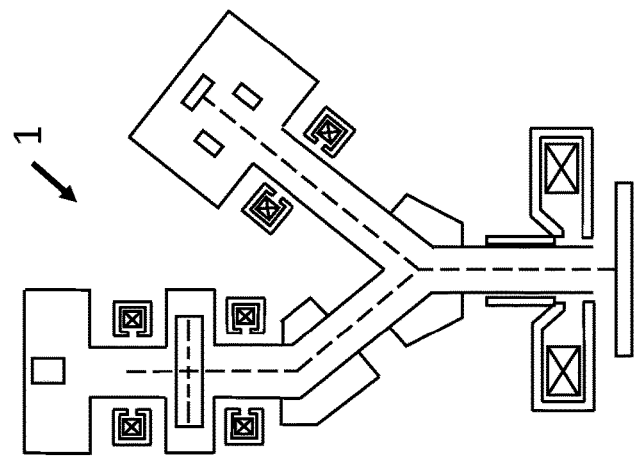
FIG. 18: schematically illustrates an embodiment of the disclosure with a two-part first autofocus correction lens.
Figure 18:
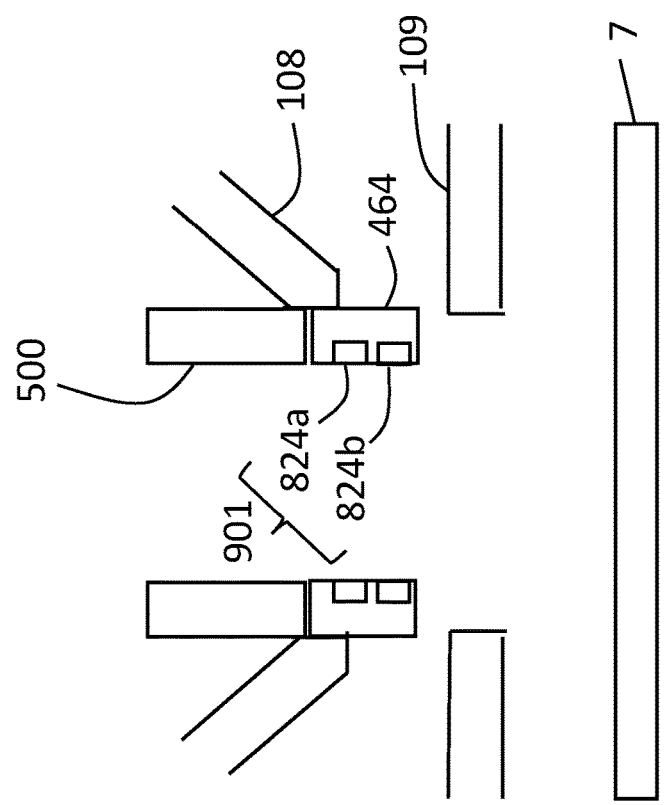

FIG. 18 schematically illustrates an embodiment of the disclosure with a two-part first autofocus correction lens 901. Here, this first fast autofocus correction lens 901 is arranged between the upper pole shoe 108 and the lower pole shoe 109 of the objective lens 102. Specifically, the two-part first fast autofocus correction lens 901 is integrated in the beam tube extension 464. The beam tube extension 464 is at ground potential—like the entire beam tube 460. The two parts 824a and 824b are each embodied as fast electrostatic lenses. By way of example, they can be arranged in interruptions in the beam tube extension 464 but can also be provided as tube lens within the beam tube extension 464 in each case. In this respect, FIG. 18 is only a schematic illustration. In the example shown, the two parts 824a and 824b of the first fast autofocus correction lens 901 fulfill different tasks: In the example shown, the first part 824a substantially serves to set the focus upon incidence on the object 7, consequently in the object plane, in high-frequency fashion. An electrostatic lens normally does not act on the azimuthal beam parameters of the individual particle beams 3 passing therethrough. However, if the electrostatic lens, in this case the lens 824a, is in a magnetic field—in this case within the magnetic objective lens 102 with its two pole shoes 108 and 109—then the charged particles within the inhomogeneous magnetic field experience a change in velocity, which is why the azimuthal beam parameters change within the lens field. The second part 824b of the first fast autofocus correction lens 901 substantially serves to compensate this unwanted effect. In general, the lens 824b also has a focusing effect on the individual particle beams 3 passing therethrough. However, a compensation of the azimuthal deviations can substantially be attained in the case of a different polarity of the two parts 824a and 824b. Here, it is not necessarily the case that the voltages applied to the two parts 824a and 824b are of equal magnitude but opposite sign, although this may be so. What is taken into account here is that the magnetic field of the objective lens is not homogeneous. Overall, the two parts 824a and 824b of the first fast autofocus correction lens 901 are set such that the integral $\int B(z)/v(z)\, dz$ disappears upon passage through the objective lens 102. This corresponds to the compensation of the unwanted azimuthal effects but facilitates the adjustment of a focus in the case of a fast readjustment in the object plane 101.

Figure 19:
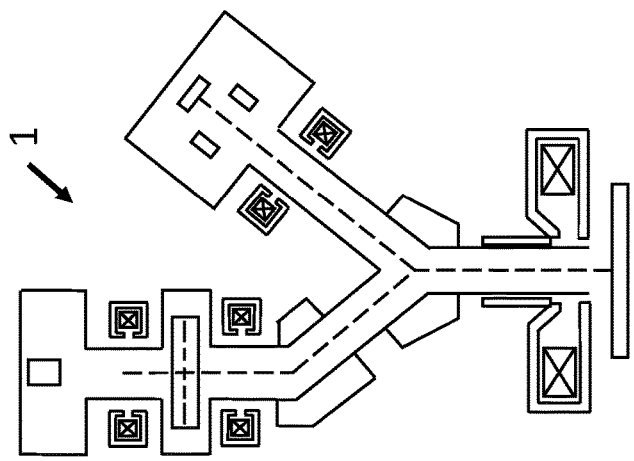
FIG. 19: schematically illustrates an embodiment of the disclosure with a fast autofocus correction lens within the magnetic field of a field lens.
Figure 19:
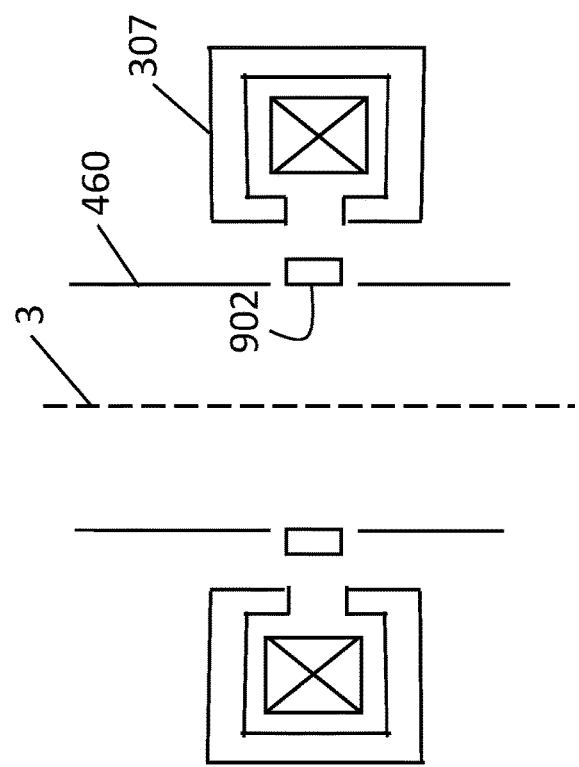

FIG. 19 schematically illustrates a further embodiment of the disclosure with a fast autofocus correction lens 902 within the magnetic field of a field lens 307. This field lens 307 can be one of a plurality of field lenses of a field lens system. The embodiment variant illustrated in this figure can be combined, in particular, with a merely one-part first fast autofocus correction lens 824a or 901, which is arranged between the upper 108 and lower pole shoe 109 of the objective lens 102. The basic idea is as follows: As already explained above in conjunction with FIG. 18, a corresponding counter rotation is used to correct undesirably occurring changes in azimuthal beam parameters in the magnetic field. While the counter rotation in the exemplary embodiment as per FIG. 18 is realized by the second lens part 824b within the same magnetic lens, the embodiment variant illustrated in FIG. 19 realizes this counter rotation by the provision of the second fast autofocus correction lens 902 in a different magnetic lens. In the example shown, the beam tube 460 was interrupted to this end and the second fast electrostatic autofocus correction lens 902 is arranged within this interruption. In the example shown, the second fast autofocus correction lens 902 is controlled in high frequency fashion during the wafer inspection at the respective working point such that there is a high-frequency correction of the image field rotation. In practice, it was found that work should be carried out at comparatively high voltages in the region of a few kV, for example approximately 5 kV, in this embodiment of the disclosure. This is comparatively high for fast adaptation of voltages; however, a correction in this high-voltage region can also be carried out quickly by way of appropriate engineering.

Figure 20:
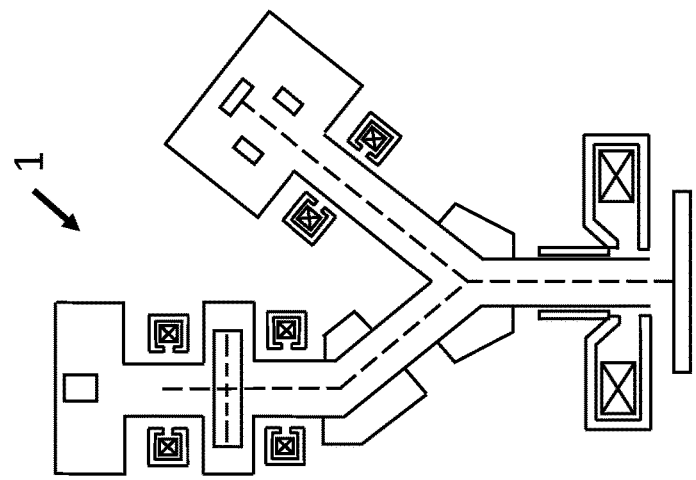
FIG. 20: schematically illustrates an embodiment of the disclosure with a fast autofocus correction lens at the multiple particle beam generator.
Figure 20:
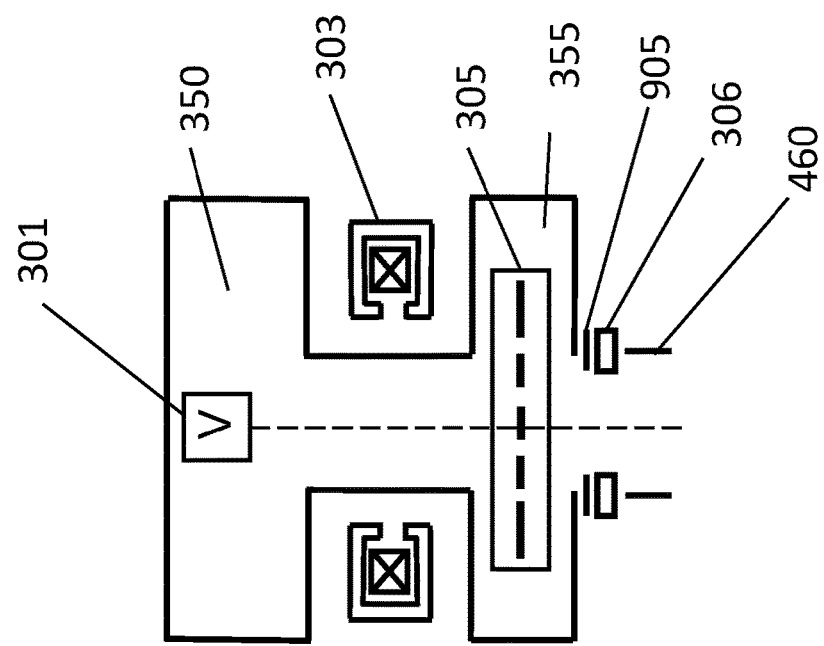

FIG. 20 schematically illustrates an embodiment of the disclosure with a fifth fast autofocus correction lens 905 on the multi-beam particle generator. In the exemplary embodiment shown, the multi-beam particle generator comprises a multi-lens array with a multi-aperture arrangement 305 and a counter electrode 306. Overall, the voltage applied to the counter electrode 306 brings about the lens effect of the multi-beam particle generator and, depending on the level of the voltage, the individual particle beams 3 are focused on different locations when passing through the multi-beam particle generator. Here, the effect on the relative position of the focal plane in the Z-direction is significantly smaller than the effect on the magnification or the pitch of the individual particle beams 3 within the focal plane or intermediate image plane 325 (not illustrated in FIG. 20). If there is now a change in the voltage at the multi-beam particle generator, this allows the magnification of the imaging in the object plane 101 to be set. In this case, the fifth fast autofocus correction lens 905 can be realized as an offset voltage, which is able to be applied to the counter electrode 306. However, it is now the case that a voltage in the region of a plurality of kV is usually applied to the counter electrode 306. Implementing fast changes in this case is linked with corresponding engineering difficulties even though it is possible. FIG. 20 therefore shows another realization, specifically using an additional fifth fast autofocus correction lens 905. This fifth fast autofocus correction lens 905 is realized as an additional electrode which is arranged between the multi-aperture arrangement 305 and the counter electrode 306. Alternatively, such an additional electrode could be arranged just downstream of the counter electrode 306.

Figure 21:
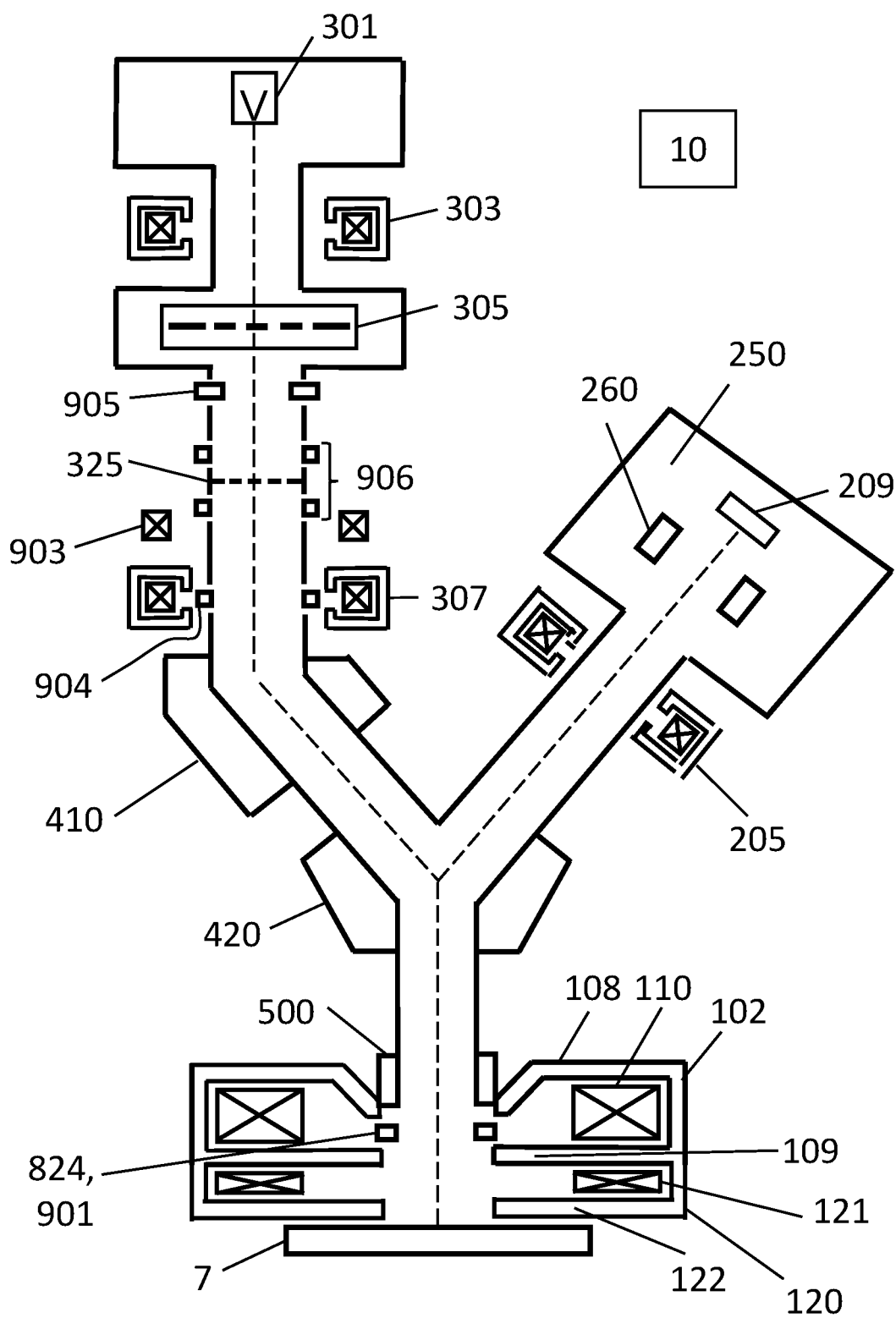
FIG. 21: schematically illustrates an embodiment of the disclosure with a multiplicity of fast autofocus correction lenses.

FIG. 21 schematically illustrates an embodiment of the disclosure with a multiplicity of fast autofocus correction lenses 901, 903, 904, 905 and 906. Via the fast autofocus correction lenses 901, 903, 904, 905 and 906, it is possible to set different beam parameters or keep these constant within the scope of fast autofocusing at a respective working point or at a plurality of working points. Here, the various fast autofocus correction lenses 901, 903, 904, 905 and 906 have different (principal) tasks in respect of the high-frequency corrections to be undertaken. In the example shown, a one-part first fast autofocus correction lens 824 or 901 is arranged between the upper pole shoe 108 and the lower pole shoe 109 of the objective lens 102, wherein the controller is configured to generate a first autofocus correction lens control signal on the basis of the actual autofocus data during the wafer inspection in order to control the first fast autofocus correction lens 901 in high-frequency fashion during the wafer inspection at the respective working point. It is predominantly the autofocus correction itself that is undertaken with this lens 901; the remaining fast autofocus correction lenses 903, 904, 905, 906 can serve to correct the remaining beam parameters at the respective working point, with the control thereof being based on a feedback loop and/or a feedforward loop. Here, too, the actual autofocus data can be used within the scope of the feedforward loop and the values for the autofocus correction lens control signals of the fast autofocus correction lenses 903, 904, 905 and 906 are generated on the basis of these actual autofocus data via multidimensional lookup tables. However, it is also possible to use additional actual data for correction purposes, which actual data can be generated, for example, by evaluating an image of a CCD camera in the second particle optical beam path (not illustrated) (implementing a further feedback) or by a z-level sensor, which measures the distance of the sample surface from the lowermost pole shoe of the objective lens.

In the exemplary embodiment shown, a fifth fast autofocus correction lens 905 is situated in the region of the multi-beam particle generator, as has also already been illustrated in conjunction with FIG. 20. A two-part fast electrostatic autofocus correction lens 906 is situated in the region of the intermediate image plane 325. Its constituent parts are symmetrically arranged upstream and downstream of the intermediate image plane 325, which is why this lens 906 can be treated as if it were arranged entirely within the intermediate image plane 325. In the example shown, this lens 906 can be provided with a positive or negative bias, for example with a negative bias of a few 100 V, for example −200 V, −300 V, −400 V or the like.

Moreover, the example shown illustrates a third fast autofocus correction lens 903 which, in the example shown, comprises a fast magnetic lens in the form of an air coil, which is arranged outside around the beam tube 460 in the first particle optical beam path at a position that is substantially magnetic field-free. This condition is satisfied just after the passage through the intermediate image plane 325; however, it may also be satisfied at other positions in the particle optical beam path. By way of example, the third fast autofocus correction lens 903 can realize a high-frequency correction of the azimuthal position of the individual particle beams, and hence a correction of the image field rotation in the object plane.

In the example shown, a fourth fast autofocus correction lens 904, which is a fast electrostatic lens, is furthermore arranged within a magnetic field lens 307. Substantially a high-frequency correction of the radial landing angle of the individual particle beams in the object plane 101 can be implemented via this fourth fast autofocus correction lens 904. However, it would also be possible to carry out substantially a high-frequency correction of the image field rotation in the object plane 101 via the corresponding lens 904 like in the case of the second fast autofocus correction lens 902.

In addition to the aforementioned fast autofocus correction lenses 901, 903, 904, 905 and 906, a magnetic field compensation lens 120 comprising a magnetic lens is provided in the example shown, wherein the magnetic field compensation lens 120 is arranged between the objective lens 102 and the object plane 101 or the object 7. In the example shown, the controller 10 is configured to control the magnetic field compensation lens 120 with a magnetic field compensation control signal in static or low-frequency fashion, in such a way that the magnetic field in the object plane 101 or upon incidence on the object 7 takes the value of zero. In the example shown, the magnetic field compensation lens 120 is coupled to the objective lens 102. The two windings 110 and 121 are impinged with technical currents of different signs such that the arising magnetic flux through the lower pole shoe 109 of the objective lens 102 is directed in the same way in both cases. It can therefore be controlled via an appropriate control. Further information in respect of the design of a magnetic field compensation lens 120 can be gathered for example from WO 2007/060017 A2, the disclosure of which is incorporated in the present patent application in full by reference. The magnetic field compensation lens 120 is controlled in a static or low-frequency fashion via the controller. This means that a setting of the azimuthal landing angle in the object plane is not re-corrected in high-frequency fashion. However, it was found that the static or low-frequency control of the magnetic field compensation lens 120 is absolutely sufficient: The remaining error in respect of the azimuthal landing angle is significantly smaller in percentage terms than the error of the radial landing angle following a high-frequency correction. By way of example, it can be corrected via the fourth fast autofocus correction lens 904, which is arranged in the field lens 307.

In very general terms, it is the case that the effect of additional fast autofocus correction lenses on the beam parameters of focus, beam position and the telecentricity depends on their respective position within the column. Here, the inventors found out that there are substantially three different positions which exhibit different effects: There is predominantly an effect on the focus near the crossover. There is predominantly an effect on the telecentricity near an intermediate image plane. There is predominantly an effect on the magnification near the micro-optical unit or just below the micro-optical unit. At every other position the electrostatic lenses bring about a mixture of effects on the respective beam parameters.

Now, the inventors examined the sensitivity of the additional fast autofocus correction lenses 901, 903, 904, 905, 906, illustrated in FIG. 21, on the beam parameters of focus, beam position and telecentricity in a paraxial approximation. In general, only five additional elements are used to set the focus, the azimuthal and radial position, and the azimuthal and radial telecentricity.

However, the inventors carried out their examinations for more than five additional elements and in each case examined the lens excitations for lenses at a focus of several ten whereas the other beam parameters were kept constant. In total, more than 20 combinations of elements and different strategies were examined. More in-depth information in respect of the possible arrangement of particle optical components in the beam path and the control thereof can be gathered, for example, from US 2019/0355545 A1, the disclosure of which is incorporated in this patent application in full by reference. To ascertain the control of the fast autofocus correction lenses, use was made of an inverted sensitivity matrix which describes the influence of actuation changes of particle optical components on particle optical parameters which characterize the particle optical imaging at the respective working point. Here, solutions in which the column vectors of the sensitivity matrix are significantly dominated by one entry in each column are sought after in a targeted fashion. Here, it was found that there are no dominant entries in the column vectors for some fast autofocus correction lenses, which is why the sensitivity of these autofocus correction lenses is very low during the desired optimization at this point.

Figure 22:
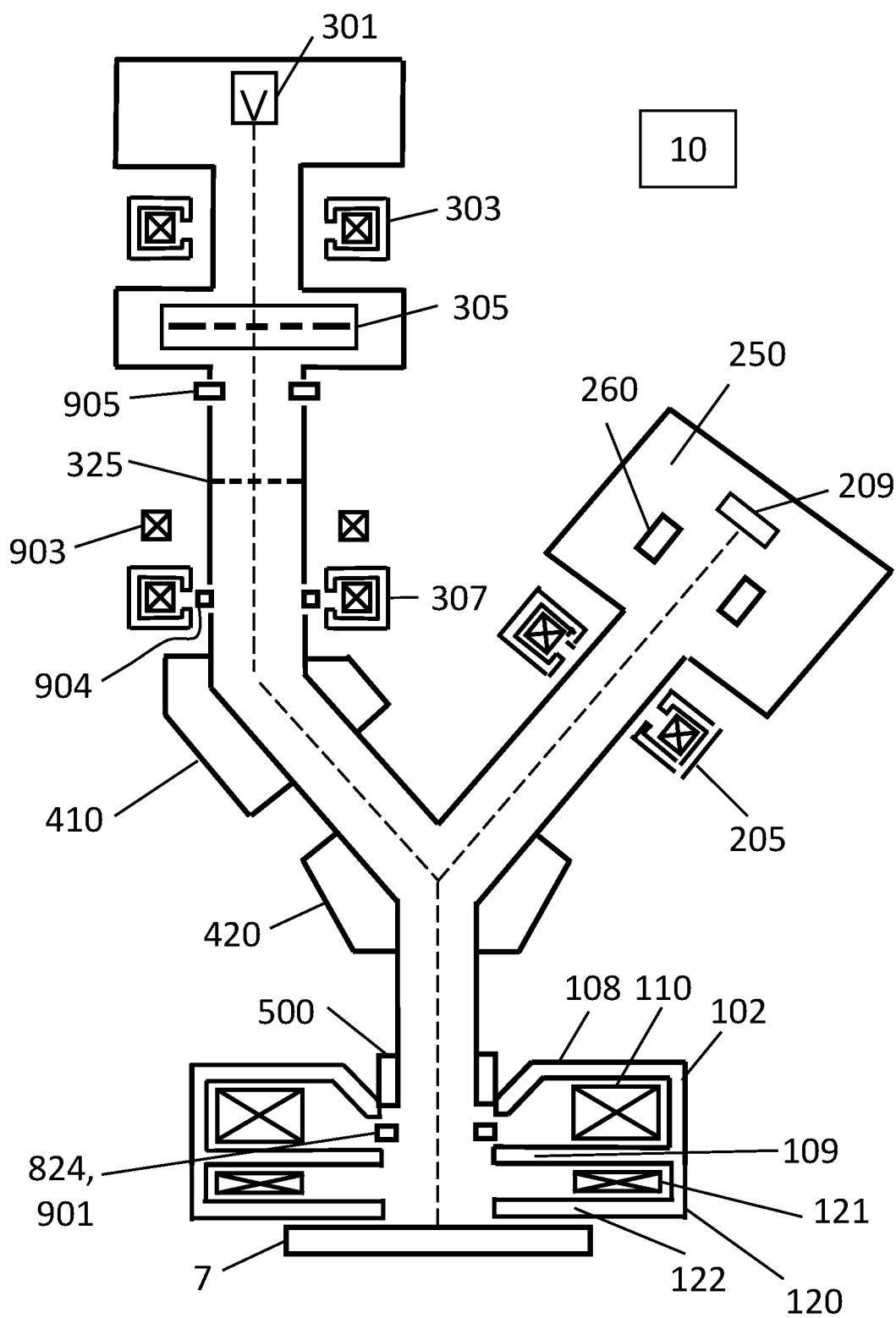
FIG. 22: schematically illustrates an embodiment of the disclosure with a multiplicity of fast autofocus correction lenses.

It was a surprise to find that the solution space is very small in the multiplicity of possible solutions. Two solutions could be ascertained. One of these solutions is illustrated in FIG. 22: FIG. 22 schematically illustrates an embodiment of the disclosure with a multiplicity of fast autofocus correction lenses 901, 903, 904 and 905. The fast autofocus correction lens 906 in the region of the intermediate image plane 325 is not required in this solution. The first fast autofocus correction lens 901 or 824 is provided in one part between the upper pole shoe 108 and the lower pole shoe 109. The fast magnetic lens 903 in the form of an air coil is mandatory in this solution. Moreover, a constraint to be satisfied is that the magnetic field compensation coil 120 draws the magnetic field on the sample 7 to zero. In the combination shown in FIG. 21, the fast autofocus correction lens 905 substantially sets the magnification. There substantially is a correction of the image field rotation via the third fast autofocus correction lens 903. There substantially is the correction of the radial landing angle via the fourth fast autofocus correction lens 904. The azimuthal landing angle is not explicitly adapted; however, its accuracy is sufficiently high and explicitly better than the accuracy that can be obtained for the radial landing angle, even in the case of a high-frequency correction.

Figure 23:
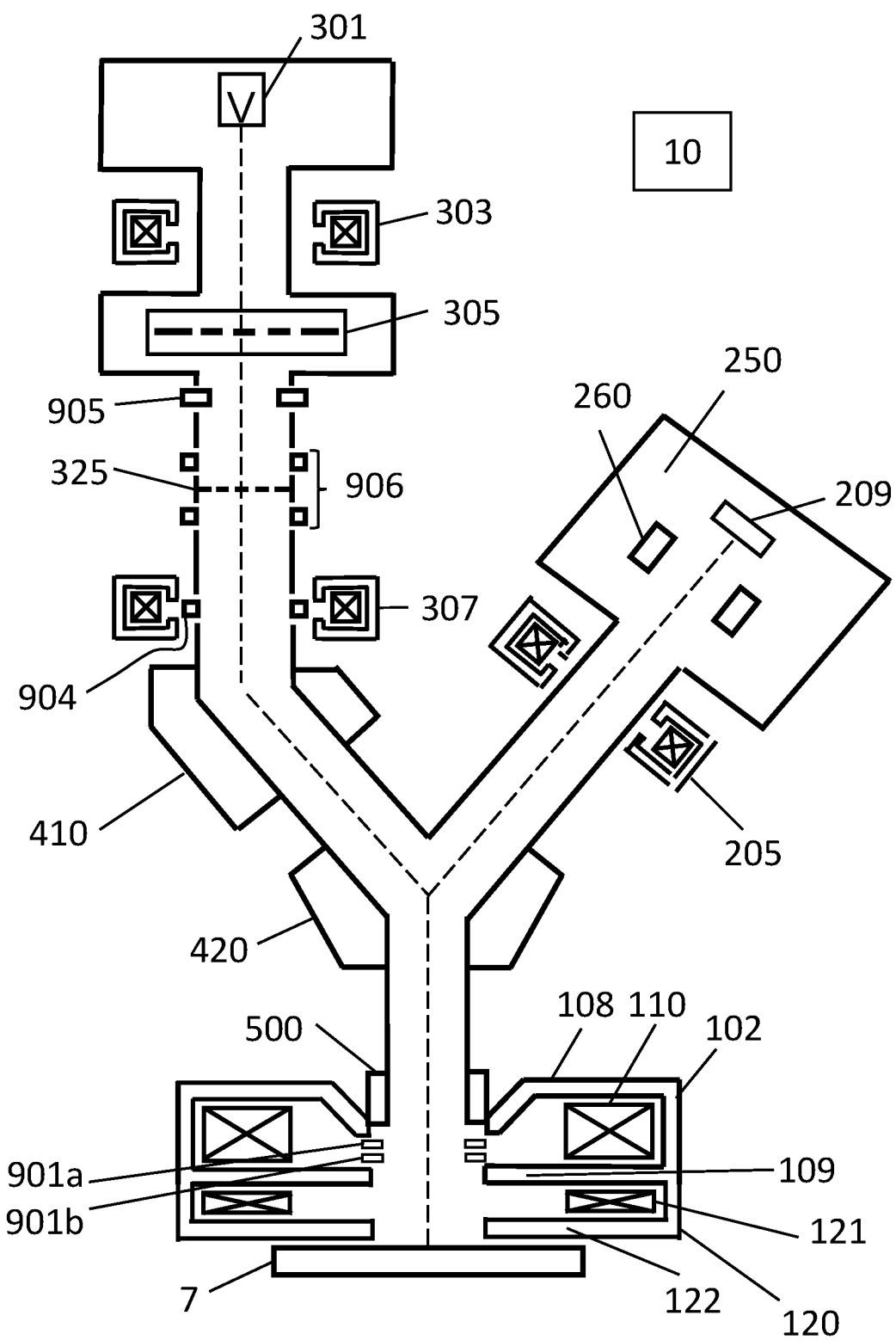
FIG. 23: schematically illustrates an embodiment of the disclosure with a multiplicity of fast autofocus correction lenses.

FIG. 23 schematically shows a further embodiment of the disclosure with a multiplicity of fast autofocus correction lenses 901, 904, 905 and 906. In the example shown, the first fast autofocus correction lens 901 has a two-part embodiment with the constituent parts 901a and 901b. In return, the third fast autofocus correction lens 903, which was embodied in the form of a fast magnetic lens in FIGS. 21 and 22, has been dispensed with. Especially distinguished solutions were also sought after for the setup shown in FIG. 23 using the aforementioned sensitivity matrix. In this case, the solution space is also very small.

Figure 24:
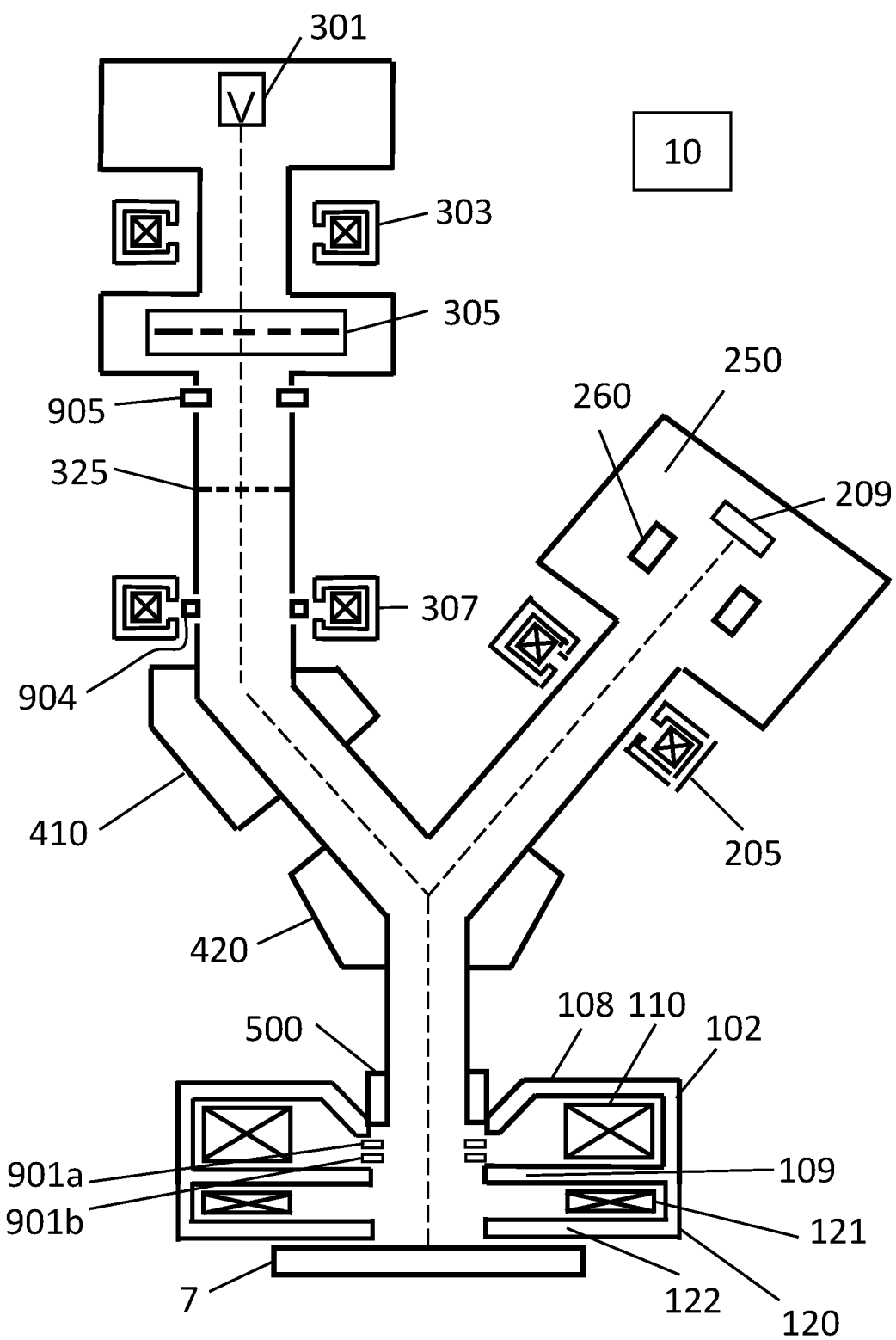
FIG. 24: schematically illustrates an embodiment of the disclosure with a multiplicity of fast autofocus correction lenses.

A particularly distinguished solution is illustrated in FIG. 24. It was found that the sixth fast autofocus correction lens 906 in the region of the intermediate image plane 325 does not supply a substantial contribution to the solution for this setup. Therefore, its implementation can also be dispensed with—as illustrated in FIG. 24. In the example shown, the focusing is substantially set by the first part 901a and the second part 901b of the first fast autofocus correction lens 901. The azimuthal position is substantially corrected by the second part 901b of the first fast autofocus correction lens 901, as described above in the general part of the patent application. The fifth fast autofocus correction lens 905 substantially facilitates an adjustment of the radial image position (adjustment of the enlargement). The fourth fast autofocus correction lens substantially corrects the radial landing angle. Like in the example illustrated in FIG. 22, there is no high-frequency correction of the azimuthal landing angle either; instead, the azimuthal landing angle is already set precise enough or set to zero once or in static fashion and/or in low-frequency fashion via the magnetic field compensation lens 122.

It should be emphasized that the particularly suitable solutions of the arrangements illustrated in FIGS. 22 and 24 supply adjustment options for the autofocus not only at a single working point but at the multiplicity of working points that come into question. Moreover, it is possible here to likewise re-correct the remaining beam parameters, or keep these constant, facilitating a multiplicity of interesting application options for the multiple particle beam system according to the disclosure.

Figure 25:
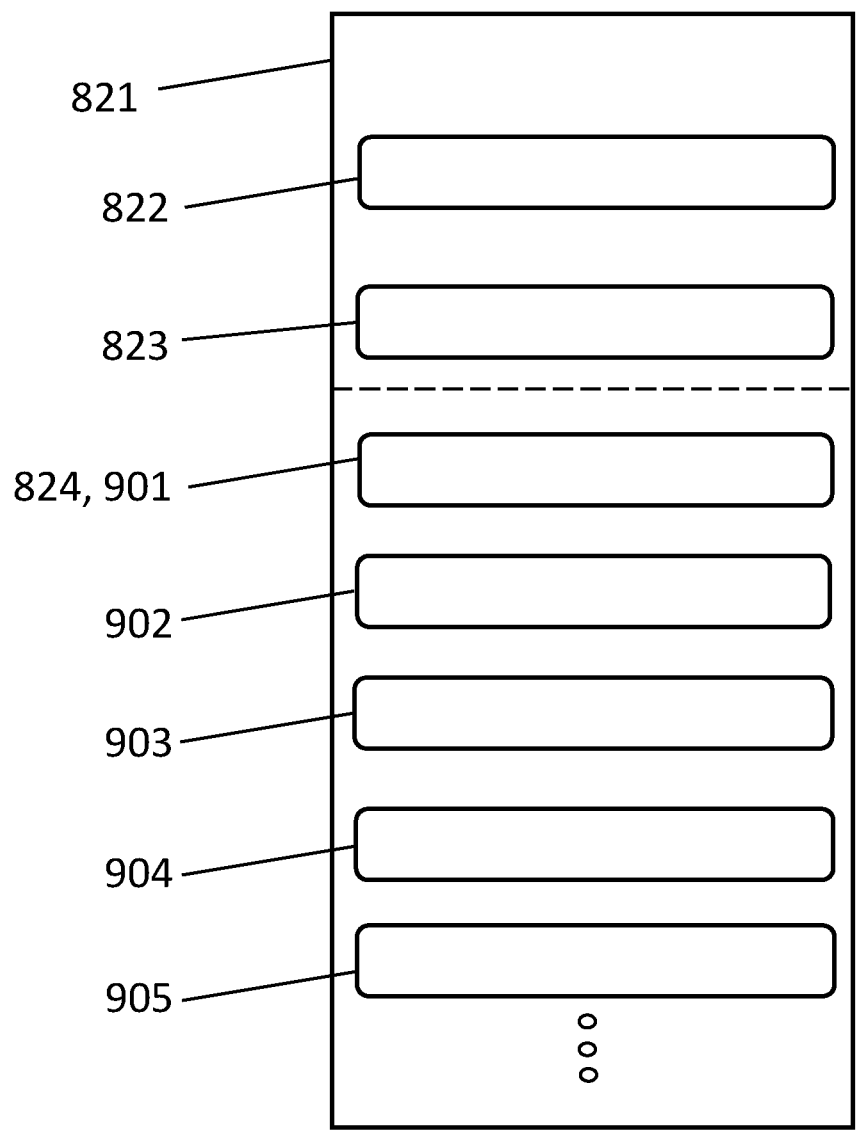
FIG. 25: shows a schematic illustration of an excerpt of a controller of the multi-beam particle microscope with a multiplicity of fast autofocus correction lenses.

FIG. 25 shows a schematic illustration of an excerpt of a controller of the multi-beam particle microscope with a multiplicity of fast autofocus correction lenses. In this case, the controller 821 of the fast autofocus, which is integrated in the controller 10 or the computer system 10, comprises various final controlling elements in addition to the measuring element or the autofocus determining element 822 and the autofocus algorithm 823. In the example shown, these final controlling elements are realized by the first fast autofocus correction lens 901 or 824 and by the further fast autofocus correction lenses 902, 903, 904, 905 and 906 and optionally by further fast autofocus correction lenses. The controller of the fast autofocus 821 illustrated in FIG. 25 can be integrated in analogous fashion in the overall controller 10, as has already been illustrated in FIG. 3. Therefore, reference is made to FIGS. 2 and 3 above in respect of further details.

Figure 26:
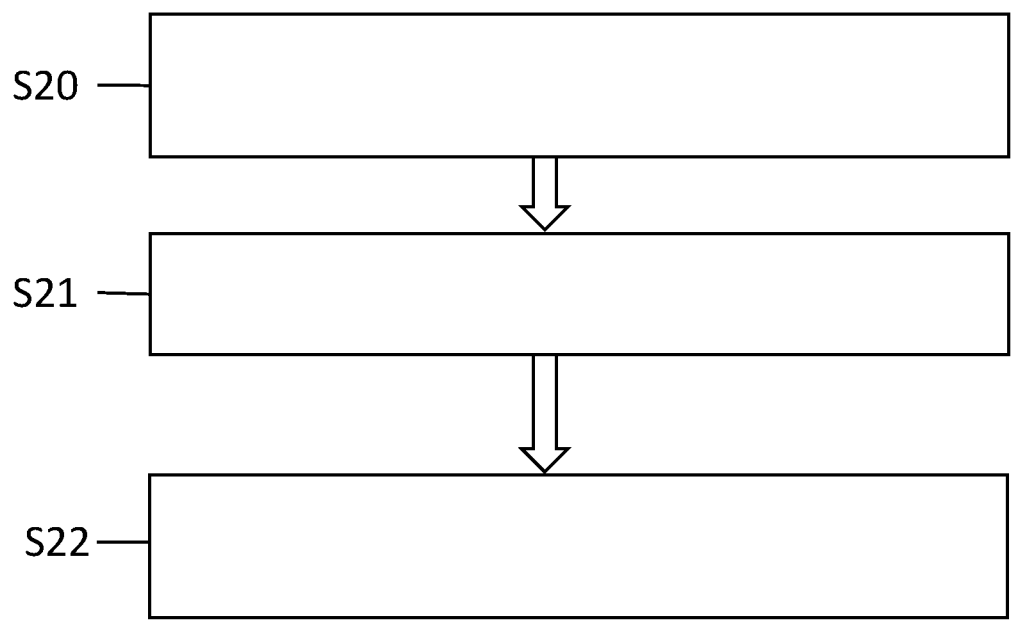
FIG. 26: schematically shows a workflow for fast autofocus correction.

FIG. 26 schematically illustrates a workflow for fast autofocus correction, which has further high precision adjustment options. In a first step S20, the autofocus correction lenses are adjusted, for example, on the basis of feedback and/or feedforward loops. This was already described in detail above in conjunction with the fast autofocus correction lenses 901 to 906.

Aberration correction mechanism can be set in a further step S21. These can be deflectors and/or stigmators, which are arranged in the first particle optical beam path, for example. By way of example, it is possible to arrange a fast electrostatic aberration correction mechanism upstream of each implemented fast autofocus correction lens 901, 902, 903, 904, 905, 906. This serves to keep the path of the individual particle beams constant to high precision when passing through the column. The fast aberration correction mechanism are controlled via the controller 10 already described above, to be precise in high-frequency fashion and optionally with use of multidimensional lookup tables for each working point. By way of example, the aberration correction mechanism can be realized in the form of an octupole which can be equally used as a deflector and/or else as a stigmator.

The scanning parameters are updated in a further method step S22. The desired scanning parameters may change slightly within the scope of the high-frequency correction of the autofocus and the other beam parameters. By way of example, these scanning parameters include pixel size, rotation, skew and/or quadradicity. Once again, these scanning parameters can be corrected for each working point in high-frequency fashion via lookup tables.

Figure 27:
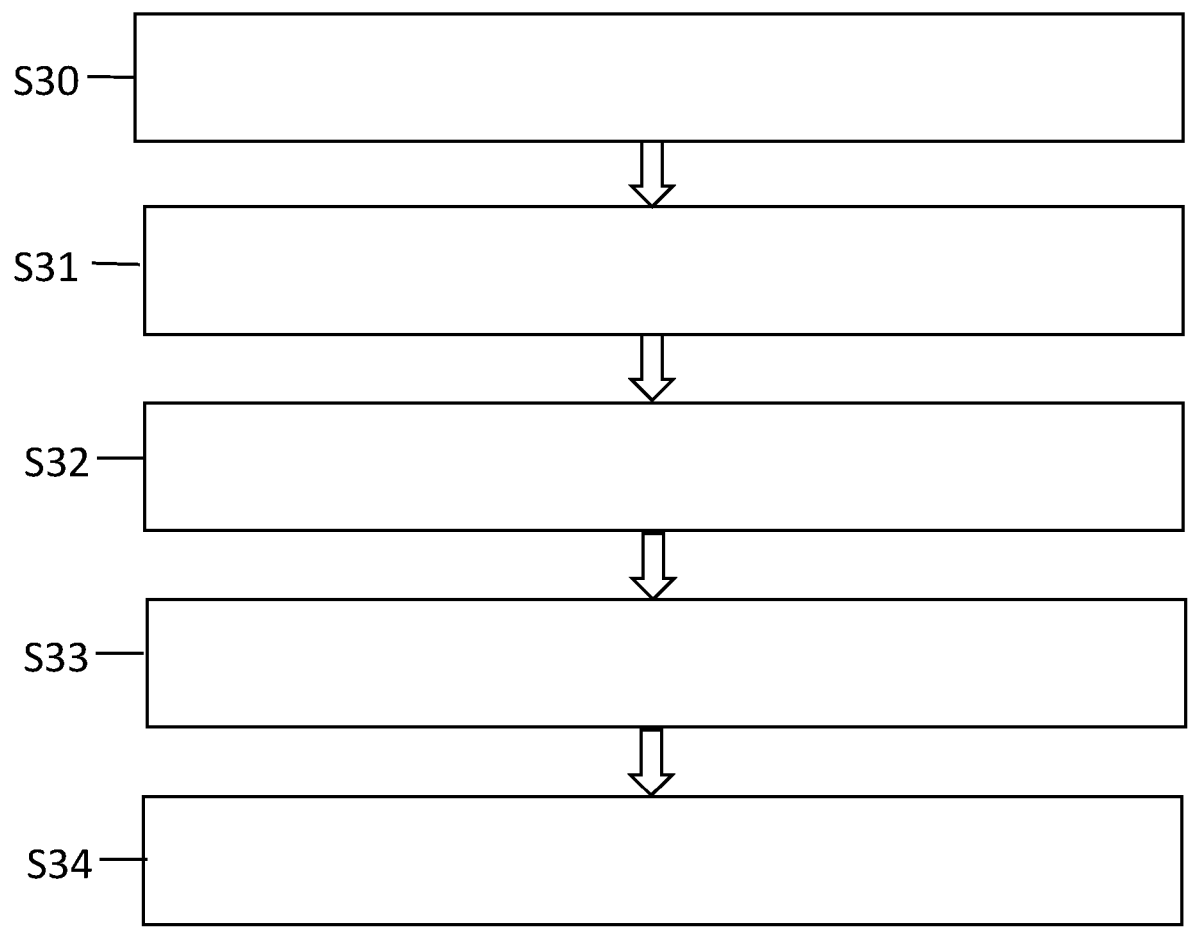
FIG. 27: schematically shows a workflow for fast autofocus correction in a multi-beam particle beam system, in which the fast autofocus correction is implemented as a hybrid system.

FIG. 27 schematically shows a workflow for fast autofocus correction in a multi-beam particle beam system, in which the fast autofocus correction is implemented as a hybrid system. According to a method step S30, the focus is physically set in the object plane 101 via at least one fast autofocus correction lens 901. This can be realized in one of the embodiment variants described in more detail above and can be implemented, for example, as a fast electrostatic lens in one part or in many parts, for example between the upper 108 and the lower pole shoe 109 of the objective lens 110. In a method step S31, the landing angle is physically set in the object plane 101 via at least one fast autofocus correction mechanism. This can be a fast autofocus correction lens or a plurality of fast autofocus correction lenses 824, for example the fourth fast autofocus correction lens 904. Thus, focus and landing angle are physically corrected, wherein at least the focus and the radial landing angle are corrected in high-frequency fashion. A low-frequency correction, i.e., once for the selected working point, is normally sufficient for the correction of the azimuthal landing angle.

In a further method step S32, the image field rotation in the object plane 101 is set via the scanning unit by quickly setting a counter rotation. In a further step S33, the magnification in the object plane 101 is likewise set via the scanning unit by quickly setting the pixel size. These two method steps S32 and S33 can easily be carried out quickly since the scan deflector 500 is easily controlled via the scanning unit. Optionally, there can also be fast adjustment of the scanning parameters of quadradicity and/or skew (not illustrated).

There is a purely computational compensation of an image displacement in a further method step S34. To this end, it is not necessary to change the obtained image data themselves; their tags are computationally adapted (metadata or position of pixel 1).

All the aforementioned explanations apply not only to fast autofocusing but also to fast auto-stigmation. By definition, focusing also comprises a stigmation within the scope of this application. In general, a stigmation can be physically equated to focusing in only one direction or with different focusings in different directions. In this context, reference is also made to fast multi-pole lenses which are described, for example, in the German patent application with application number 10 2020 107 738.6, filed on Mar. 20, 2020, which has not yet been laid open; the disclosure of the patent application is incorporated in the present patent application in full by reference.

The illustrated embodiments can be combined with one another in full or in part, provided that no technical contradictions arise as a result. Incidentally, the illustrated embodiments should not be construed as constrictive for the disclosure.

Further examples relating to the disclosure are listed below. These examples can be combined with the embodiments of the disclosure claimed in the patent claims provided no technical contradictions arise as a result.

Example 1: A multiple particle beam system for wafer inspection, comprising the following:
- a multi-beam particle generator, which is configured to generate a first field of a multiplicity of charged first individual particle beams;
- a first particle optical unit with a first particle optical beam path, which is configured to image the generated first individual particle beams onto a wafer surface in the object plane such that the first individual particle beams strike the wafer surface at incidence locations, which form a second field;
- a detection system with a multiplicity of detection regions that form a third field, a second particle optical unit with a second particle optical beam path, which is configured to image second individual particle beams, which emanate from the incidence locations in the second field, onto the third field of the detection regions of the detection system;
- a magnetic and/or electrostatic objective lens, in particular a magnetic and/or electrostatic immersion lens, through which both the first and the second individual particle beams pass;
- a beam switch, which is arranged in the first particle optical beam path between the multi-beam particle generator and the objective lens and which is arranged in the second particle optical beam path between the objective lens and the detection system;
- a sample stage for holding and/or positioning a wafer during the wafer inspection;
- an autofocus determining element, which is configured to generate data for determining actual autofocus data during the wafer inspection;
- a fast autofocus correction lens; and
- a controller;

wherein the controller is configured to control particle optical components in the first and/or in the second particle optical beam path, wherein the controller is configured for static or low-frequency adaptation of a focusing in order to control at least the objective lens and/or an actuator of the sample stage at a first working point with a first working distance, in such a way that the first individual particle beams are focused on the wafer surface situated at the first working distance, and wherein the controller is configured for high-frequency adaptation of the focusing in order to generate an autofocus correction lens control signal on the basis of the actual autofocus data at the first working point during the wafer inspection in order to control the fast autofocus correction lens during the wafer inspection at the first working point.

Example 2: The multiple particle beam system according to example 1, wherein an adaptation time TA for the high-frequency adaptation is shorter than the adaptation time TA for the low-frequency adaptation at least by a factor of 10, in particular at least by a factor of 100 or 1000.

Example 3: The multiple particle beam system according to either of the preceding examples, wherein a stroke for setting the working distance for the low-frequency or static adaptation is greater than the stroke for the high-frequency adaptation at least by a factor of 5, in particular by a factor of 8 and/or 10.

Example 4. The multiple particle beam system according to any one of the preceding examples, wherein a second working point is defined at least by a second working distance between the objective lens and the wafer surface and wherein the second working distance differs from the first working distance of the first working point, wherein the controller is configured to carry out a low-frequency adaptation in the case of a change between the first working point and the second working point and control at least the magnetic objective lens and/or an actuator of the sample stage at the second working point such that the first individual particle beams are focused on the wafer surface situated at the second working distance.

Example 5: The multiple particle beam system according to the preceding example, wherein the controller is configured to generate an autofocus correction lens control signal for high-frequency adaptations on the basis of the actual autofocus data at the second working point during the wafer inspection in order to control the fast autofocus correction lens during the wafer inspection at the second working point.

Example 6: The multiple particle beam system according to any one of the preceding examples, wherein the first and/or the second working point are furthermore defined by a landing angle of the first individual particle beams in the object plane and by a grid arrangement of the first individual particle beams in the object plane, and wherein the controller is furthermore configured to keep the landing angle and the grid arrangement substantially constant during the high-frequency adaptation at the first and/or second working point.

Example 7: The multiple particle beam system according to the preceding example, wherein the controller is configured to keep the landing angle and the grid arrangement substantially constant even during a change between the first working point and the second working point.

Example 8: The multiple particle beam system according to any one of the preceding examples, wherein the autofocus correction lens comprises a fast electrostatic lens.

Example 9: The multiple particle beam system according to example 8, wherein the autofocus correction lens is arranged in a crossover plane of the first individual particle beams.

Example 10: The multiple particle beam system according to example 8, wherein the autofocus correction lens is arranged between the wafer surface and a lower pole shoe of the magnetic objective lens.

Example 11: The multiple particle beam system according to example 8, wherein the autofocus correction lens is arranged between the upper and lower pole shoe of the magnetic objective lens.

Example 12: The multiple particle beam system according to example 8, wherein the autofocus correction lens is arranged in a beam tube extension, which protrudes into the objective lens from the direction of the upper pole shoe.

Example 13: The multiple particle beam system according to example 8, moreover comprising a beam deflection system between the beam switch and the objective lens which is configured to raster scan the wafer surface via a scanning movement of the individual particle beams, wherein the autofocus correction lens is realized as an offset on the beam deflection system.

Example 14: The multiple particle beam system according to example 8, moreover comprising a beam deflection system between the beam switch and the objective lens which is configured to raster scan the wafer surface via a scanning movement of the individual particle beams;

wherein the beam deflection system comprises an upper deflector and a lower deflector arranged in succession in the direction of the beam path; and wherein the autofocus correction lens is arranged between the upper deflector and the lower deflector.

Example 15: The multiple particle beam system according to example 8, moreover comprising a beam deflection system between the beam switch and the objective lens which is configured to raster scan the wafer surface via a scanning movement of the individual particle beams;

wherein the beam deflection system comprises an upper deflector and a lower deflector arranged in succession in the direction of the beam path; and wherein the autofocus correction lens is arranged between the lower deflector and an upper pole shoe of the magnetic objective lens.

Example 16: The multiple particle beam system according to example 8, moreover comprising a beam tube which is able to be evacuated and which substantially encloses the first particle optical beam path from the multi-beam particle generator to the objective lens, wherein the beam tube has an interruption and wherein the autofocus correction lens is arranged within this interruption.

Example 17: The multiple particle beam system according to example 16,
moreover comprising a field lens system which is arranged in the first particle optical beam path between the multi-beam particle generator and the beam switch,
wherein the interruption of the beam tube in which the autofocus correction lens is arranged is arranged between the field lens system and the beam switch.

Example 18: The multiple particle beam system according to example 16,
wherein the beam switch comprises two magnetic sectors and wherein the interruption of the beam tube in which the autofocus correction lens is arranged is provided in the region of the beam switch between the two magnetic sectors.

Example 19: The multiple particle beam system according to example 16,
moreover comprising a beam deflection system between the beam switch and the objective lens which is configured to raster scan the wafer surface via a scanning movement of the individual particle beams,
wherein the interruption of the beam tube in which the autofocus correction lens is arranged is provided between the beam switch and the beam deflection system.

Example 20: The multiple particle beam system according to example 16,
moreover comprising a field lens system which is arranged in the first particle optical beam path between the multi-beam particle generator and the beam switch,
wherein the interruption of the beam tube in which the autofocus correction lens is arranged is arranged within a magnetic field lens of the field lens system.

Example 21: The multiple particle beam system according to example 8,
moreover comprising a beam tube which is able to be evacuated and which substantially encloses the first particle optical beam path from the multi-beam particle generator to the objective lens,
wherein the autofocus correction lens is embodied as a tube lens and arranged within the beam tube.

Example 22: The multiple particle beam system according to example 21,
moreover comprising a field lens system which is arranged in the first particle optical beam path between the multi-beam particle generator and the beam switch,
wherein the autofocus correction lens is arranged between the field lens system and the beam switch within the beam tube.

Example 23: The multiple particle beam system according to example 21,
wherein the beam switch has two magnetic sectors and wherein the autofocus correction lens is provided between the two magnetic sectors within the beam tube.

Example 24: The multiple particle beam system according to example 21,
moreover comprising a beam deflection system between the beam switch and the objective lens which is configured to raster scan the wafer surface via a scanning movement of the individual particle beams,
wherein the autofocus correction lens is provided between the beam switch and the beam deflection system within the beam tube.

Example 25: The multiple particle beam system according to example 21,
moreover comprising a field lens system which is arranged in the first particle optical beam path between the multi-beam particle generator and the beam switch,
wherein the autofocus correction lens is arranged within a magnetic field lens within the beam tube.

Example 26: The multiple particle beam system according to any one of examples 1 to 7,
wherein the fast autofocus correction lens comprises a fast magnetic lens, in particular an air coil.

Example 27: The multiple particle beam system according to example 26,
moreover comprising a beam tube which is able to be evacuated and which substantially encloses the first particle optical beam path from the multi-beam particle generator to the objective lens,
wherein the fast magnetic lens is arranged outside around the beam tube.

Example 28: The multiple particle beam system according to example 27,
moreover comprising a field lens system which is arranged in the first particle optical beam path between the multi-beam particle generator and the beam switch,
wherein the fast magnetic lens is arranged between the field lens system and the beam switch around the beam tube.

Example 29: The multiple particle beam system according to example 27,
wherein the beam switch has two magnetic sectors and wherein the fast magnetic lens is arranged between the two magnetic sectors around the beam tube.

Example 30: The multiple particle beam system according to example 27,
moreover comprising a beam deflection system between the beam switch and the objective lens which is configured to raster scan the wafer surface via a scanning movement of the individual particle beams,
wherein the fast magnetic lens is arranged between the beam switch and the beam deflection system around the beam tube.

Example 31: The multiple particle beam system according to example 27,
moreover comprising a beam deflection system between the beam switch and the objective lens which is configured to raster scan the wafer surface via a scanning movement of the individual particle beams;
wherein the beam deflection system comprises an upper deflector and a lower deflector arranged in succession in the direction of the beam path; and
wherein the fast magnetic lens is arranged between the upper deflector and the lower deflector around the beam tube.

Example 32: The multiple particle beam system according to any one of the preceding examples,
wherein the multiple particle beam system furthermore comprises a fast telecentricity correction mechanism, which is configured to substantially contribute to correcting a tangential telecentricity error of the first individual particle beams in the second field, and
wherein the controller is set up to generate a telecentricity correction mechanism control signal for high-frequency adaptations at the respective working point during the wafer inspection on the basis of the actual autofocus data in order to control the fast telecentricity correction mechanism during the wafer inspection.

Example 33: The multiple particle beam system according to example 32, wherein the telecentricity correction mechanism comprises a first deflector array which is arranged in an intermediate image plane of the first particle optical beam path.

Example 34: The multiple particle beam system according to any one of the preceding examples,
wherein the multiple particle beam system furthermore comprises a fast rotation correction mechanism, which is configured to substantially contribute to correcting a rotation of the first individual particle beams in the second field, and
wherein the controller is set up to generate a rotation correction mechanism control signal for high-frequency adaptations on the basis of the actual autofocus data during the wafer inspection at the respective working point in order to control the fast rotation correction mechanism during the wafer inspection.

Example 35: The multiple particle beam system according to the preceding example,
wherein the rotation correction mechanism comprises an air coil.

Example 36: The multiple particle beam system according to examples 33 and 34,
wherein the rotation correction mechanism comprises a second deflector array, which is arranged, at a distance, directly upstream or downstream of the first deflector array.

Example 37: The multiple particle beam system according to examples 33 and 34,
wherein the rotation correction mechanism comprises a multi-lens array which is arranged, at a distance, directly upstream or downstream of the first deflector array and in such a way that the first individual particle beams pass through the multi-lens array in off-axis fashion.

Example 38: The multiple particle beam system according to example 34,
wherein the multi-beam particle generator comprises the fast rotation correction mechanism and the rotation correction mechanism is actively rotated by the rotation correction mechanism control signal.

Example 39: The multiple particle beam system according to example 34,
wherein the fast rotation correction mechanism comprises a first magnetic field generating device for a first weak magnetic field and a second magnetic field generating device for a second weak magnetic field, and
wherein the first magnetic field generating device is only controlled for a rotation in a positive rotation direction and the second magnetic field generating device is only controlled for a rotation in a negative rotation direction by the controller via the rotation correction mechanism control signal.

Example 40: The multiple particle beam system according to example 39,
wherein the first and the second magnetic field have an axial configuration and are arranged in a converging or diverging pencil of the first individual particle beams in the first particle optical beam path.

Example 41: The multiple particle beam system according to any one of the preceding examples,
wherein a maximum deviation of each individual particle beam from a desired landing position on the wafer surface is no more than 10 nm, in particular no more than 5 nm, 2 nm, 1 nm or 0.5 nm.

Example 42: The multiple particle beam system according to any one of the preceding examples,
wherein the controller is configured to carry out the determination of the autofocus correction lens control signal and/or the rotation correction mechanism control signal and/or the telecentricity correction mechanism control signal on the basis of the actual autofocus data using an inverted sensitivity matrix which describes the influence of control changes of particle optical components on particle optical parameters that characterize the particle optical imaging at the respective working point.

Example 43: The multiple particle beam system according to any one of the preceding examples,
wherein the controller is configured for a static or low-frequency adaptation of a focusing in the second particle optical beam path in order, at the respective working point with the associated working distance, to control particle optical components in the second particle optical beam path in such a way that the second individual particle beams, which emanate from the wafer surface situated at the respective working distance, are focused on the detection regions in the third field.

Example 44: The multiple particle beam system according to any one of the preceding examples,
wherein the multiple particle beam system furthermore comprises a fast projection path correction mechanism, which may have a multi-part embodiment and which is configured to undertake a high-frequency adaptation of the focus of the second individual particle beams, of the grid arrangement, of landing angles and/or of the contrast of the second individual particle beams upon incidence on the detection regions in the third field, and
wherein the controller is configured to generate a projection path control signal or a set of projection path control signals on the basis of the actual autofocus data during the wafer inspection at the respective working point in order to control the fast projection path correction mechanism.

Example 45: The multiple particle beam system according to any one of the preceding examples,
wherein the multiple particle beam system moreover comprises a projection path measuring element in order to generate projection path measurement data for characterizing the particle optical imaging in the secondary path during the wafer inspection,
wherein the multiple particle beam system furthermore comprises a fast projection path correction mechanism, which may have a multi-part embodiment and which is configured to undertake a high-frequency adaptation of the focus of the second individual particle beams, of the grid arrangement, of landing angles and/or of the contrast of the second individual particle beams upon incidence on the detection regions in the third field, and
wherein the controller is configured to generate a projection path control signal or a set of projection path control signals on the basis of the projection path measurement data during the wafer inspection at the respective working point in order to control the fast projection path correction mechanism.

Example 46: The multiple particle beam system according to either of the two examples 44 and 45,
wherein a contrast aperture stop is arranged in the second particle optical beam path in a crossover plane,
wherein the projection path correction mechanism comprises a fast contrast correction mechanism with at least one electrostatic deflector, at least one electrostatic lens and/or at least one electrostatic stigmator for influencing the particle optical beam path through the contrast aperture stop, and wherein the controller is configured to control the contrast correction mechanism with a contrast correction control signal or a set of contrast correction control signals, in such a way that a contrast of the second individual particle beams is kept substantially constant during the incidence on the detection regions in the third field.

Example 47: The multiple particle beam system according to any one of the preceding examples,
comprising a further autofocus correction lens or a plurality of further fast autofocus correction lenses.

Example 48: A multiple particle beam system for wafer inspection, comprising the following:
a multi-beam particle generator, which is configured to generate a first field of a multiplicity of charged first individual particle beams;
a first particle optical unit with a first particle optical beam path, which is configured to image the generated first individual particle beams onto a wafer surface in the object plane such that the first individual particle beams strike the wafer surface at incidence locations, which form a second field;
a detection system with a multiplicity of detection regions that form a third field;
a second particle optical unit with a second particle optical beam path, which is configured to image second individual particle beams, which emanate from the incidence locations in the second field, onto the third field of the detection regions of the detection system;
a magnetic and/or electrostatic objective lens, in particular a magnetic and/or electrostatic immersion lens, through which both the first and the second individual particle beams pass;
a beam switch, which is arranged in the first particle optical beam path between the multi-beam particle generator and the objective lens and which is arranged in the second particle optical beam path between the objective lens and the detection system;
a sample stage for holding and/or positioning a wafer during the wafer inspection;
an autofocus determining element, which is configured to generate data for determining actual autofocus data during the wafer inspection;
a fast autofocus correction lens; and
a controller;
wherein the controller is configured to control particle optical components in the first and/or in the second particle optical beam path,
wherein the controller is configured for static or low-frequency adaptation of a focusing in order to control at least the magnetic objective lens and/or an actuator of the sample stage at a first working point with a first working distance, in such a way that the first individual particle beams are focused on the wafer surface situated at the first working distance.

Example 49: A method for operating a multiple particle beam system, in particular a multiple particle beam system according to any one of the preceding examples 1 to 47, the method including the following steps:
generating measurement data at a first working point for a current focus in the object plane;
determining actual autofocus data on the basis of the measurement data;
determining an autofocus correction lens control signal on the basis of the actual autofocus data; and
controlling the fast autofocus correction lens, wherein the grid arrangement and the landing angle of the first individual particle beams are kept constant upon incidence on the object plane at the first working point.

Example 50: The method for operating a multiple particle beam system according to the preceding example,
wherein the fast autofocus correction lens comprises an electrostatic lens.

Example 51: The method for operating a multiple particle beam system according to either of examples 49 to 50, wherein the fast autofocus correction lens comprises a magnetic lens.

Example 52: The method for operating a multiple particle beam system according to any one of examples 49 to 51, furthermore including the following steps:
generating a telecentricity correction control signal on the basis of the actual autofocus data; and
controlling the fast telecentricity correction mechanism.

Example 53: The method for operating a multiple particle beam system according to any one of examples 49 to 52, furthermore including the following steps:
generating a rotation correction control signal on the basis of the actual autofocus data; and
controlling the fast rotation correction mechanism.

Example 54: The method for operating a multiple particle beam system according to any one of examples 49 to 53, furthermore including the following step:
orthogonalizing effects of the particle optical components which are used for the correction or corrections.

Example 55: The method for operating a multiple particle beam system according to any one of examples 49 to 54, furthermore including the following steps:
generating projection path measurement data for characterizing the particle optical imaging in the secondary path;
determining a projection path control signal on the basis of the projection path measurement data; and
controlling the fast projection path correction mechanism, which may have a multi-part embodiment, via the projection path control signal or via a set of protection path control signals, wherein the focus, the grid arrangement and the landing angle of the second individual particle beams upon incidence in the detection plane are kept constant at the first working point.

Example 56: The method for operating a multiple particle beam system according to any one of examples 49 to 55,
controlling a fast contrast correction mechanism via a contrast correction control signal or a set of contrast correction control signals and keeping the contrast constant in the detection plane.

Example 57: A multiple particle beam system for wafer inspection, in particular a multi-beam particle microscope, comprising a multiplicity of fast autofocus correction lenses for a high-frequency adaptation of beam parameters in the object plane.

Example 58: A multiple particle beam system for wafer inspection, in particular a multi-beam particle microscope, comprising an at least two-part autofocus correction lens for a high-frequency adaptation of beam parameters, in particular for a high-frequency adaptation of the focusing, in the object plane. Here, the parts of the multi-part autofocus correction lens are arranged spatially close together in the particle optical beam path, in particular directly in succession in the particle optical beam path.

Example 59: A multiple particle beam system for wafer inspection, in particular a multi-beam particle microscope, comprising exactly three fast autofocus correction lenses for a high-frequency adaptation of beam parameters in the object plane, wherein one of the autofocus correction lenses has a multi-part embodiment, in particular a two-part embodiment.

Example 60: A multiple particle beam system for wafer inspection, in particular a multi-beam particle microscope, comprising exactly four fast autofocus correction lenses for a high-frequency adaptation of beam parameters in the object plane.

Example 61: The multiple particle beam system for wafer inspection according to either of examples 59 and 60, moreover comprising a mechanism for setting a magnetic field in the object plane to zero.

Example 62: The multiple particle beam system for wafer inspection according to the preceding example, wherein the mechanism has a magnetic field compensation lens.

Example 63: The multiple particle beam system according to example 61, wherein the mechanism comprises an objective lens or an objective lens system, or consists thereof. Thus, this example does not necessarily require a magnetic field compensation lens since the magnetic field in the objective plane can be set sufficiently accurately to zero purely by way of the objective lens. This relates in particular to the operation of the multiple particle beam system for wafer inspection at only one working point.

Example 64: A multiple particle beam system for wafer inspection, in particular a multi-beam particle microscope, comprising a multiplicity of fast electrostatic aberration correction mechanism for keeping the path of individual particle beams constant to a very precise extent during the passage through the column.

Example 65: The multiple particle beam system for wafer inspection according to the preceding example, wherein the fast electrostatic aberration correction mechanism are arranged upstream of fast autofocus correction lenses in each case.

Example 66: A multiple particle beam system for wafer inspection, in particular a multi-beam particle microscope, comprising a controller configured to control a scanning unit in high-frequency fashion.

Example 67: The multiple particle beam system according to the preceding example,
wherein the scanning parameters of the pixel size, rotation, skew and/or quadraticity are corrected in high-frequency fashion by controlling the scanning unit.

Example 68: A multiple particle beam system for wafer inspection, comprising the following:
a multi-beam particle generator, which is configured to generate a first field of a multiplicity of charged first individual particle beams;
a first particle optical unit with a first particle optical beam path, which is configured to image the generated first individual particle beams onto a wafer surface in the object plane such that the first individual particle beams strike the wafer surface at incidence locations, which form a second field;
a detection system with a multiplicity of detection regions that form a third field,
a second particle optical unit with a second particle optical beam path, which is configured to image second individual particle beams, which emanate from the incidence locations in the second field, onto the third field of the detection regions of the detection system;
a magnetic and/or electrostatic objective lens, in particular a magnetic and/or electrostatic immersion lens, through which both the first and the second individual particle beams pass;
a beam switch, which is arranged in the first particle optical beam path between the multi-beam particle generator and the objective lens and which is arranged in the second particle optical beam path between the objective lens and the detection system;
a sample stage for holding and/or positioning a wafer during the wafer inspection;
an autofocus determining element, which is configured to generate data for determining actual autofocus data during the wafer inspection;
a first fast autofocus correction lens, which comprises a fast electrostatic lens and which is arranged between the upper pole shoe and the lower pole shoe of the objective lens, wherein the first fast autofocus correction lens comprises an at least two-part first autofocus correction lens; and
a controller;
wherein the controller is configured to control particle optical components in the first and/or in the second particle optical beam path,
wherein the controller is configured for static or low-frequency adaptation of a focusing in order to control at least the objective lens and/or an actuator of the sample stage at a first working point with a first working distance, in such a way that the first individual particle beams are focused on the wafer surface situated at the first working distance, and
wherein the controller is configured for high-frequency adaptation of the focusing in order to generate a first autofocus correction lens control signal on the basis of the actual autofocus data at the first working point during the wafer inspection in order to control the first fast autofocus correction lens during the wafer inspection at the first working point.

Example 69: The multiple particle beam system according to the preceding example,
wherein the first fast autofocus correction lens is integrated into a beam tube extension, which protrudes into the objective lens from the direction of the upper pole shoe.

Example 70: The multiple particle beam system according to the preceding example,
wherein the beam tube extension has two interruptions and
wherein one part of the two-part first fast autofocus correction lens is arranged in each of the two interruptions.

Example 71: The multiple particle beam system according to example 69,
wherein the two parts of the two-part first autofocus correction lens are each embodied as a tube lens and arranged within the beam tube extension.

Example 72: The multiple particle beam system according to any one of preceding examples 68 to 71,
wherein the controller is configured to control the two parts of the first autofocus correction lens with voltages of the same or opposite signs via the autofocus correction lens control signal.

Example 73: The multiple particle beam system according to the preceding example,
wherein a high-frequency correction of the image field rotation is implemented substantially additionally to the high-frequency adaptation of the focusing via the control of the two parts of the first autofocus correction lens.

Example 74: A multiple particle beam system for wafer inspection, comprising the following:

a multi-beam particle generator, which is configured to generate a first field of a multiplicity of charged first individual particle beams;

a first particle optical unit with a first particle optical beam path, which is configured to image the generated first individual particle beams onto a wafer surface in the object plane such that the first individual particle beams strike the wafer surface at incidence locations, which form a second field;

a detection system with a multiplicity of detection regions that form a third field;

a second particle optical unit with a second particle optical beam path, which is configured to image second individual particle beams, which emanate from the incidence locations in the second field, onto the third field of the detection regions of the detection system;

a magnetic and/or electrostatic objective lens, in particular a magnetic and/or electrostatic immersion lens, through which both the first and the second individual particle beams pass;

a beam switch, which is arranged in the first particle optical beam path between the multi-beam particle generator and the objective lens and which is arranged in the second particle optical beam path between the objective lens and the detection system;

a field lens system with at least one magnetic field lens, arranged in the first particle optical beam path between the multi-beam particle generator and the beam switch;

a sample stage for holding and/or positioning a wafer during the wafer inspection;

an autofocus determining element, which is configured to generate data for determining actual autofocus data during the wafer inspection;

a first fast autofocus correction lens, which comprises a fast electrostatic lens and which is arranged between the upper and the lower pole shoe of the magnetic objective lens;

a second fast autofocus correction lens, which comprises a fast electrostatic lens and which is arranged within a magnetic field of the field lens system; and a controller;

wherein the controller is configured to control particle optical components in the first and/or in the second particle optical beam path, wherein the controller is configured for static or low-frequency adaptation of a focusing in order to control at least the objective lens and/or an actuator of the sample stage at a first working point with a first working distance, in such a way that the first individual particle beams are focused on the wafer surface situated at the first working distance, wherein the controller is configured for high-frequency adaptation of the focusing in order to generate a first autofocus correction lens control signal on the basis of the actual autofocus data at the first working point during the wafer inspection in order to control the first fast autofocus correction lens during the wafer inspection at the first working point; and wherein the controller is configured to generate a second autofocus correction lens control signal on the basis of the actual autofocus data during the wafer inspection in order to control the second fast autofocus correction lens in high-frequency fashion during the wafer inspection at the working point.

Example 75: The multiple particle beam system according to the preceding example, wherein substantially a high-frequency correction of the image field rotation is implemented via controlling the second fast autofocus correction lens.

Example 76: A multiple particle beam system for wafer inspection, comprising the following:

a multi-beam particle generator, which is configured to generate a first field of a multiplicity of charged first individual particle beams;

a first particle optical unit with a first particle optical beam path, which is configured to image the generated first individual particle beams onto a wafer surface in the object plane such that the first individual particle beams strike the wafer surface at incidence locations, which form a second field;

a detection system with a multiplicity of detection regions that form a third field;

a second particle optical unit with a second particle optical beam path, which is configured to image second individual particle beams, which emanate from the incidence locations in the second field, onto the third field of the detection regions of the detection system;

a magnetic and/or electrostatic objective lens, in particular a magnetic and/or electrostatic immersion lens, through which both the first and the second individual particle beams pass;

a beam switch, which is arranged in the first particle optical beam path between the multi-beam particle generator and the objective lens and which is arranged in the second particle optical beam path between the objective lens and the detection system;

a beam tube which is able to be evacuated and which substantially encloses the first particle optical beam path from the multi-beam particle generator to the objective lens;

a sample stage for holding and/or positioning a wafer during the wafer inspection;

an autofocus determining element, which is configured to generate data for determining actual autofocus data during the wafer inspection;

a first fast autofocus correction lens, which comprises a fast electrostatic lens and which is arranged between the upper and the lower pole shoe of the magnetic objective lens; and a third fast autofocus correction lens which comprises a fast magnetic lens, in particular an air coil, and which is arranged outside around the beam tube in the first particle optical beam path and arranged in a position that is substantially magnetic field-free; and a controller;

wherein the controller is configured to control particle optical components in the first and/or in the second particle optical beam path, wherein the controller is configured for static or low-frequency adaptation of a focusing in order to control at least the objective lens and/or an actuator of the sample stage at a first working point with a first working distance, in such a way that the first individual particle beams are focused on the wafer surface situated at the first working distance, wherein the controller is configured for high-frequency adaptation of the focusing in order to generate a first autofocus correction lens control signal on the basis of the actual autofocus data at the first working point during the wafer inspection in order to control the first fast autofocus correction lens during the wafer inspection at the first working point; and wherein the controller is configured to generate a third autofocus correction lens control signal on the basis of the actual autofocus data during the wafer inspection in order to control the third fast autofocus correction lens in high-frequency fashion during the wafer inspection at the respective working point.

Example 77: The multiple particle beam system according to the preceding example,
wherein the first particle optical beam path has an intermediate image plane and
wherein the third fast autofocus correction lens is arranged just downstream of this intermediate image plane in the direction of the particle optical beam path.

Example 78: The multiple particle beam system according to either of examples 76 and 77,
wherein substantially a high-frequency correction of the azimuthal position of the individual particle beams in the object plane is implemented via controlling the third fast autofocus correction lens.

Example 79: The multiple particle beam system according to any one of preceding examples 68 to 78, furthermore comprising the following:
a fourth fast autofocus correction lens, which comprises a fast electrostatic lens,
wherein the fourth fast autofocus correction lens is arranged within a magnetic field of the field lens system and
wherein the controller is configured to generate a fourth autofocus correction lens control signal on the basis of the actual autofocus data during the wafer inspection in order to control the fourth fast autofocus correction lens in high-frequency fashion during the wafer inspection at the respective working point.

Example 80: The multiple particle beam system according to the preceding example,
wherein substantially a high-frequency correction of the radial landing angle of the individual particle beams in the object plane is implemented via controlling the fourth fast autofocus correction lens.

Example 81: The multiple particle beam system as claimed in any one of preceding examples 68 to 80, furthermore comprising the following:
a fifth fast autofocus correction lens, which comprises a fast electrostatic lens,
wherein the fifth fast autofocus correction lens is arranged at the multi-beam particle generator; and
wherein the controller is configured to generate a fifth autofocus correction lens control signal on the basis of the actual autofocus data during the wafer inspection in order to control the fifth fast autofocus correction lens in high-frequency fashion during the wafer inspection at the respective working point.

Example 82: The multiple particle beam system according to the preceding example,
wherein the multi-beam particle generator comprises a multi-lens array with a multi-aperture plate and a counter electrode and wherein the fifth fast autofocus correction lens is realized as an offset voltage that is able to be applied to the counter electrode.

Example 83: The multiple particle beam system according to example 81,
wherein the multi-beam particle generator comprises a multi-lens array with a multi-aperture plate and a counter electrode and wherein the fifth fast autofocus correction lens is realized as an additional electrode which is arranged between the multi-aperture plate and the counter electrode or just downstream of the counter electrode in relation to the particle optical beam path.

Example 84: The multiple particle beam system according to any one of examples 81 to 83,
wherein substantially a high-frequency correction of the radial position of the individual particle beams in the object plane is implemented via controlling the fifth fast autofocus correction lens.

Example 85: The multiple particle beam system as claimed in any one of preceding examples 68 to 84, furthermore comprising the following:
a sixth fast autofocus correction lens, which comprises a fast electrostatic lens,
wherein the sixth fast autofocus correction lens is embodied in the vicinity of an intermediate image plane as a two-part lens, the first part of which is arranged upstream of the intermediate image plane and the second part of which is arranged downstream of the intermediate image plane, as viewed in the direction of the particle optical beam path, and
wherein the controller is configured to generate a sixth autofocus correction lens control signal on the basis of the actual autofocus data during the wafer inspection in order to control the sixth fast autofocus correction lens in high-frequency fashion during the wafer inspection at the respective working point.

Example 86: The multiple particle beam system according to the preceding example,
wherein the sixth fast autofocus correction lens is provided with a bias.

Example 87: The multiple particle beam system according to any one of preceding examples 68 to 86, furthermore comprising the following:
a magnetic field compensation lens, which comprises a magnetic lens,
wherein the magnetic field compensation lens is arranged between the objective lens and the object plane and
wherein the controller is configured to control the magnetic field compensation lens with a magnetic field compensation control signal in static or low-frequency fashion, in such a way that the magnetic field in the object plane takes the value of zero.

Example 88: The multiple particle beam system according to the preceding example,
wherein the magnetic field compensation lens is coupled to the objective lens.

Example 89: A multiple particle beam system for wafer inspection, comprising the following:
a multi-beam particle generator, which is configured to generate a first field of a multiplicity of charged first individual particle beams;
a first particle optical unit with a first particle optical beam path, which is configured to image the generated first individual particle beams onto a wafer surface in the object plane such that the first individual particle beams strike the wafer surface at incidence locations, which form a second field;
a detection system with a multiplicity of detection regions that form a third field;
a second particle optical unit with a second particle optical beam path, which is configured to image second individual particle beams, which emanate from the incidence locations in the second field, onto the third field of the detection regions of the detection system;

a magnetic and/or electrostatic objective lens, in particular a magnetic and/or electrostatic immersion lens, through which both the first and the second individual particle beams pass;
a beam switch, which is arranged in the first particle optical beam path between the multi-beam particle generator and the objective lens and which is arranged in the second particle optical beam path between the objective lens and the detection system;
a field lens system with at least one magnetic field lens, arranged in the first particle optical beam path between the multi-beam particle generator and the beam switch;
a sample stage for holding and/or positioning a wafer during the wafer inspection;
an autofocus determining element, which is configured to generate data for determining actual autofocus data during the wafer inspection;
a first fast autofocus correction lens, which comprises a fast electrostatic lens and which is arranged between the upper pole shoe and the lower pole shoe of the objective lens, wherein the first fast autofocus correction lens comprises an at least two-part first autofocus correction lens;
a fourth fast autofocus correction lens, which comprises a fast electrostatic lens arranged within a magnetic field of a magnetic lens of the field lens system;
a fifth fast autofocus correction lens, which is arranged at the multi-beam particle generator;
a magnetic field compensation lens, which comprises a magnetic lens and which is arranged between the objective lens and the object plane and
a controller;
wherein the controller is configured to control particle optical components in the first and/or in the second particle optical beam path,
wherein the controller is configured for static or low-frequency adaptation of a focusing in order to control at least the objective lens and/or an actuator of the sample stage at a first working point with a first working distance, in such a way that the first individual particle beams are focused on the wafer surface situated at the first working distance,
wherein the controller is configured to control the magnetic field compensation lens with a magnetic field compensation control signal in static or low-frequency fashion, in such a way that the magnetic field in the object plane takes the value of zero;
wherein the controller is configured to generate a first autofocus correction lens control signal on the basis of the actual autofocus data during the wafer inspection in order to control the at least two-part fast autofocus correction lens via the first autofocus correction lens control signal with voltages of different signs in high-frequency fashion during the wafer inspection at the respective working point;
wherein the controller is configured to generate a fourth autofocus correction lens control signal on the basis of the actual autofocus data during the wafer inspection in order to control the fourth fast autofocus correction lens in high-frequency fashion during the wafer inspection at the respective working point; and
wherein the controller is configured to generate a fifth autofocus correction lens control signal on the basis of the actual autofocus data during the wafer inspection in order to control the fifth fast autofocus correction lens in high-frequency fashion during the wafer inspection at the respective working point.

Example 90: A multiple particle beam system for wafer inspection, comprising the following:
a multi-beam particle generator, which is configured to generate a first field of a multiplicity of charged first individual particle beams;
a first particle optical unit with a first particle optical beam path, which is configured to image the generated first individual particle beams onto a wafer surface in the object plane such that the first individual particle beams strike the wafer surface at incidence locations, which form a second field;
a detection system with a multiplicity of detection regions that form a third field;
a second particle optical unit with a second particle optical beam path, which is configured to image second individual particle beams, which emanate from the incidence locations in the second field, onto the third field of the detection regions of the detection system;
a magnetic and/or electrostatic objective lens, in particular a magnetic and/or electrostatic immersion lens, through which both the first and the second individual particle beams pass;
a beam switch, which is arranged in the first particle optical beam path between the multi-beam particle generator and the objective lens and which is arranged in the second particle optical beam path between the objective lens and the detection system;
a field lens system with at least one magnetic field lens, arranged in the first particle optical beam path between the multi-beam particle generator and the beam switch;
a beam tube which is able to be evacuated and which substantially encloses the first particle optical beam path from the multi-beam particle generator to the objective lens;
a sample stage for holding and/or positioning a wafer during the wafer inspection;
an autofocus determining element, which is configured to generate data for determining actual autofocus data during the wafer inspection;
a first fast autofocus correction lens, which comprises an in particular one-part fast electrostatic lens and which is arranged between the upper pole shoe and the lower pole shoe of the objective lens;
a third fast autofocus correction lens, wherein the third fast autofocus correction lens comprises a fast magnetic lens, in particular an air coil and is arranged outside around the beam tube in the first particle optical beam path and arranged in a position that is substantially field-free;
a fourth fast autofocus correction lens, which comprises a fast electrostatic lens arranged within a magnetic field of a magnetic lens of the field lens system;
a fifth fast autofocus correction lens, which is arranged at the multi-beam particle generator;
a magnetic field compensation lens, which comprises a magnetic lens and which is arranged between the objective lens and the object plane and
a controller;
wherein the controller is configured to control particle optical components in the first and/or in the second particle optical beam path,
wherein the controller is configured for static or low-frequency adaptation of a focusing in order to control at least the objective lens and/or an actuator of the sample stage at a first working point with a first working distance, in such a way that the first individual particle beams are focused on the wafer surface situated at the first working distance, wherein the controller is configured to control the magnetic field compensation lens with a magnetic field compensation control signal in static or low-frequency fashion, in such a way that the magnetic field in the object plane takes the value of zero;

wherein the controller is configured to generate a first autofocus correction lens control signal on the basis of the actual autofocus data during the wafer inspection in order to control the first fast autofocus correction lens via the first autofocus correction lens control signal in high-frequency fashion during the wafer inspection at the respective working point;

wherein the controller is configured to generate a third autofocus correction lens control signal on the basis of the actual autofocus data during the wafer inspection in order to control the third fast autofocus correction lens in high-frequency fashion during the wafer inspection at the respective working point;

wherein the controller is configured to generate a fourth autofocus correction lens control signal on the basis of the actual autofocus data during the wafer inspection in order to control the fourth fast autofocus correction lens in high-frequency fashion during the wafer inspection at the respective working point; and wherein the controller is configured to generate a fifth autofocus correction lens control signal on the basis of the actual autofocus data during the wafer inspection in order to control the fifth fast autofocus correction lens in high-frequency fashion during the wafer inspection at the respective working point.

Example 91: The multiple particle beam system according to examples 89 and 90, wherein the system is configured to keep the beam parameters of focus, landing angle and grid arrangement in the object plane constant via the high-frequency corrections.

Example 92: The multiple particle beam system according to any one of preceding examples 68 to 91, wherein the controller is configured to carry out the determination of the autofocus correction lens control signals on the basis of the actual autofocus data using an inverted sensitivity matrix which describes the influence of control changes of particle optical components on particle optical parameters that characterize the particle optical imaging at the respective working point.

Example 93: The multiple particle beam system according to any one of preceding examples 68 to 92, wherein the controller is configured to determine the autofocus correction lens control signals using multi-dimensional lookup tables.

Example 94: The multiple particle beam system according to any one of preceding examples 68 to 93, furthermore comprising the following:

a hysteresis correction measuring element in the second particle optical beam path in order to generate hysteresis correction measurement data for characterizing the particle optical imaging in the object plane following a low-frequency change in the control of at least one magnetic lens in the first particle optical beam path, in particular following a change in the working distance, with otherwise unchanged settings in the second particle optical beam path, wherein the controller is configured to generate a hysteresis correction control signal on the basis of the hysteresis control measurement data during the wafer inspection in order to correct at least one autofocus correction lens control signal in high-frequency fashion at the respective working point.

Example 95: The multiple particle-beam system according to the preceding example, wherein the hysteresis correction measuring element comprises a CCD camera in the second particle optical beam path.

Example 96: The multiple particle beam system according to any one of examples 94 to 95, wherein the hysteresis correction control signal realizes a correction of the beam parameters of radial position and/or azimuthal position in the object plane.

Example 97: The multiple particle beam system according to any one of preceding examples 68 to 96, furthermore comprising the following:

at least one fast electrostatic aberration correction mechanism, which is arranged in the particle optical beam path upstream of a fast autofocus correction lens, in particular upstream of each implemented fast autofocus correction lens, and which is set up to keep the path of the individual particle beams during the passage through the column constant in highly precise fashion, wherein the controller is configured to generate an aberration correction control signal during the wafer inspection in order to control the one fast aberration correction mechanism or the fast aberration correction mechanism at the respective working point in high-frequency fashion.

Example 98: The multiple particle beam system according to the preceding example, wherein the aberration correction mechanism comprises an electrode arrangement in the form of an octupole.

Example 99: The multiple particle beam system according to any one of preceding examples 68 to 98, furthermore comprising the following:

a fast electrostatic aberration correction mechanism, wherein the aberration correction mechanism is arranged in the first particle optical beam path upstream of the crossover of the first individual particle beams and is set up to keep the position of the individual particle beams constant in highly precise fashion for the purposes of forming the crossover and wherein the controller is configured to generate an aberration correction control signal during the wafer inspection in order to control the fast aberration correction mechanism at the respective working point in high-frequency fashion.

Example 100: The multiple particle beam system according to any one of preceding examples 68 to 99, furthermore comprising the following:

a scanning unit and a beam deflection system between the beam switch and the objective lens, the beam deflection system being configured to raster-scan the wafer surface by way of a scanning movement of the individual particle beams and being able to be controlled via the scanning unit;

wherein the controller is set up to control the scanning unit via a scanning unit control signal during the wafer inspection at the respective working point and to correct the scanning unit control signal on the basis of the actual autofocus data at the respective working point in high-frequency fashion.

Example 101: The multiple particle beam system according to the preceding example, wherein the scanning parameters of the pixel size, rotation, skew and/or quadraticity are corrected in high-frequency fashion via lookup tables.

Example 102: A multiple particle beam system for wafer inspection, comprising the following:
- a multi-beam particle generator, which is configured to generate a first field of a multiplicity of charged first individual particle beams;
- a first particle optical unit with a first particle optical beam path, which is configured to image the generated first individual particle beams onto a wafer surface in the object plane such that the first particle beams strike the wafer surface at incidence locations, which form a second field;
- a detection system with a multiplicity of detection regions that form a third field;
- a second particle optical unit with a second particle optical beam path, which is configured to image second individual particle beams, which emanate from the incidence locations in the second field, onto the third field of the detection regions of the detection system;
- a magnetic and/or electrostatic objective lens, in particular a magnetic and/or electrostatic immersion lens, through which both the first and the second individual particle beams pass;
- a beam switch, which is arranged in the first particle optical beam path between the multi-beam particle generator and the objective lens and which is arranged in the second particle optical beam path between the objective lens and the detection system;
- a sample stage for holding and/or positioning a wafer during the wafer inspection;
- an autofocus determining element, which is configured to generate data for determining actual autofocus data during the wafer inspection;
- a scanning unit;
- fast autofocus correction mechanism, in particular fast autofocus correction lenses; and
- a controller;
- wherein the controller is configured to control particle optical components in the first and/or in the second particle optical beam path,
- wherein the controller is configured for static or low-frequency adaptation of a focusing in order to control at least the objective lens and/or an actuator of the sample stage at a first working point with a first working distance, in such a way that the first individual particle beams are focused on the wafer surface situated at the first working distance,
- wherein the controller is set up to undertake a high-frequency correction of the beam parameters of focus and landing angle in the object plane via the fast autofocus correction mechanism, in particular via the fast autofocus correction lenses, and to undertake a high-frequency correction of the beam parameters of magnification and image field rotation in the object plane via high-frequency control of the scanning unit.

Example 103: The multiple particle beam system according to example 102,
- wherein a change in the image field rotation of the individual particle beams in the object plane is compensated by setting the rotation via the scanning unit and
- wherein a change in the magnification in the object plane is corrected by setting the pixel size via the scanning unit.

Example 104: The multiple particle beam system according to the preceding example,
- wherein an image displacement of the individual particle beams in the object plane is corrected purely by computation via the controller.

Example 105: The multiple particle beam system according to any one of examples 102 to 104,
- wherein the system is set up to undertake a high-frequency correction of beam parameters via fast autofocus correction mechanism, in particular via fast autofocus correction lenses, only downstream of the crossover in relation to the particle optical beam path.

Example 106: A method for operating a multiple particle beam system, in particular a multiple particle beam system according to any one of the preceding examples 68 to 105, the method including the following steps:
- generating data at a first working point for a current focus in the object plane;
- determining actual autofocus data on the basis of the data;
- generating a first autofocus correction lens control signal on the basis of the actual autofocus data and controlling the first fast autofocus correction lens in high-frequency fashion; and/or
- generating a second fast autofocus correction lens control signal on the basis of the actual autofocus data and controlling the second fast autofocus correction lens in high-frequency fashion; and/or
- generating a third fast autofocus correction lens control signal on the basis of the actual autofocus data and controlling the third fast autofocus correction lens in high-frequency fashion; and/or
- generating a fourth fast autofocus correction lens control signal on the basis of the actual autofocus data and controlling the fourth fast autofocus correction lens in high-frequency fashion; and/or
- generating a fifth fast autofocus correction lens control signal on the basis of the actual autofocus data and controlling the fifth fast autofocus correction lens in high-frequency fashion; and/or
- generating a sixth fast autofocus correction lens control signal on the basis of the actual autofocus data and controlling the sixth fast autofocus correction lens in high-frequency fashion;
- wherein the controlling of one or more of the fast autofocus correction lenses keeps the focusing in the object plane constant at the first working point.

Example 107: The method for operating a multiple particle beam system according to the preceding example,
- wherein the landing angle, the rotation and/or the position of the first individual particle beams in the object plane are also kept constant at the first working point.

Example 108: The method for operating a multiple particle beam system according to any one of examples 106 to 107,
- wherein the fast autofocus correction lens comprises an electrostatic lens.

Example 109: The method for operating a multiple particle beam system according to any one of examples claims 106 to 108,
- wherein the fast autofocus correction lens comprises a magnetic lens.

Example 110: The method for operating a multiple particle beam system according to any one of examples 106 to 109, furthermore including the following step:
- orthogonalizing effects of the particle optical components which are used for the correction or corrections.

Example 111: The method for operating a multiple particle beam system according to any one of examples 106 to 110, furthermore including the following steps:
  changing a working point, in particular changing the working distance, and generating hysteresis correction measurement data for characterizing the particle optical imaging in the object plane; and
  correcting the autofocus correction lens control signal in high-frequency fashion or correcting the autofocus correction lens control signals in high-frequency fashion on the basis of the hysteresis correction measurement data.

Example 112: The method for operating a multiple particle beam system according to any one of examples 106 to 111, furthermore including the following steps:
  generating aberration correction control signals and correcting beam positions in highly precise fashion and in particular in high-frequency fashion via the aberration correction control signals.

Example 113: The method for operating a multiple particle beam system according to any one of examples 106 to 112, furthermore including the following steps:
  generating scanning unit control signals and correcting the scanning unit control signals in high-frequency fashion at the respective working point, in particular by using multidimensional lookup tables.

Example 114: The method for operating a multiple particle beam system according to any one of examples 106 to 113, furthermore including the following steps:
  correcting image data in purely computational fashion in respect of at least one beam parameter, in particular correcting image data in purely computational fashion in respect of an image displacement in the object plane.

Example 115: A method for operating a multiple particle beam system, in particular according to any one of examples 106 to 114, for fast autofocus correction at a working point, including the following steps:
  physically setting the focus in the object plane via a fast autofocus correction lens;
  physically setting the landing angle in the object plane via a fast autofocus correction mechanism;
  setting the image field rotation via the scanning unit by quickly setting a counter rotation;
  setting the magnification via the scanning unit by quickly setting a pixel size; and
  compensating an image displacement in purely computational fashion.

Example 116: The method for operating a multiple particle beam system according to the preceding example, furthermore including the following steps:
  quickly setting the scanning parameter of quadradicity of the scanning unit and/or
  quickly setting the scanning parameter of skew of the scanning unit.

LIST OF REFERENCE SIGNS

1 Multi-beam particle microscope
3 Primary particle beams (individual particle beams)
5 Beam spots, incidence locations
7 Object
9 Secondary particle beams
10 Computer system, controller
100 Objective lens system
101 Object plane
102 Objective lens
103 Field
108 Upper pole shoe of the objective lens
109 Lower pole shoe of the objective lens
110 Winding in the objective lens
120 Magnetic field compensation lens
121 Winding in the magnetic field compensation lens
122 Lower pole shoe of the magnetic field compensation lens
200 Detector system
205 Projection lens
209 Particle multi-detector
211 Detection plane
213 Incidence locations
217 Field
250 Vacuum chamber
260 Scan deflector in the secondary path
300 Beam generation apparatus
301 Particle source
303 Condenser lens system
305 Multi-aperture arrangement
306 Counter electrode in the multi-beam particle generator
313 Multi-aperture plate
315 Openings in the multi-aperture plate
317 Midpoints of the openings
319 Field
307 Field lens system
309 Diverging particle beam
311 Illuminating particle beam
323 Beam foci
325 Intermediate image plane
350 Vacuum chamber
355 Vacuum chamber
400 Beam switch
410 Magnetic sector
420 Magnetic sector
460 Beam tube, beam tube arrangement
461 Limb of the beam tube
462 Limb of the beam tube
463 Limb of the beam tube
464 Beam tube extension
500 Scan deflector in the primary path
810 Controller for the primary path
811 Controller for the working point setting (slow)
812 Measuring element
813 Adjustment algorithm
814 Final controlling elements in the primary path
821 Controller for the fast autofocus in the primary path
822 Measuring element, autofocus determining element
823 Autofocus algorithm
824 Fast autofocus correction lens
825 Fast telecentricity correction mechanism
826 Fast rotation correction mechanism
827 Fast position correction mechanism
831 Controller for the working point setting in the secondary path (slow)
832 Measuring element
833 Second adjustment algorithm (secondary path)
834 Final controlling elements in the secondary path
841 Controller for the second fast autofocus (secondary path)
842 Measuring element
843 Second autofocus algorithm (secondary path)
844 Fast projection path correction mechanism
850 Orthogonalization matrix or inverted sensitivity matrix for the primary path
851 Orthogonalization matrix or inverted sensitivity matrix for the secondary path

901 First fast autofocus correction lens (one-part or multi-part)
902 Second fast autofocus correction lens
903 Third fast autofocus correction lens
904 Fourth fast autofocus correction lens
905 Fifth fast autofocus correction lens
906 Sixth fast autofocus correction lens
S1 Generating measurement data for the current focus at the working point AP
S2 Determining actual autofocus data on the basis of measurement data
S3 Generating an autofocus correction lens control signal on the basis of actual autofocus data
S4 Generating a telecentricity correction mechanism control signal on the basis of actual autofocus data
S5 Generating a rotation correction mechanism control signal on the basis of actual autofocus data
S6 Controlling an autofocus correction lens
S7 Controlling telecentricity correction mechanism
S8 Controlling rotation correction mechanism
S9 Generating second measurement data for a second autofocus in the secondary path
S10 Determining second actual autofocus data on the basis of second measurement data
S11 Generating a projection path correction mechanism control signal (set)
S12 Controlling projection path correction mechanism including a second autofocus correction lens
S13 Recording an image field
S20 Adjusting autofocus correction lenses
S21 Adjusting aberration correction mechanism (deflectors/stigmators)
S22 Updating scanning parameters
S30 Physically setting the focus in the object plane via a fast autofocus correction lens
S31 Physically setting the landing angle in the object plane via a fast autofocus correction mechanism/fast autofocus correction lens
S32 Setting the image field rotation via the scanning unit by quickly setting a counter rotation
S33 Setting the enlargement via the scanning unit by quickly setting a pixel size
S34 Compensating an image displacement in purely computational fashion

What is claimed is:

1. A multiple particle beam system, comprising:
a multi-beam particle generator configured to generate a first field of a multiplicity of charged first individual particle beams;
a first particle optical unit having a first particle optical beam path, the first particle optical unit configured to image the first individual particle beams onto a wafer surface in an object plane of the multiple particle beam system so that the first individual particle beams strike the wafer surface at incidence locations which define a second field;
a detection system comprising a multiplicity of detection regions defining a third field;
a second particle optical unit having a second particle optical beam path, the second particle optical unit configured to image second individual particle beams emanating from the incidence locations onto the detection regions of the detection system;
a magnetic and/or electrostatic objective lens configured to have the first and second individual particle beams pass therethrough;
a beam switch in the first particle optical beam path between the multi-beam particle generator and the objective lens, the beam switch in the second particle optical beam path between the objective lens and the detection system;
a sample stage configured to hold and/or position a wafer during the wafer inspection;
an autofocus determining element configured to generate data to determine actual autofocus data during use of the multiple particle beam system to inspect the wafer;
a fast autofocus correction lens; and
a controller configured to control particle optical components in the first particle optical beam path and/or in the second particle optical beam path,
wherein:
the controller is configured for static or low-frequency adaptation of a focusing to control at least the objective lens and/or an actuator of the sample stage at a first working point with a first working distance so the first individual particle beams are focused on the wafer surface situated at the first working distance;
the controller is configured for high-frequency adaptation of the focusing to generate an autofocus correction lens control signal based on the actual autofocus data at the first working point during use of the multiple particle beam system to inspect the wafer to control the fast autofocus correction lens during use of the multiple particle beam system to inspect the wafer at the first working point;
the first working point is defined by a landing angle of the first individual particle beams in the object plane and by a grid arrangement of the first individual particle beams in the object plane; and
the controller is configured to keep the landing angle and the grid arrangement substantially constant during the high-frequency adaptation at the first working point.

2. The multiple particle beam system of claim 1, wherein an adaptation time for the high-frequency adaptation is at least ten times less than the adaptation time TA for the low-frequency adaptation.

3. The multiple particle beam system of claim 1, wherein a stroke to set the working distance for the low-frequency or static adaptation is at least five times greater than a stroke for the high-frequency adaptation.

4. The multiple particle beam system of claim 1, wherein:
a second working point is defined at least by a second working distance between the objective lens and the wafer surface;
the second working distance differs from the first working distance;
the controller is configured to perform a low-frequency adaptation when there is a change between the first working point and the second working point; and
the controller is configured to control at least the magnetic objective lens and/or an actuator of the sample stage at the second working point so that the first individual particle beams are focused on the wafer surface situated at the second working distance.

5. The multiple particle beam system of claim 4, wherein:
the second working point is defined by a landing angle of the first individual particle beams in the object plane and by a grid arrangement of the first individual particle beams in the object plane; and the controller is configured to keep the landing angle and the grid arrangement substantially constant during the high-frequency adaptation at the second working point.

6. The multiple particle beam system of claim 1, wherein the fast autofocus correction lens comprises a fast electrostatic lens.

7. The multiple particle beam system of claim 6, wherein the fast autofocus correction lens is a first fast autofocus lens between upper and lower pole shoes of the magnetic objective lens.

8. The multiple particle beam system of claim 7, wherein the first fast autofocus correction lens is integrated into a beam tube extension which protrudes into the objective lens from a direction of the upper pole shoe.

9. The multiple particle beam system of claim 8, wherein the first fast autofocus correction lens comprises at least two parts.

10. The multiple particle beam system of claim 9, wherein:
the beam tube extension has two interruptions; and
one part of the two-parts is in each of the two interruptions, or each of two parts comprises a tube lens within the beam tube extension.

11. The multiple particle beam system of claim 10, wherein the controller is configured to control the two parts with voltages of the same or opposite signs via the autofocus correction lens control signal.

12. The multiple particle beam system of claim 7, further comprising:
a beam tube configured to be evacuated, the beam tube substantially enclosing the first particle optical beam path from the multi-beam particle generator to the objective lens; and
a field lens system comprising at least one magnetic field lens, the field lens system in the first particle optical beam path between the multi-beam particle generator and the beam switch; and
a second fast autofocus correction lens comprising a fast electrostatic lens,
wherein:
the second autofocus correction lens is configured to be within a magnetic field of the field lens system during use of the multiple particle beam system; and
the controller is configured to generate a second autofocus correction lens control signal based on the actual autofocus data of the multiple particle beam system to inspect the wafer to control the second fast autofocus correction lens in high-frequency fashion during use of the multiple particle beam system to inspect the wafer at the respective working point.

13. The multiple particle beam system of claim 7, further comprising a second fast autofocus correction lens, wherein:
the second fast autofocus correction lens comprises a fast magnetic lens outside and around the beam tube in the first particle optical beam path and in a position that is substantially magnetic field-free; and
the controller is configured to generate a third autofocus correction lens control signal based on the actual autofocus data during use of the multiple particle beam system to inspect the wafer to control the third fast autofocus correction lens in high-frequency fashion during use of the multiple particle beam system to inspect the wafer at the respective working point.

14. The multiple particle beam system of claim 1, further comprising a second fast autofocus correction lens, which comprises a fast electrostatic lens, wherein the second fast autofocus correction lens is at the multi-beam particle generator, and the controller is configured to generate a second autofocus correction lens control signal based on the actual autofocus data during use of the multiple particle beam system to inspect the wafer to control the second fast autofocus correction lens in high-frequency fashion during use of the multiple particle beam system to inspect the wafer at the respective working point.

15. The multiple particle beam system of claim 1, further comprising a second fast autofocus correction lens comprising a fast electrostatic lens, wherein:
the second fast autofocus correction lens is in the vicinity of an intermediate image plane as a two-part lens, the first part of which is upstream of the intermediate image plane and the second part of which is downstream of the intermediate image plane, as viewed in a direction of the particle optical beam path; and
the controller is configured to generate a second autofocus correction lens control signal based on the actual autofocus data the second fast autofocus correction lens to control the second fast autofocus correction lens in high-frequency fashion at the first respective working point.

16. The multiple particle beam system of claim 1, furthermore comprising a magnetic field compensation lens comprising a magnetic lens, wherein the magnetic field compensation lens is between the objective lens and the object plane, and the controller is configured to control the magnetic field compensation lens with a magnetic field compensation control signal in static or low-frequency fashion so that the magnetic field in the object plane takes the value of zero.

17. A method, comprising:
providing a multiple particle beam system comprising:
a multi-beam particle generator configured to generate a first field of a multiplicity of charged first individual particle beams;
a first particle optical unit having a first particle optical beam path, the first particle optical unit configured to image the first individual particle beams onto a wafer surface in an object plane of the multiple particle beam system so that the first individual particle beams strike the wafer surface at incidence locations which define a second field;
a detection system comprising a multiplicity of detection regions defining a third field;
a second particle optical unit having a second particle optical beam path, the second particle optical unit configured to image second individual particle beams emanating from the incidence locations onto the detection regions of the detection system;
a magnetic and/or electrostatic objective lens configured to have the first and second individual particle beams pass therethrough;
a beam switch in the first particle optical beam path between the multi-beam particle generator and the objective lens, the beam switch in the second particle optical beam path between the objective lens and the detection system;
a sample stage configured to hold and/or position a wafer during the wafer inspection;
an autofocus determining element configured to generate measurement data to determine actual autofocus data during use of the multiple particle beam system to inspect the wafer;
a fast autofocus correction lens; and a controller configured to control particle optical components in the first particle optical beam path and/or in the second particle optical beam path, wherein:
the controller is configured for static or low-frequency adaptation of a focusing to control at least the objective lens and/or an actuator of the sample stage at a first working point with a first working distance so the first individual particle beams are focused on the wafer surface situated at the first working distance;

the controller is configured for high-frequency adaptation of the focusing to generate an autofocus correction lens control signal based on the actual autofocus data at the first working point during use of the multiple particle beam system to inspect the wafer to control the fast autofocus correction lens during use of the multiple particle beam system to inspect the wafer at the first working point;

the first working point is defined by a landing angle of the first individual particle beams in the object plane and by a grid arrangement of the first individual particle beams in the object plane; and the controller is configured to keep the landing angle and the grid arrangement substantially constant during the high-frequency adaptation at the first working point;

generating the measurement data at the first working point for a current focus in the object plane;

determining the actual autofocus data based on the measurement data;

determining the autofocus correction lens control signal based on the actual autofocus data; and controlling the first fast autofocus correction lens such that a focusing in the object plane is kept constant at the first working point in a high-frequency fashion, wherein the landing angle and the grid arrangement of first individual particle beams in the object plane are also kept constant at the first working point.

18. The multiple particle beam system of claim 16, wherein the fast autofocus lens is a first fast autofocus correction lens comprising a two-part fast electrostatic lens arranged between the upper and the lower pole shoe of the magnetic objective lens, and wherein the multiple particle beam system further comprises:

a second fast autofocus correction lens comprising a fast electrostatic lens arranged within a magnetic field of a magnetic lens of a field lens system, the field lens system disposed in the first particle optical beam path between the multi-beam particle generator and the beam switch; and a third fast autofocus correction lens comprising an electrostatic lens disposed at the multi-beam particle generator, wherein the controller is configured so that, during use of the multiple particle beam system in a wafer inspection, the controller generates:

a first autofocus correction lens control signal based on the actual autofocus data to control the two-part fast electrostatic lens via the first autofocus correction lens control signal with voltages of different signs during the wafer inspection at the first working point;

a second autofocus correction lens control signal based on the actual autofocus data to control the second fast autofocus correction lens in high-frequency fashion during the wafer inspection at the first working point; and a third autofocus correction lens control signal based on the actual autofocus data to control the third fast autofocus correction lens in high-frequency fashion during the wafer inspection at the first working point.

19. The multiple particle beam system of claim 16, wherein the fast autofocus correction lens is a first fast autofocus correction lens comprising a one-part embodiment and arranged between the upper and the lower pole shoe of the magnetic objective lens, and wherein the multiple particle beam system further comprises:

a second fast autofocus correction lens comprising a fast magnetic lens disposed outside and around a beam tube in the first particle optical beam path and disposed at a position that is substantially magnetic field free;

a third fast autofocus correction lens comprising an electrostatic lens disposed within a magnetic field of a magnetic lens of a field lens system, the field lens system disposed in the first particle optical beam path between the multi-beam particle generator and the beam switch; and a fourth fast autocorrection lens disposed at the multi-beam particle generator, wherein the controller is configured so that, during use of the multiple particle beam system in a wafer inspection, the controller generates:

a first autofocus correction lens control signal based on the actual autofocus data to control the first fast electrostatic lens via the first autofocus correction lens control signal in a high frequency fashion during the wafer inspection at the first working point;

a second autofocus correction lens control signal based on the actual autofocus data to control the second fast autofocus correction lens in high-frequency fashion during the wafer inspection at the first working point;

a third autofocus correction lens control signal based on the actual autofocus data to control the third fast autofocus correction lens in high-frequency fashion during the wafer inspection at the first working point; and a fourth autofocus correction lens control signal on the basis of the actual autofocus data to control the fourth fast autofocus correction lens in high-frequency fashion during the wafer inspection at the first working point.

20. One or more machine-readable hardware storage devices comprising instructions that are executable by one or more processing devices to perform operations comprising the method of claim 17.

21. A system comprising:
one or more processing devices; and
one or more machine-readable hardware storage devices comprising instructions that are executable by the one or more processing devices to perform operations comprising the method of claim 17.

* * * * *

UNITED STATES PATENT AND TRADEMARK OFFICE
CERTIFICATE OF CORRECTION

PATENT NO. : 12,494,343 B2
APPLICATION NO. : 18/185324
DATED : December 9, 2025
INVENTOR(S) : Dirk Zeidler et al.

It is certified that error appears in the above-identified patent and that said Letters Patent is hereby corrected as shown below:

On the Title Page

(56) References Cited, FOREIGN PATENT DOCUMENTS, delete "DE 2007-019033 A 1/2007" and insert -- JP 2007-019033 A 1/2007 --.

Page 2, (56) References Cited, FOREIGN PATENT DOCUMENTS, delete "DE 2007-087639 A 4/2007" and insert -- JP 2007-087639 A 4/2007 --.

In the Specification

Column 8, Line 17, delete "several" and insert -- several μm, --.

Column 35, Line 66, delete "quadradicity" and inset -- quadraticity --.

Column 53, Line 44, delete "ten" and insert -- ten μm, --.

Column 55, Line 41, delete "quadradicity." and insert -- quadraticity. --.

Column 56, Line 5, delete "quadradicity" and inset -- quadraticity --.

Column 77, Line 51, delete "quadradicity" and insert -- quadraticity --.

Signed and Sealed this
Twenty-seventh Day of January, 2026

John A. Squires
*Director of the United States Patent and Trademark Office*